US008278170B2

(12) United States Patent
Lee et al.

(10) Patent No.: US 8,278,170 B2
(45) Date of Patent: *Oct. 2, 2012

(54) METHODS OF FORMING NONVOLATILE MEMORY DEVICES HAVING VERTICALLY INTEGRATED NONVOLATILE MEMORY CELL SUB-STRINGS THEREIN

(75) Inventors: Changhyun Lee, Suwon-si (KR); Sunil Shim, Seoul (KR); Jaehoon Jang, Seongnam-si (KR); Sunghoi Hur, Seoul (KR); Hansoo Kim, Suwon-si (KR); Kihyun Kim, Hwaseong-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

This patent is subject to a terminal disclaimer.

(21) Appl. No.: 13/165,576

(22) Filed: Jun. 21, 2011

(65) Prior Publication Data

US 2012/0003800 A1 Jan. 5, 2012

(30) Foreign Application Priority Data

Jul. 2, 2010 (KR) .................. 10-2010-0064050
Oct. 2, 2010 (KR) .................. 10-2010-0096071

(51) Int. Cl.
*H01L 21/336* (2006.01)

(52) U.S. Cl. ............. 438/261; 438/266; 257/E21.645

(58) Field of Classification Search .......... 438/261, 438/266
See application file for complete search history.

(56) References Cited

U.S. PATENT DOCUMENTS

| 5,946,230 | A | * | 8/1999 | Shimizu et al. | 365/185.01 |
| 6,483,749 | B1 | * | 11/2002 | Choi et al. | 365/185.18 |
| 8,102,711 | B2 | * | 1/2012 | Maejima | 365/185.11 |
| 2008/0179659 | A1 | | 7/2008 | Enda et al. | |
| 2008/0186771 | A1 | | 8/2008 | Katsumata et al. | |
| 2008/0242028 | A1 | | 10/2008 | Mokhlesi et al. | |
| 2009/0224309 | A1 | | 9/2009 | Kidoh et al. | |
| 2009/0242967 | A1 | | 10/2009 | Katsumata et al. | |
| 2009/0242968 | A1 | | 10/2009 | Maeda et al. | |
| 2009/0268524 | A1 | | 10/2009 | Maejima | |
| 2010/0178755 | A1 | * | 7/2010 | Lee et al. | 438/479 |
| 2010/0181610 | A1 | * | 7/2010 | Kim et al. | 257/314 |
| 2010/0246257 | A1 | * | 9/2010 | Ito et al. | 365/185.03 |
| 2011/0065270 | A1 | * | 3/2011 | Shim et al. | 438/589 |
| 2011/0147824 | A1 | * | 6/2011 | Son et al. | 257/324 |
| 2011/0156132 | A1 | * | 6/2011 | Kiyotoshi | 257/326 |
| 2011/0291178 | A1 | * | 12/2011 | Sasaki et al. | 257/324 |
| 2011/0316069 | A1 | * | 12/2011 | Tanaka et al. | 257/324 |
| 2012/0039130 | A1 | * | 2/2012 | Yoon et al. | 365/185.18 |
| 2012/0049148 | A1 | * | 3/2012 | Fukano | 257/5 |

FOREIGN PATENT DOCUMENTS

JP 2008-186868 8/2008

(Continued)

OTHER PUBLICATIONS

Quirk, Michael, Serda Julian, Semiconductor Manufacturing Technology, 2001, Prentice Hall Inc. pp. 58-59.

*Primary Examiner* — Alexander Ghyka
(74) *Attorney, Agent, or Firm* — Myers Bigel Sibley & Sajovec, P.A.

(57) ABSTRACT

Methods of forming nonvolatile memory devices according to embodiments of the invention include techniques to form highly integrated vertical stacks of nonvolatile memory cells. These vertical stacks of memory cells can utilize dummy memory cells to compensate for process artifacts that would otherwise yield relatively poor functioning memory cell strings when relatively large numbers of memory cells are stacked vertically on a semiconductor substrate using a plurality of vertical sub-strings electrically connected in series.

19 Claims, 76 Drawing Sheets

FOREIGN PATENT DOCUMENTS

| | | |
|---|---|---|
| JP | 2008-192708 | 8/2008 |
| JP | 2009-206451 | 9/2009 |
| JP | 2009-212280 | 9/2009 |
| JP | 2009-224465 | 10/2009 |
| KR | 10-2008-0070583 A | 7/2008 |
| KR | 1020090098733 A | 9/2009 |

* cited by examiner

METHODS OF FORMING NONVOLATILE MEMORY DEVICES HAVING VERTICALLY INTEGRATED NONVOLATILE MEMORY CELL SUB-STRINGS THEREIN

REFERENCE TO PRIORITY APPLICATIONS

The present non-provisional application claims priority under 35 U.S.C. Section 119 to Korean Patent Application Nos. 10-2010-0064050, filed Jul. 2, 2010, and 10-2010-0096071, filed Oct. 2, 2010, the disclosures of which are hereby incorporated herein by reference.

BACKGROUND

The present disclosure herein relates to semiconductor devices and, more particularly, to three-dimensional nonvolatile memory devices.

In order to satisfy a demand for excellent performance and low price, it is required to increase a degree of integration of a semiconductor device. In the case of a semiconductor memory device, since the integration degree is an important factor which determines a product price, higher integration degree is particularly required. In the case of a typical two dimensional or planar semiconductor memory device, the integration degree is mostly determined by an area occupied by a unit memory cell. Therefore, the typical memory device is greatly affected by a level of a technology for forming a micro pattern.

Recently, a three-dimensional semiconductor memory device provided with three dimensionally arranged memory cells has been proposed. However, for mass production of the three-dimensional semiconductor memory device, it is required to develop fabricating technology so that manufacturing costs per bit may be lower than that of the two-dimensional semiconductor memory device with reliable production properties.

SUMMARY

Methods of forming nonvolatile memory devices according to embodiments of the invention include techniques to form highly integrated vertical stacks of nonvolatile memory cells. These vertical stacks of memory cells can utilize dummy memory cells to compensate for process artifacts that would otherwise yield relatively poor functioning memory cell strings when relatively large numbers of memory cells are stacked vertically on a semiconductor substrate. According to some of these embodiments of the invention, a method of forming a nonvolatile memory device may include forming a first stack of layers on a substrate. This first stack of layers may include a first plurality of interlayer dielectric layers and a first plurality of sacrificial layers (or electrically conductive word line layers) arranged vertically in an alternating sequence. A step may be performed to selectively etch through the first stack of layers to define a first opening therein. A first active region of a first plurality of nonvolatile memory cells and at least one dummy memory cell is formed in the first opening. This first active region may be a semiconductor active region. Thereafter, a second stack of layers is formed on the first stack of layers. The second stack of layers includes a second plurality of interlayer dielectric layers and a second plurality of sacrificial layers (or electrically conductive word line layers) arranged vertically in an alternating sequence. A step is then performed to selectively etch through the second stack of layers to define a second opening therein, which is aligned with the first opening A second active region of a second plurality of nonvolatile memory cells is formed in the second opening. This second active region is electrically coupled to the first active region to enable a plurality of vertical sub-strings of memory cells to become electrically connected together into a larger vertical string.

According to some additional embodiments of the invention, the forming of the first active region may include lining a sidewall of the first opening with a first electrically conductive layer having a U-shaped (e.g., cup-shaped) cross-section. In addition, the step of forming a second active region may be followed by the steps of selectively etching through the second and first stack of layers in sequence to define a third opening therein and then removing the first and second pluralities of sacrificial layers through the third opening. Thereafter, the third opening may be filled with a dummy word line that is separated from the first active region by an information storage layer. In particular, the third opening may be filled with a first dummy word line, which extends opposite a portion of the first active region, and a second dummy word line, which extends opposite a portion of the second active region.

According to still further embodiments of the invention, the step of forming a second stack of layers may be preceded by a step to fill the first opening with a first filling insulating layer that contacts the first electrically conductive layer. In addition, the step of forming a second active region may be preceded by a step of recessing an upper surface of the first filling insulating layer to expose a portion of the first electrically conductive layer. Then, the step of forming a second active region may include lining a sidewall of the second opening with a second electrically conductive layer (e.g., semiconductor layer) that contacts the exposed portion of the first electrically conductive layer.

Methods of forming nonvolatile memory devices according to still further embodiments of the invention include forming a first stack of layers on a substrate. This first stack of layers includes a first plurality of interlayer dielectric layers and a first plurality of sacrificial or word line layers arranged vertically in an alternating sequence. A selective etching step is then performed to selectively etch through the first stack of layers to define a first opening therein. A first active region (of a first plurality of nonvolatile memory cells and at least one dummy memory cell) is formed in the first opening by lining a sidewall of the first opening with a first semiconductor layer (e.g., polysilicon layer) having a U-shaped cross-section. The first opening is filled with a first filling insulating layer (e.g., silicon dioxide layer) that contacts the first semiconductor layer. An upper surface of the first filling insulating layer is then recessed to expose an inner sidewall of the first semiconductor layer. This recess in the upper surface of the first filling insulating layer is then filled with a semiconductor active pattern. To provide a greater level of vertical integration, a second stack of layers is formed on the first stack of layers. The second stack of layers may include a second plurality of interlayer dielectric layers and a second plurality of sacrificial or word line layers arranged vertically in an alternating sequence. The second stack of layers is selectively etched to define a second opening therein that is aligned with the first opening. A second active region of a second plurality of nonvolatile memory cells is then formed in the second opening by lining a sidewall of the second opening with a second semiconductor layer that contacts the semiconductor active pattern in the recess. The second and first stack of layers may then be selectively etched in sequence to define a third opening therein that exposes the sacrificial layers. The first and second pluralities of sacrificial layers may then be replaced with memory cell word lines. These word lines may include at least one dummy word line of a dummy memory cell extending opposite a portion of the first semiconductor layer.

Additional embodiments of the invention include nonvolatile memory devices containing a vertically integrated plurality of nonvolatile memory cells. According to some of these embodiments, a nonvolatile memory device includes a first stack of layers on a substrate. The first stack of layers includes first plurality of interlayer dielectric layers and a first plurality of word lines arranged vertically in an alternating sequence. This first plurality of word lines includes at least a first dummy word line of a first dummy memory cell. A first vertical opening is also provided, which extends through the first stack of layers. A first semiconductor active layer is provided, which lines a sidewall of the first opening and extends opposite the first dummy word line. A second stack of layers is provided on the first stack of layers. The second stack of layers includes a second plurality of interlayer dielectric layers and a second plurality of word lines arranged vertically in an alternating sequence. A second opening is provided, which extends through the second stack of layers. This second opening is aligned with the first opening. A second semiconductor active layer is provided, which lines a sidewall of the second opening. This second semiconductor active layer is electrically coupled to the first semiconductor active layer, to thereby enable multiple sub-strings of nonvolatile memory cells to be vertically integrated into a longer string of memory cells.

According to additional embodiments of the invention, the second plurality of word lines may also include a second dummy word line of a second dummy memory cell, which extends opposite the second semiconductor active layer. The first and second dummy word lines may be contiguous with each other to thereby define a dummy memory cell adjacent an interface between the first and second stacks of layers.

BRIEF DESCRIPTION OF THE DRAWINGS

The accompanying drawings are included to provide a further understanding of the inventive concept, and are incorporated in and constitute a part of this specification. The drawings illustrate exemplary embodiments of the inventive concept and, together with the description, serve to explain principles of the inventive concept. In the drawings.

DETAILED DESCRIPTION OF THE EMBODIMENTS

Figure 1:
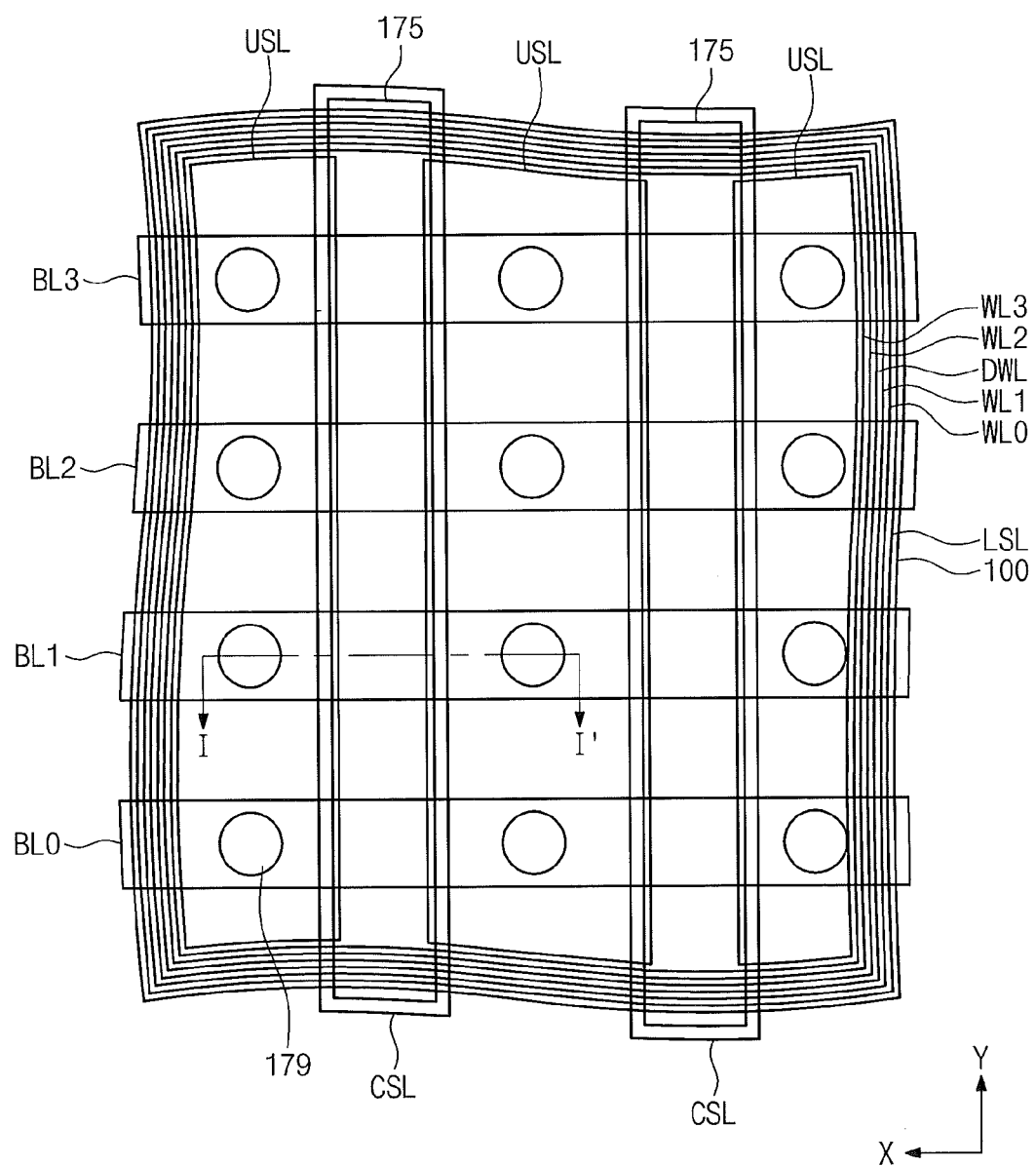
FIG. 1 is a planar diagram illustrating a three-dimensional nonvolatile memory device according to a first embodiment of the inventive concept.

Exemplary embodiments of the inventive concept will be described below in more detail with reference to the accompanying drawings. The inventive concept may, however, be embodied in different forms and should not be construed as limited to the embodiments set forth herein. Rather, these embodiments are provided so that this disclosure will be thorough and complete, and will fully convey the scope of the inventive concept to those skilled in the art.

In the drawings, the dimensions of layers and regions are exaggerated for clarity of illustration. It will also be understood that when a layer (or film) is referred to as being 'on' another layer or substrate, it can be directly on the other layer or substrate, or intervening layers may also be present. Although the terms such as first, second, third and the like are used for describing various regions and layers (or films), these regions and layers should not be limited by such terms. These terms are used just for distinguishing certain regions and layers (or films) from others. The described and exemplified embodiments herein include their complementary embodiments. The term "and/or" is used for meaning inclusion of at least one of the associated listed items. Like reference numerals refer to like elements throughout.

Hereinafter, exemplary embodiments of the inventive concept will be described in detail with reference to the accompanying drawings.

Embodiment 1

Figure 2:
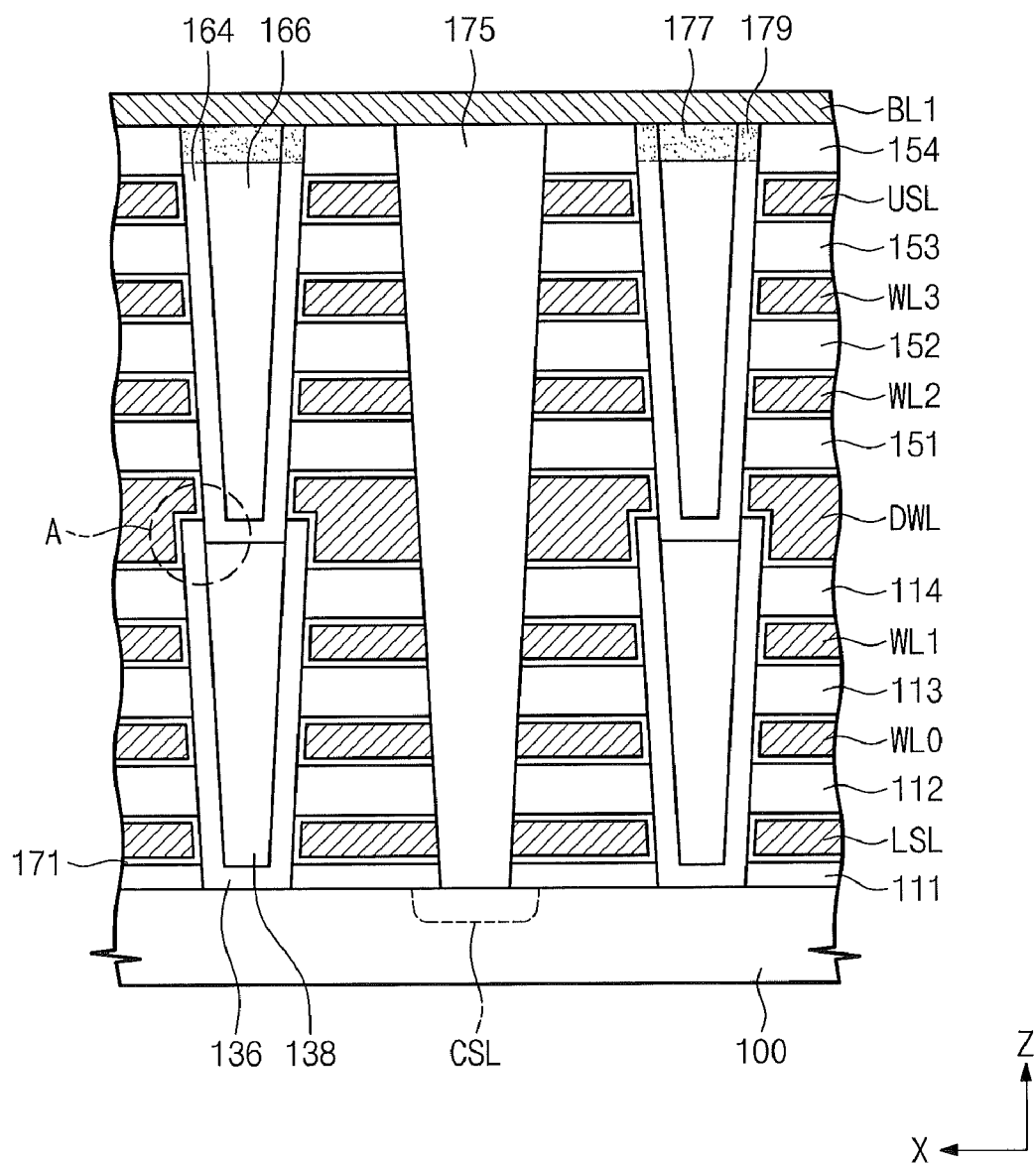
FIG. 2 is a cross-sectional view of the three-dimensional nonvolatile memory device illustrated in FIG. 1 along a line I-I'.

FIG. 1 is a planar diagram illustrating a three-dimensional nonvolatile memory device according to a first embodiment of the inventive concept. FIG. 2 is a cross-sectional view of the three-dimensional nonvolatile memory device illustrated in FIG. 1 along a line I-I'. Referring to FIGS. 1 and 2, a substrate 100 is prepared. The substrate 100 may be a semiconductor substrate formed by cutting a semiconductor ingot, or an epitaxial semiconductor layer formed on a semiconductor substrate. Although not illustrated, a well may be formed on the substrate 100. Common source lines CSL are provided to the substrate 100. The common source lines CSL may be a region doped with N-type impurities at the substrate 100, for example. The common source lines CSL may be overlapped with an electrode separation pattern 175 and distanced in a first direction. The common source lines CSL may be provided as a plurality of parallel lines extend in a second direction crossing the first direction. Lower interlayer dielectrics 111 to 114 and lower conduction patterns LSL, WL0 and WL1 are alternately stacked on the substrate 100. The lower interlayer dielectrics 111 to 114 may be formed of, e.g., a silicon oxide layer. The lower conduction patterns LSL, WL0 and WL1 may be formed with at least one of doped silicon, tungsten, metal nitride layer and metal silicide. The lower interlayer dielectrics may upward include first to fourth lower interlayer dielectrics 111 to 114. The undermost lower interlayer dielectric, e.g., the first lower interlayer dielectric 111, may be thinner than the other lower interlayer dielectrics.

Lower active pillars 136 penetrate the lower interlayer dielectrics 111 to 114 and the lower conduction patterns LSL, WL0 and WL1, and contact the substrate 100. Upper interlayer dielectrics 151 to 154 and upper conduction patterns WL2, WL3 and USL are alternately stacked on the uppermost lower interlayer dielectric 114. The upper interlayer dielectrics 151 to 154 may be formed with a silicon oxide layer. The upper conduction patterns WL2, WL3 and USL may be formed with at least one of doped silicon, tungsten, metal nitride layer and metal silicide. Upper active pillars 164 penetrate the upper interlayer dielectrics 151 to 154 and the upper conduction patterns WL2, WL3 and USL, and contact the lower active pillars 136. The active pillars 136 and 164 may be arranged in a matrix form in the first and second directions, and extended in a third direction crossing the first and second directions.

There is an information storage layer 171 between the active pillars 136 and 164 and the conductions patterns LSL, WL0 to WL3 and USL. The information storage layer 171 may be extended between the conduction patterns LSL, WL0 to WL3 and USL and the interlayer dielectrics 111 to 114 and 151 to 154. The information storage layer 171 may include a tunnel insulating layer, a charge storage layer and a blocking insulating layer. The tunnel insulating layer is provided adjacently to the active pillars 136 and 164, and the blocking insulating layer is provided adjacently to the conduction patterns LSL, WL0 to WL3 and USL. The charge storage layer is provided between the tunnel insulating layer and the blocking insulating layer. The tunnel insulating layer may include, e.g., a silicon oxide layer. The blocking insulating layer may include a high dielectric layer, e.g., an aluminum oxide layer or a hafnium oxide layer. The blocking insulating layer may be a multi-stacked layer including a plurality of thin layers. For instance, the blocking insulating layer may include an aluminum oxide layer and a silicon oxide layer, and a stacking sequence of the aluminum oxide layer and the silicon oxide layer may be various. The charge storage layer may be an insulating layer including a charge trap layer or a conductive nano-particle. The charge trap layer may include, e.g., a silicon nitride layer.

The undermost lower conduction pattern LSL may be a lower selection line of a NAND flash memory device. The uppermost upper conduction patterns USL may be provided as plural numbers, and they may be upper selection lines of the NAND flash memory device extended in the second direction. The conduction patterns between the selection lines, i.e., WL0 to WL3, may be first to fourth word lines of the NAND flash memory device. The upper selection lines USL neighboring each other may be separated from each other by the electrode separation pattern 175 extended in the second direction. The electrode separation pattern 175 may contact the substrate 100 penetrating the conduction patterns and the interlayer dielectrics.

In the embodiment, sides of the active pillars 136 and 164 may have a slope. The active pillars 136 and 164 may have a shape of a cup. A width of an upper part of the lower active pillars 136 is larger than that of a lower part of the upper active pillars 164. The inside of the lower active pillars 136 may be filled with a lower filling insulating layer 138, and the inside of the upper active pillars 164 may be filled with an upper filling insulating layer 166. An upper surface of the lower filling insulating layer 138 may be lower than that of the lower active pillars 136. The upper surface of the lower filling insulating layer 138 and a lower surface of the upper active pillars 164 are coplanar. The lower surface of the upper active pillars 164 may be lower than the upper surface of the lower active pillars 136. An inner side of the upper part of the lower active pillars 136 may contact an outer side of the lower part of the upper active pillars 164 (refer to part A). The lower active pillars 136 may be electrically connected to the upper active pillars 164.

An upper surface of the upper filling insulating layer 166 may be lower than that of the upper active pillars 164. An upper active pattern 177 may be provided on the upper filling insulating layer 166 and contact an inner side of an upper part of the upper active pillars 164. The upper active pattern 177 may include, e.g., a semiconductor layer. The upper active pattern 177 and the upper part of the upper active pillars 164 may be doped with impurities and form a drain region 179. On the uppermost upper interlayer dielectric 154, a plurality of bit lines BL0 to BL2 is provided crossing the upper selection lines USL and being extended in the first direction. The bit lines BL0 to BL2 are connected to the drain region 179.

The active pillars 136 and 164 may include an intrinsic semiconductor layer not doped with impurities. If a voltage is applied to one of the conduction patterns LSL, WL0 to WL3 and USL, an inversion region is formed due to a fringe field at a certain region of the active pillar adjacent to the conduction pattern. This inversion region may form a source/drain region of a memory cell transistor.

At the contact region of the lower active pillars 136 and the upper active pillars 164, outer sides of the lower active pillars 136 and the upper active pillars 164 have a stepped profile. Therefore, characteristics of channels formed at the lower part of the upper active pillars 164 and the upper part of the lower active pillars 136 may be different from one another. For uniformity and stabilization of characteristics of program, read and erasing, a dummy conduction pattern DWL is provided neighboring the contact region of the lower active pillars 136 and the upper active pillars 164 so as to cover the stepped profile. The dummy conduction pattern DWL may be a dummy word line. The information storage layer 171 may be extended between the dummy conduction pattern DWL and the active pillars 136 and 164.

Preferably, the upper surface of the lower active pillars 136 may have the same height as or be lower than that of the dummy conduction pattern DWL. Preferably, the lower surface of the upper active pillars 164 may have the same height as or be higher than that of the lower interlayer dielectric 114 immediately under the dummy conduction pattern DWL. More preferably, the lower surface of the upper active pillars 164 may have the same height as or be higher than that of the dummy conduction pattern DWL. The dummy conduction pattern DWL may cover both of the lower active pillars 136 and the upper active pillars 164. The dummy conduction pattern DWL may include a protrusion portion which is protruded from a first surface facing the outer surface of the upper part of the lower active pillars 136 toward the outer surface of the lower part of the upper active pillars 164 and thinner than the dummy conduction pattern. Since the dummy conduction pattern DWL covers the lower active pillars 136 and the upper active pillars 164, the problem of channel non-uniformity may be reduced.

Figure 3:
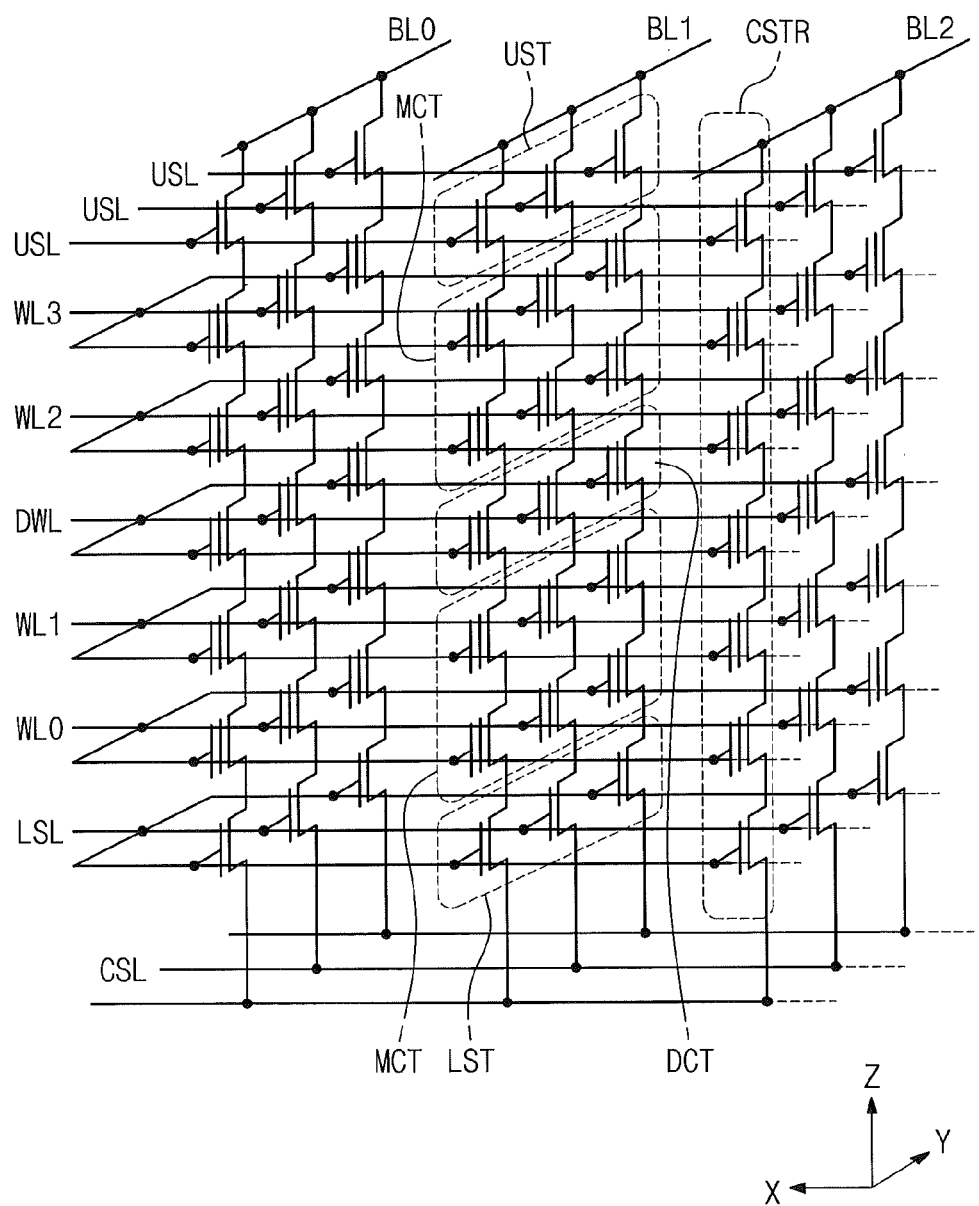
FIG. 3 is a circuit diagram illustrating the three-dimensional nonvolatile memory device according to the first embodiment of the inventive concept.

FIG. 3 is a circuit diagram illustrating the three-dimensional nonvolatile memory device according to the first embodiment of the inventive concept described referring to FIGS. 1 and 2.

Referring to FIGS. 1 to 3, the three-dimensional nonvolatile memory device may include the common source line CSL, the plurality of bit lines BL0 to BL2, and a plurality of cell strings CSTR arranged between the common source line CSL and the bit lines BL0 to BL2. The cell strings CSTR are connected to each of the bit lines BL0 to BL2 in parallel.

Each of the cell strings CSTR may include a lower selection transistor LST connected to the common source line CSL, an upper selection transistor UST connected to the bit lines BL0 to BL2, and a plurality of memory cell transistors MCT between the selection transistors LST and UST. Each of the cell strings CSTR may further include at least one dummy cell transistor DCT provided between the memory cell transistors MCT. The memory cell transistors MCT may include lower memory cell transistors under the dummy cell transistor DCT and upper memory cell transistors above the dummy cell transistor DCT. The lower selection transistor LST, the upper selection transistor UST, the memory cell transistors MCT and the dummy cell transistor DCT may be connected in series. The lower selection line LSL, the word lines WL0 to WL3, the dummy word line DWL and the upper selection lines USL may be respectively used as gate electrodes of the lower selection transistor LST, the memory cell transistors MCT, the dummy cell transistor DCT and the upper selection transistors UST.

Since outer sides of the lower active pillars 136 and the upper active pillars 164 have the stepped profile at the region where the lower active pillars 136 and the upper active pillars 164 contact to each other, the channels formed at the lower active pillars 136 and the upper active pillars 164 may be non-uniformed. The dummy cell transistor DCT is provided to the region where the stepped profile is formed. The dummy cell transistor DCT does not store data. The memory cell transistors MCT are not provided to the region where the stepped profile is formed. Therefore, the memory cell transistors MCT may have more uniform electrical characteristics.

A method for operating the three-dimensional nonvolatile memory device according to the embodiment of the inventive concept will be described. Voltages applied to lines connected to one cell string CSTR in the circuit illustrated in FIG. 3 may be, e.g., expressed as Table. 1.

TABLE 1

| | Erase | program | read |
|---|---|---|---|
| selected WL | ground voltage (Vss) | program voltage (Vpgm) (e.g., 15~20 V) | read voltage (Vrd) (e.g, 0 V) |
| non-selected WL | ground voltage (Vss) | pass voltage (Vpass) (e.g., 10 V) | non-selection read voltage (Vread) (e.g., 4.5 V) |
| DWL | intermediate voltage (VDWL) (e.g.,Vss < VDWL < Vers) | intermediate voltage (VDWL) (e.g., Vss < VDWL < Vpgm) | intermediate voltage (VDWL) (e.g., Vss < VDWL ≦ Vread) |

TABLE 1-continued

| | Erase | program | read |
|---|---|---|---|
| USL | Floating | power supply voltage (Vcc) | turn-on voltage (e.g., 4.5 V) |
| LSL | Floating | ground voltage (Vss) | turn-on voltage (e.g., 4.5 V) |
| CSL | floating | ground voltage (Vss) | ground voltage (Vss) |
| selected BL | floating | ground voltage (Vss) | power supply voltage (Vcc) |
| non-selected BL | floating | power supply voltage (Vcc) | low voltage (e.g., 0.8 V) |
| substrate | erasing voltage (Vers) (e.g., 21 V) | ground voltage (Vss) | ground voltage (Vss) |

Threshold voltages of the memory cell transistors MCT and the dummy cell transistor DCT may be, e.g., expressed as Table. 2.

TABLE 2

| MCT in "ON" state | −1 V~−3 V |
|---|---|
| MCT in "OFF" state | 1 V~3 V |
| DCT | >0 V |

Referring to Tables. 1 and 2, the dummy cell transistor DCT does not store data. Since the dummy cell transistor DCT is formed at the region where the stepped profile is formed, electric filed is concentrated on the information storage layer of the dummy cell transistor DCT. Therefore, speed of programming/erasing may be abnormally faster than the memory cell transistors MCT. Further, at a programming operation of the memory cell transistor MCT adjacent to the dummy cell transistor DCT, the dummy cell transistor DCT is under erasing stress so that charges of the information storage layer of the dummy cell transistor DCT are leaked outward and the threshold voltage may become excessively low. If the threshold voltage of the dummy cell transistor DCT becomes low, charge loss of the memory cell transistor MCT adjacent to the dummy cell transistor DCT may be generated due to a coupling effect.

For solving this problem, the dummy cell transistor DCT is required to be programmed to have the threshold voltage greater than about 0 V as shown in Table. 2. The threshold voltage of the dummy cell transistor DCT may be between the threshold voltage of the memory cell transistor MCT at the on state and that at the off state. The programming of the dummy cell transistor DCT is performed for adjusting the threshold voltage not for storing data. The programming for the dummy cell transistor DCT to have the threshold voltage greater than about 0 V may be performed, preferably, before programming the memory cell transistor MCT the most adjacent to the dummy cell transistor DCT. In another method, before programming some memory cell transistor MCT of the cell string CSTR which includes the dummy cell transistor DCT, the dummy cell transistor DCT may be initially programmed to have the threshold voltage greater than about 0 V. In still another method, just after programming the dummy cell transistor DCT to have the threshold voltage greater than about 0 V, the memory cell transistor MCT the most adjacent to the dummy cell transistor DCT may be programmed. In the case that a process for programming the memory cell transistor MCT the most adjacent to the dummy cell transistor DCT is progressed through a plurality of sub programs, before performing a final sub program among the sub programs, the dummy cell transistor DCT may be programmed to have the threshold voltage greater than about 0 V.

The read voltage applied to the dummy cell transistor DCT may be equal to or smaller than that applied to the memory cell transistor MCT.

When one of the memory cell transistors MCT is programmed, the dummy cell transistor DCT may be turned-off. By cutting off current by the dummy cell transistor DCT, a boosting effect may be increased. A selected memory cell transistor MCT may be more easily programmed. Since the current may be cut off by the dummy cell transistor DCT, when one of the memory cell transistors MCT above or under the dummy cell transistor DCT is programmed, efficiency of preventing the memory cell transistor MCT under or above the dummy cell transistor DCT from being programmed may be improved.

An exemplary method for forming the three-dimensional nonvolatile memory device according to the embodiment of the inventive concept will be described. FIGS. 4 to 14 are cross-sectional views corresponding the line I-I' of FIG. 1.

Figure 4:
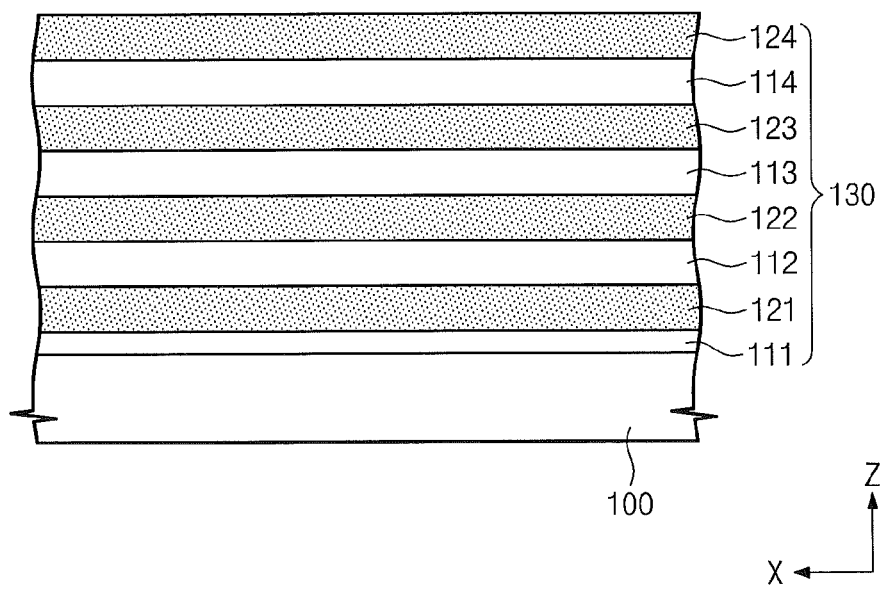
FIGS. 4 to 14 are cross-sectional views corresponding to the line I-I' of FIG. 1 for explaining a method for forming the three-dimensional nonvolatile memory device according to the first embodiment of the inventive concept.

Referring to FIG. 4, a lower layer 130 is formed on the substrate 100. The lower layer 130 is formed by alternately stacking lower interlayer dielectrics and lower sacrifice layers. The lower interlayer dielectrics may include first to fourth lower interlayer dielectrics 111 to 114 upward. The lower sacrifice layers may include first to fourth lower sacrifice layers 121 to 124 upward. The lower interlayer dielectrics 111 to 114 may be formed with, e.g., a silicon oxide layer. The lower sacrifice layers 121 to 124 may be formed with material which has an etching selectivity with respect to the lower interlayer dielectrics 111 to 114. For instance, the lower sacrifice layers 121 to 124 may be formed with a silicon nitride layer. The first lower interlayer dielectric 111 may be thinner than the other interlayer dielectrics and formed undermost to contact the substrate 100. The fourth lower sacrifice layer 124 may be formed uppermost.

Figure 5:
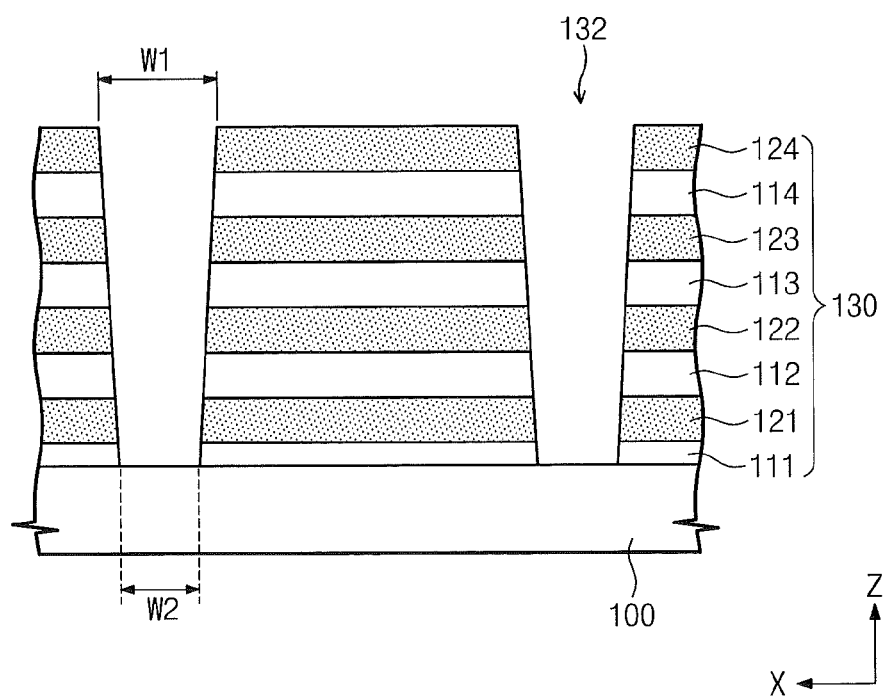

Referring to FIG. 5, a lower active hole 132 which exposes the substrate 100 is formed by sequentially etching the lower interlayer dielectrics 111 to 114 and the lower sacrifice layers 121 to 124. The etching process may be performed as a dry etching, and the side of the lower active hole 132 may have a slope due to a by-product generated during the dry etching. An upper width W1 of the lower active hole 132 may be wider than a lower width W2 of the lower active hole 132.

Figure 6:
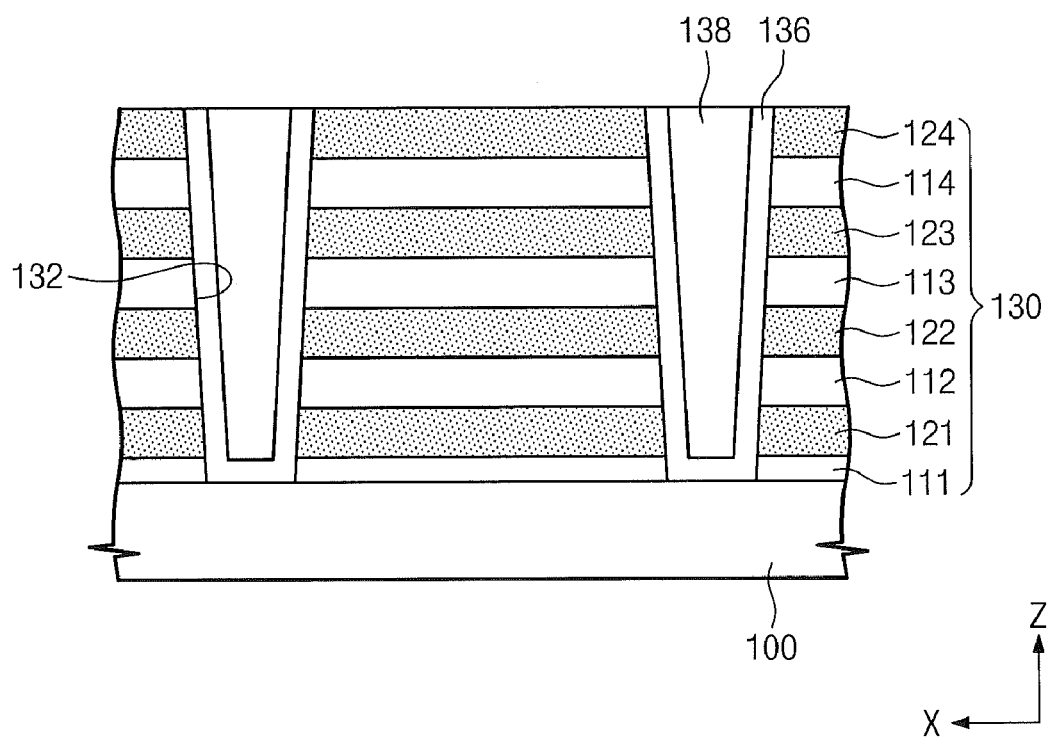

Referring to FIG. 6, a semiconductor layer is formed and covers the bottom and side of the lower active hole 132. The semiconductor layer may be, e.g., a polysilicon layer not doped with impurities. The semiconductor layer may be formed with a thickness not filling the lower active hole 132. The lower filling insulating layer 138 may be formed and fill the inner space of the lower active hole 132. The lower insulating layer 138 may be a silicon oxide layer. By performing a planarization process to the lower filling insulating layer 138 and the semiconductor layer, the lower filling insulating layer 138 on the fourth lower sacrifice layer 124 and the semiconductor layer are removed, and at the same time the fourth lower sacrifice layer 124 is exposed. In the lower active hole 132, the lower active pillars 136 may be formed.

Figure 7:
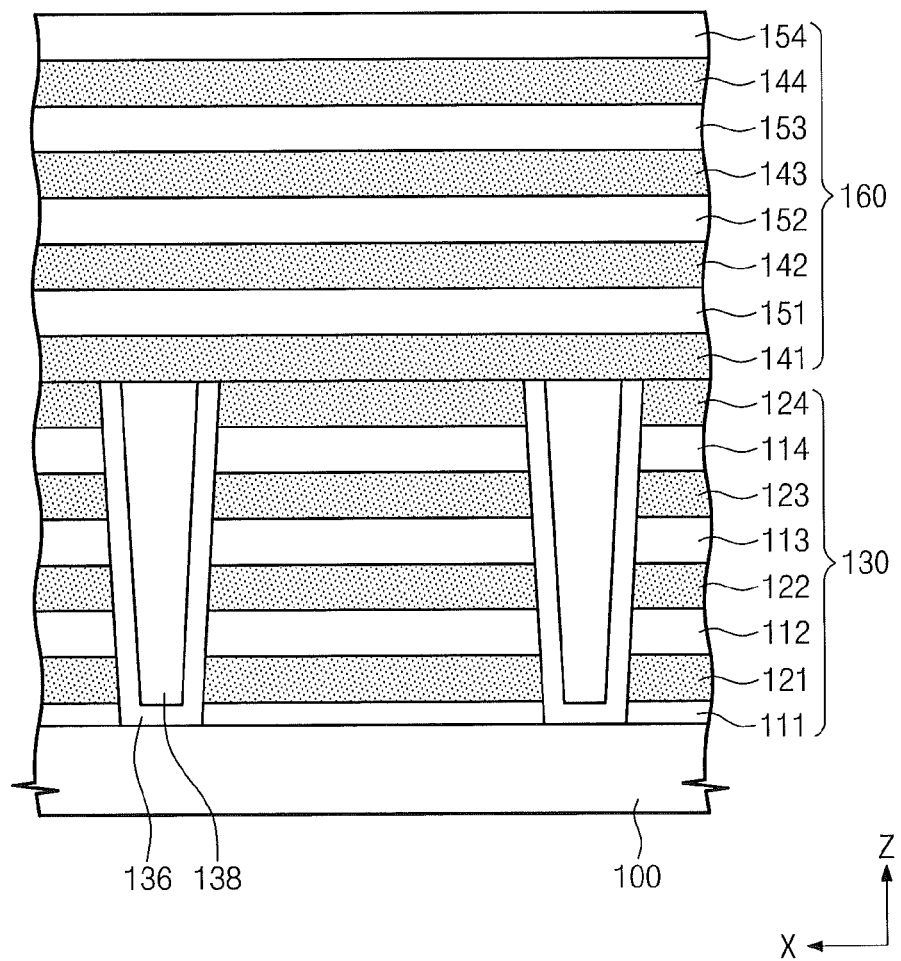

Referring to FIG. 7, an upper layer 160 is formed on the lower layer 130. The upper layer 160 is formed by alternately stacking upper interlayer dielectrics and upper sacrifice layers. The upper interlayer dielectrics may include first to fourth upper interlayer dielectrics 151 to 154 upward. The upper sacrifice layers may include first to fourth upper sacrifice layers 141 to 144. The upper interlayer dielectrics 151 to 154 may be formed with, e.g., a silicon oxide layer. The upper sacrifice layers 141 to 144 may be formed with material which has an etching selectivity with respect to the upper interlayer dielectrics 151 to 154. For instance, the upper sacrifice layers 141 to 144 may be formed with a silicon nitride layer. The first upper interlayer dielectric 141 may be formed undermost to contact the fourth lower sacrifice layer 124 and the fourth upper sacrifice layer 144 may be formed uppermost.

Figure 8:
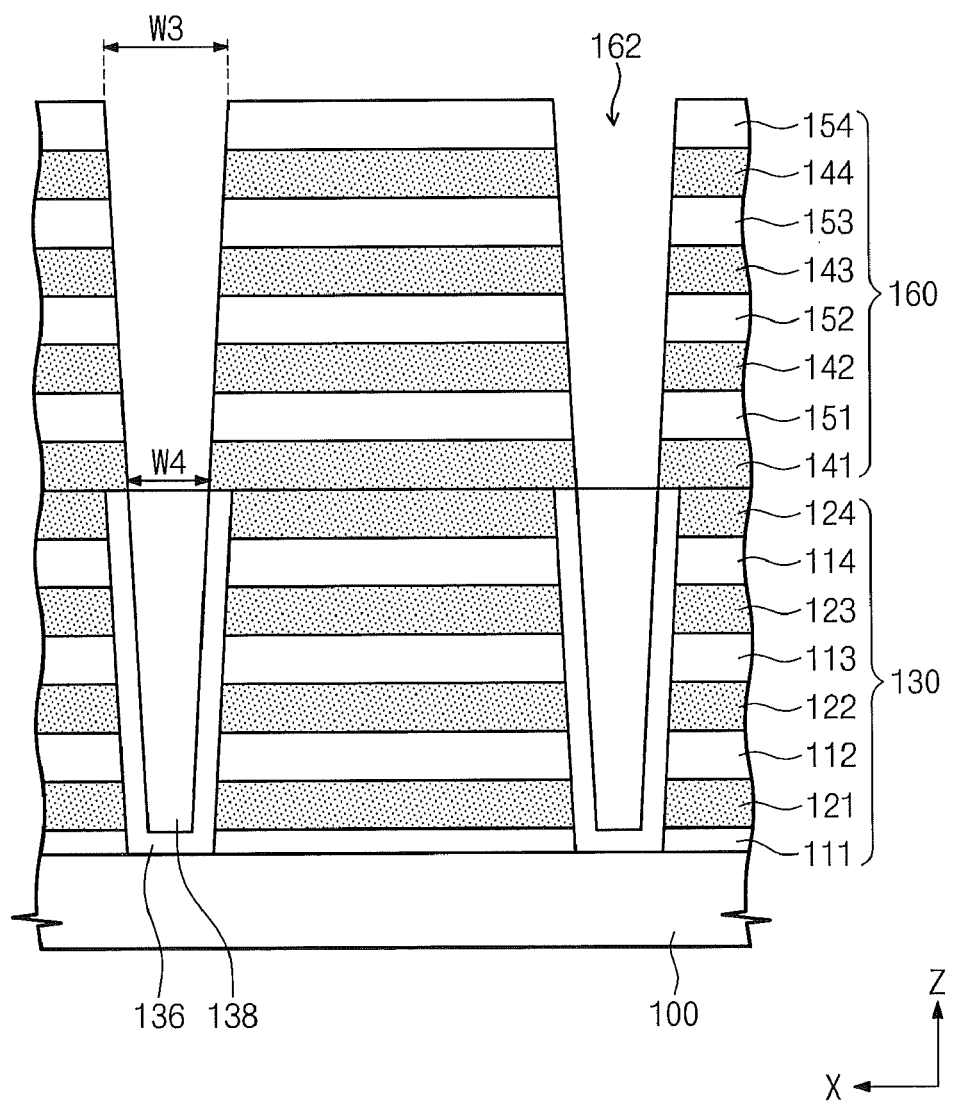

Referring to FIG. 8, by etching the upper sacrifice layers 141 to 144 and the upper interlayer dielectrics 151 to 154, an upper active hole 162 which exposes the lower filling insulating layer 138 is formed. An upper width W3 of the upper active hole 162 may be wider than its lower width W4. The lower width W4 of the upper active hole 162 may be equal to or wider than an upper width of the lower filling insulating layer 138 and narrower than the upper width W1 of the lower active hole 132.

Figure 9:
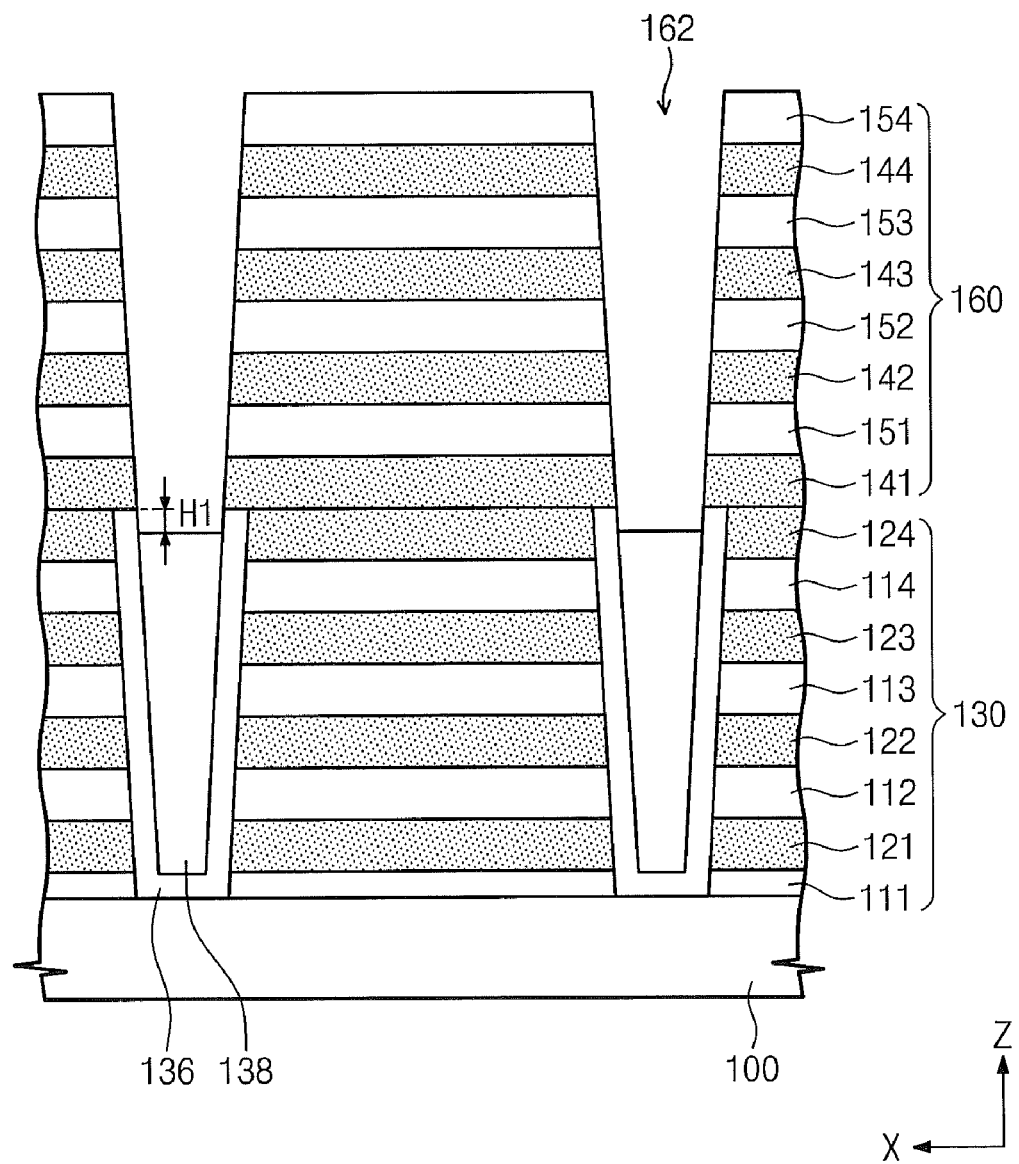

Referring to FIG. 9, an upper portion of the lower filling insulating layer 138 exposed by the upper active hole 162 is recessed. An upper surface of the lower filling insulating layer 138 becomes lower than that of the lower active pillars 136 as much as a first height H1, the inner side of the upper portion of the lower active pillars 136 is exposed. By the recess process, a by-product of etch on the lower filling insulating layer 138, which is possibly generated during the process of forming the upper active hole 162 of FIG. 8, may be eliminated and natural oxide layer possibly formed on the exposed surface of the lower active pillars 136 can be removed.

Figure 10:
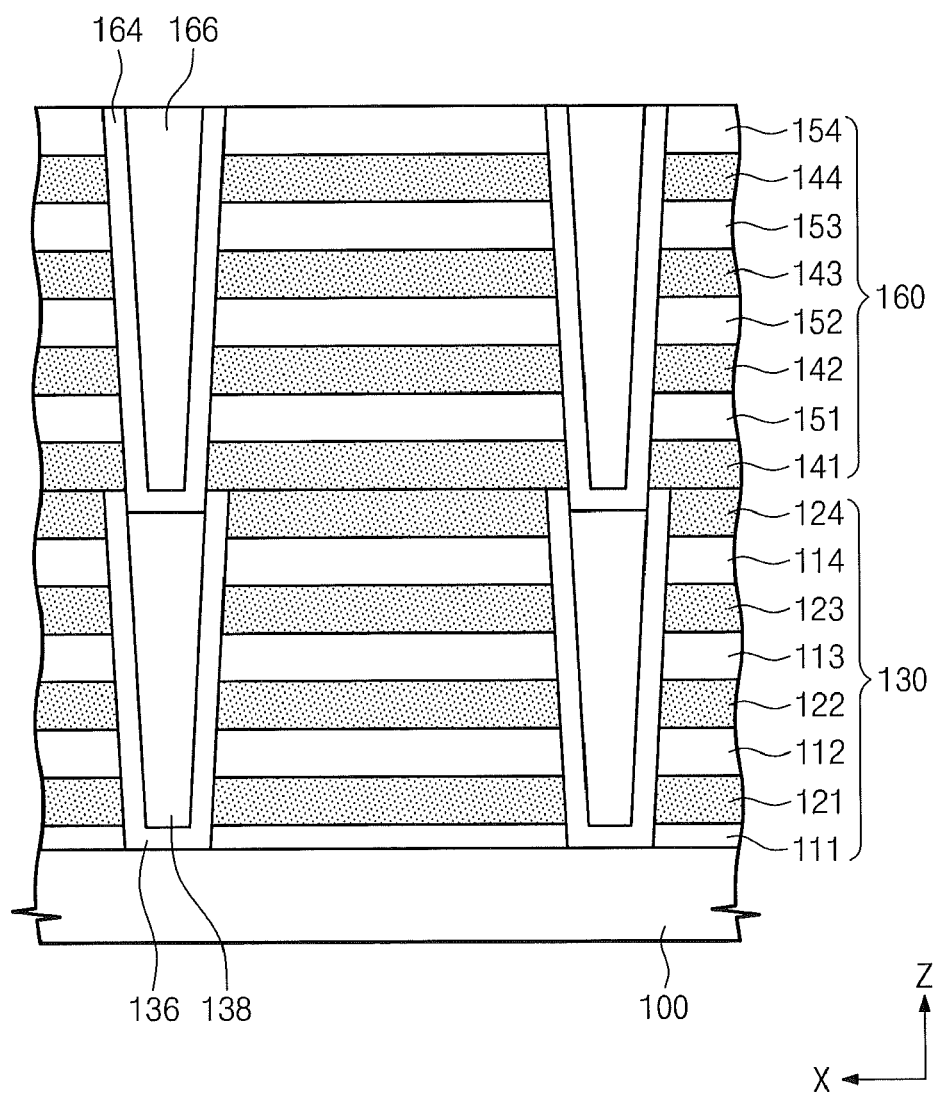

Referring to FIG. 10, the upper active pillars 164 which cover the bottom and inner side of the upper active hole 162 are formed. The upper filling insulating layer 166 which fills the inner space of the upper active pillars 164 may be formed. The process of forming the upper active pillars 164 and the upper filling insulating layer 166 may be similar to that of forming the lower active pillars 136 and the lower filling insulating layer 138. The upper active pillars 164 are formed so as to contact the inner side of the exposed upper part of the lower active pillars 136.

Figure 11:
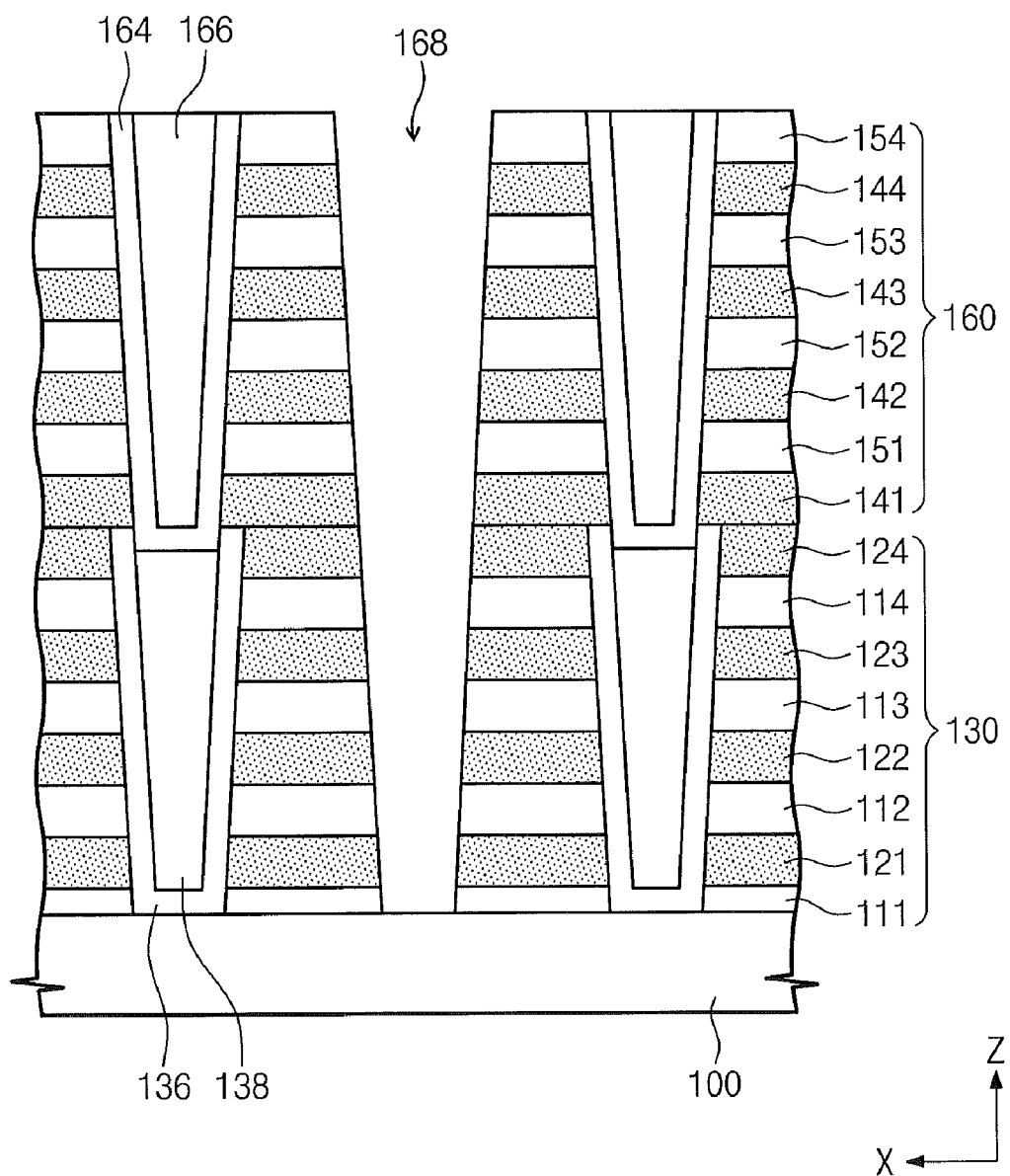

Referring to FIG. 11, between the active pillars 136 and 164 neighboring each other in the first direction, a first electrode separation opening 168 which exposes the substrate 100 is formed by sequentially etching the upper layer 160 and the lower layer 130. The first electrode separation opening 168 may be extended in the second direction.

Figure 12:
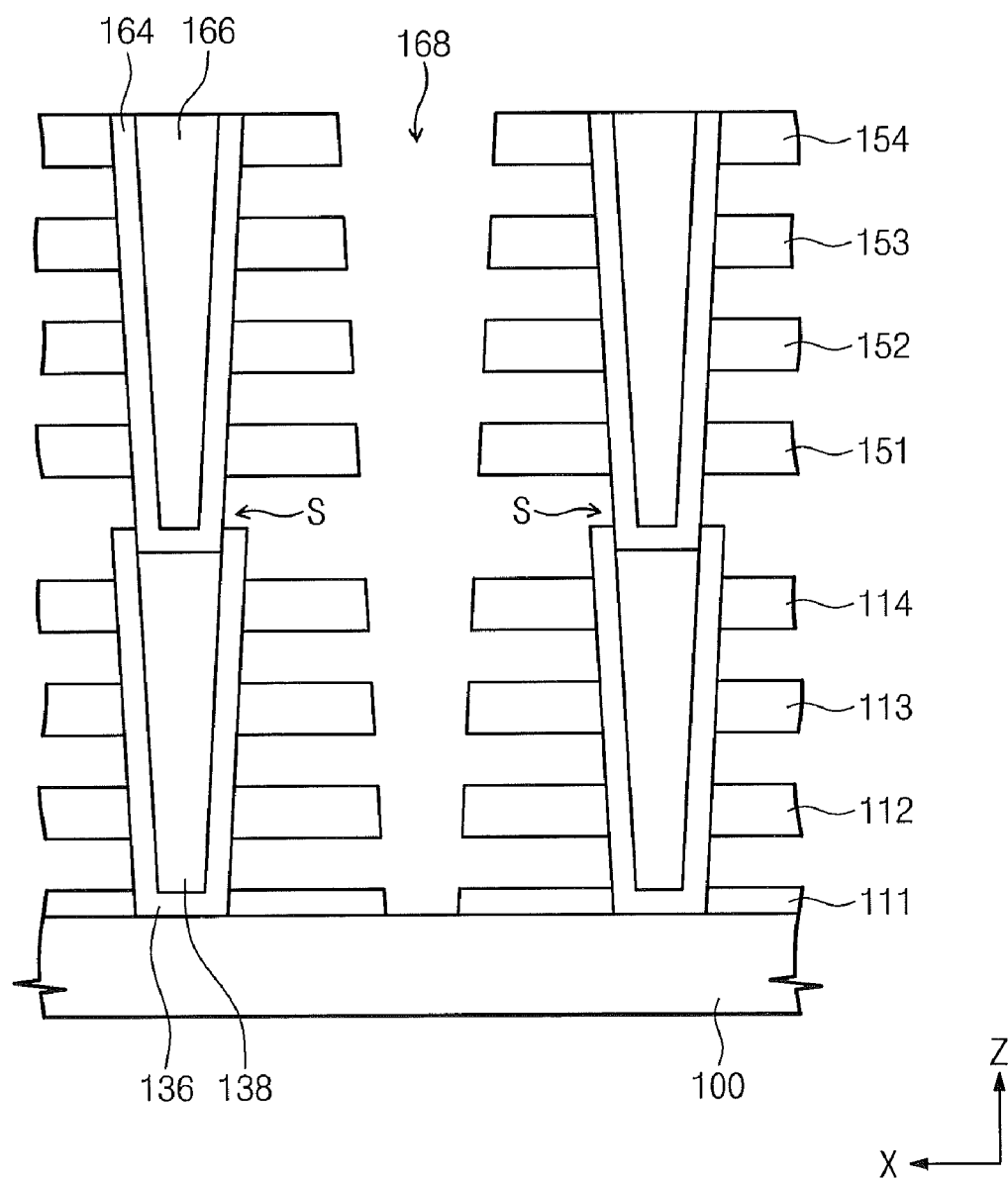

Referring to FIG. 12, the sacrifice layers 121 to 124 and 141 to 144 exposed through the first electrode separation opening 168 are selectively removed. In the case that the sacrifice layers include the silicon nitride layer, the removing process may be performed using an etch solution which includes phosphoric acid. Upper surfaces and lower surfaces of the interlayer dielectrics 111 to 114 and 151 to 154 and the outer sides of the active pillars 136 and 164 are exposed. Since the fourth lower sacrifice layer 124 and the first upper sacrifice layer 141 are removed, a side S of the portion where the active pillars 136 and 164 contact to each other is exposed. The side S has the stepped profile.

Figure 13:
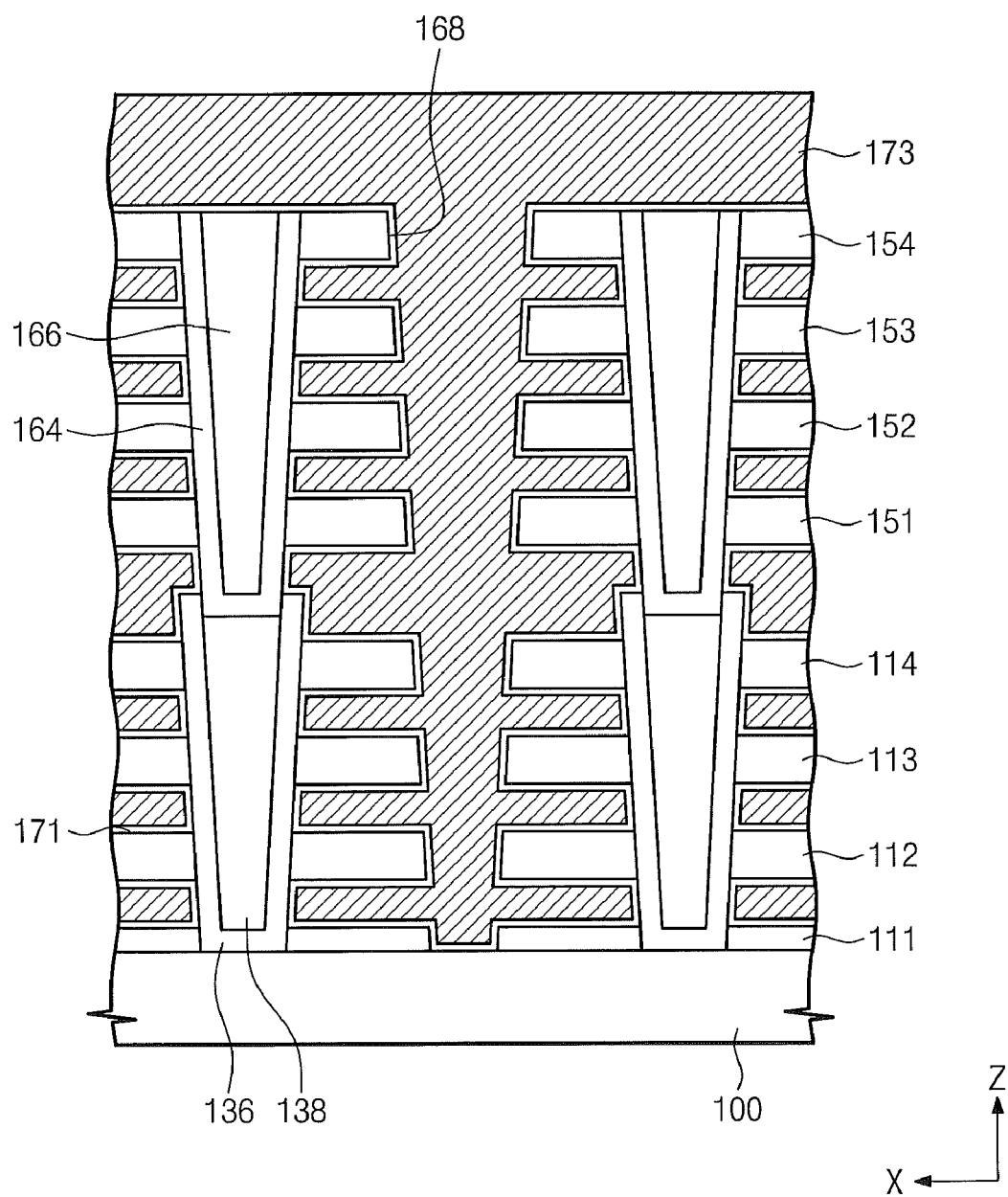

Referring to FIG. 13, on the substrate 100 where the sacrifice layers 121 to 124 and 141 to 144 are selectively removed, the information storage layer 171 is conformally formed. The information storage layer 171 may include the tunnel insulating layer contacted to the active pillars, the charge storage layer on the tunnel insulating layer and the blocking insulating layer on the charge storage layer. The tunnel insulating layer may include the silicon oxide layer. The tunnel insulating layer may be formed by thermal oxidation of the exposed outer sides of the active pillars. Otherwise, the tunnel insulating layer may be formed by an atomic layer deposition. The charge storage layer and the blocking insulating layer may be formed by the atomic layer deposition and/or chemical vapor deposition having excellent step coverage.

By forming a conduction layer 173 on the information storage layer 171, the first electrode separation opening 168 is filled and the empty space between the interlayer dielectrics 111 to 114 and 151 to 154 is filled. The conduction layer 173 may be formed with at least one of the doped silicon, tungsten, metal nitride layer and metal silicide. The conduction layer 173 may be formed by the atomic layer deposition.

Figure 14:
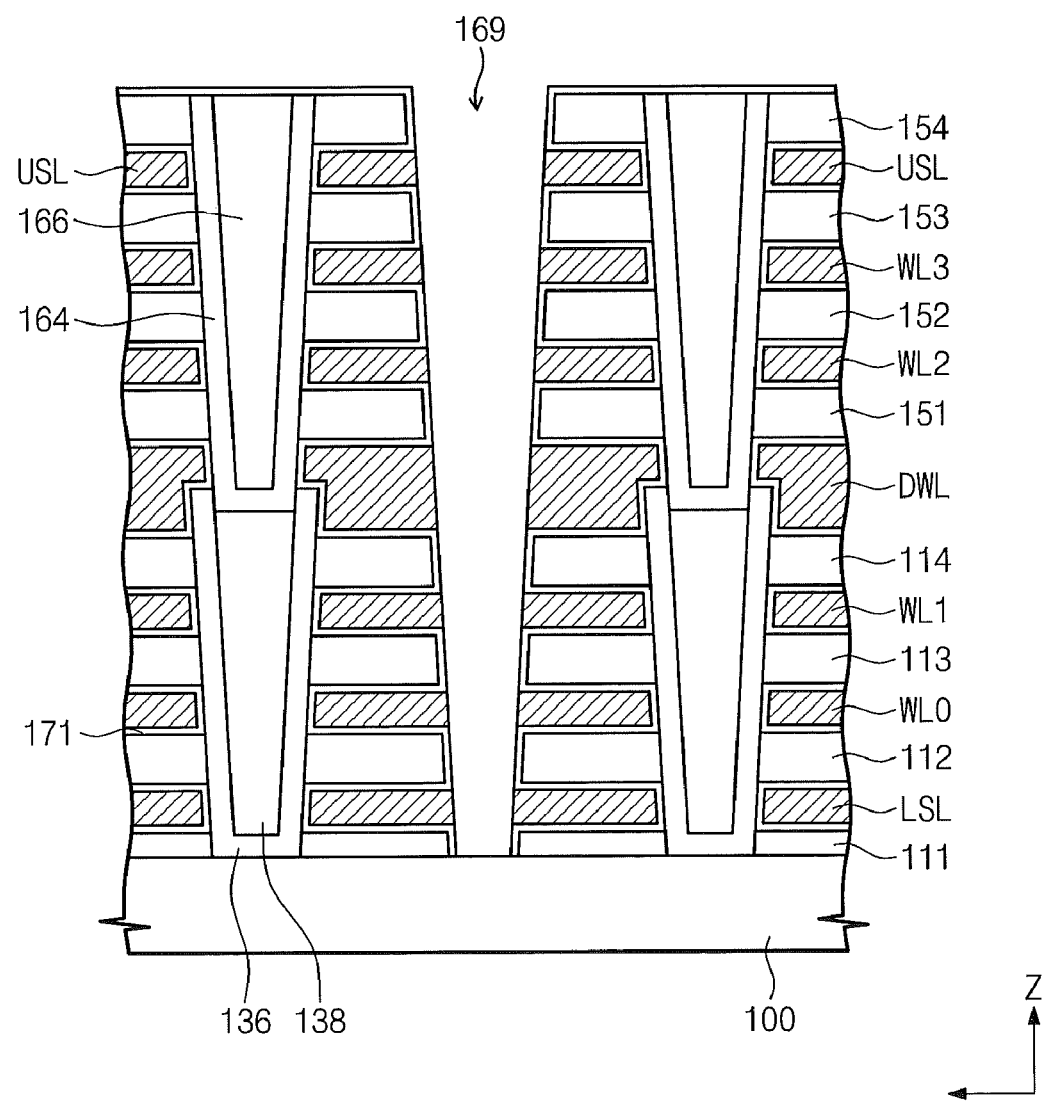

Referring to FIG. 14, by performing the planarization process to the conduction layer 173, the conduction layer 173 on the upper layer 160 is removed so that the information storage layer 171 on the upper layer 160 is exposed. By removing the conduction layer 173 in the first electrode separation opening 168, a second electrode separation opening 169 which exposes the substrate 100 is formed. The first electrode separation opening 168 and the second electrode separation opening 169 are formed so as to overlap each other. Due to the formation of the second electrode separation opening 169, the conduction patterns LSL, WL0 to WL3 and USL are formed at the portion where there used to be the sacrifice layers 121 to 124 and 141 to 144. By injecting impurities to the substrate 100 exposed by the second electrode separation opening 169, the common source line CSL is formed.

Referring to FIG. 2 again, by filling the second electrode separation opening 169 with an insulating layer, the electrode separation pattern 175 is formed. The information storage layer 171 on the uppermost upper interlayer dielectric 154 may be removed. By recessing the upper portion of the upper filling insulating layer 166, the inner side of the upper active pillars 164 is exposed. At the recessed portion of the upper filling insulating layer 166, the upper active pattern 177 is formed. The upper active pattern 177 may be formed with the semiconductor layer. By doping the upper active pattern 177 and the upper portion of the upper active pillars 164 with impurities, the drain region 179 is formed. The drain region 179 may be doped with, e.g., N-type impurities. By forming a conduction layer on the uppermost upper interlayer dielectric layer 154 and patterning it, the plurality of bit lines BL0 to BL3 extended to the first direction and electrically connected to the drain region 179 is formed.

Figure 15:
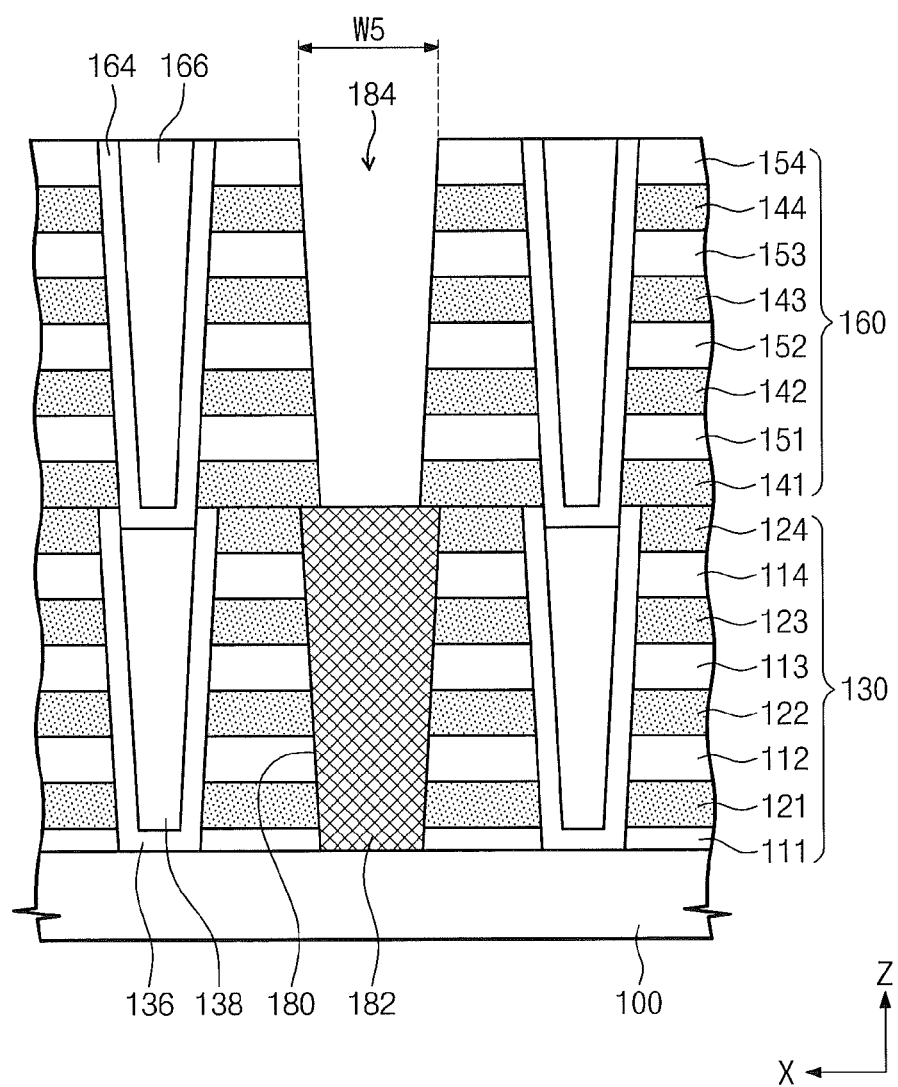
FIGS. 15 and 16 are cross-sectional views corresponding to the line I-I' of FIG. 1 for describing another method for forming the three-dimensional nonvolatile memory device according to the first embodiment of the inventive concept.
Figure 16:
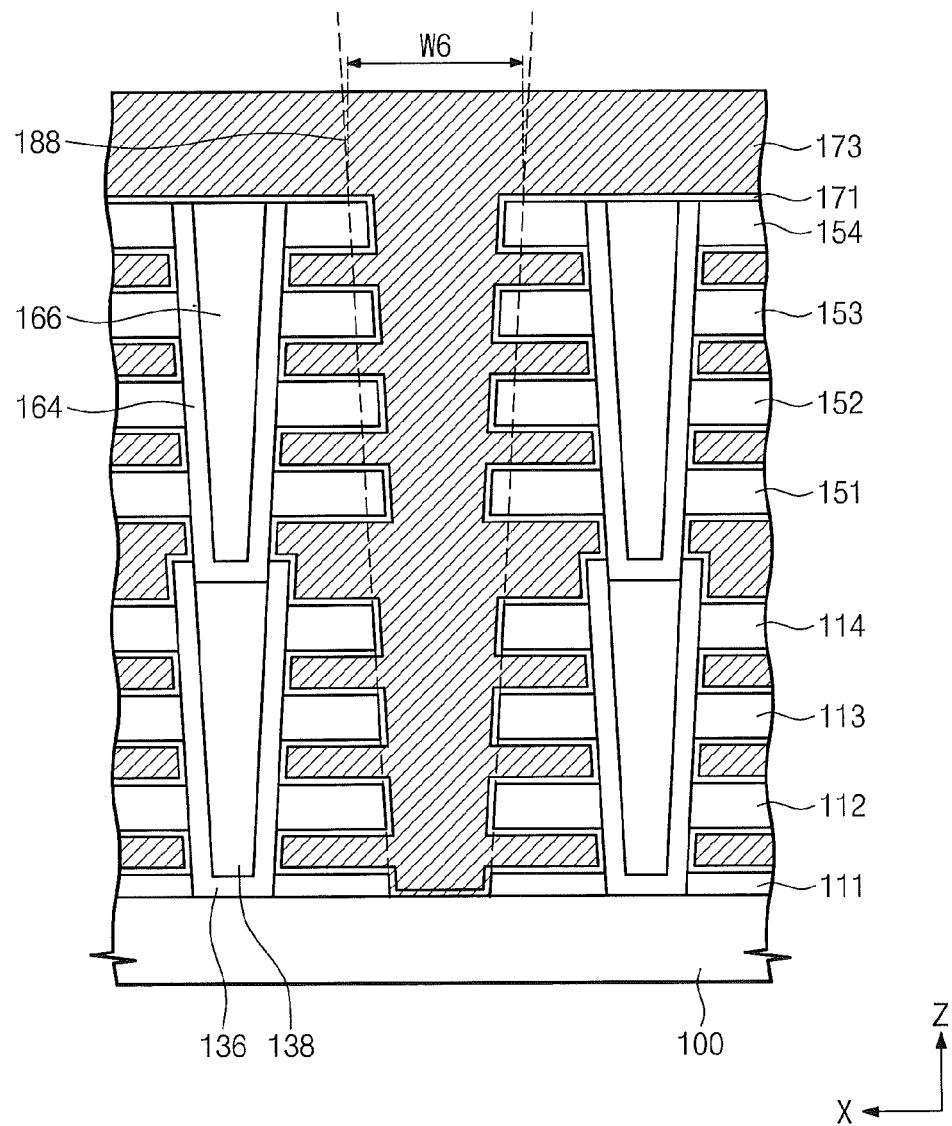

FIGS. 15 and 16 are cross-sectional views for describing another method for forming the three-dimensional nonvolatile memory device according to the first embodiment of the inventive concept. The cross sections correspond to the line I-I' of FIG. 1.

Referring to FIG. 15, by patterning the lower layer 130 between the lower active pillars 136 neighboring each other in the first direction illustrated in FIG. 6, a preliminary lower opening 180 which exposes the substrate 100 is formed. The preliminary lower opening 180 is filled with, e.g., a sacrifice pattern 182. The sacrifice pattern 182 may include the same material as the lower sacrifice layers 121 to 124. On the lower layer 130, the upper layer 160 is formed in the method described referring to FIG. 7. In the method described referring to FIGS. 8 to 10, the upper active pillars 164 and the upper filling insulating layer 166 are formed. By patterning the upper layer 160 between the upper active pillars 164 neighboring each other in the first direction, a preliminary upper opening 184 which overlaps the preliminary lower opening 180 and exposes the sacrifice pattern 182 is formed.

Referring to FIGS. 15 and 16, the upper sacrifice layers 141 to 144 and the sacrifice pattern 182 exposed by the preliminary upper opening 184 are selectively removed. Accordingly, the lower sacrifice layers 121 and 124 are exposed and selectively removed. Therefore, the upper and lower surfaces of the interlayer dielectrics 111 to 114 and 151 to 154 and the outer surfaces of the active pillars 136 and 164 are exposed. The information storage layer 171 and the conduction layer 173 are formed to fill the empty space between the interlayer dielectrics 111 to 114 and 151 to 154, the preliminary upper opening 184 and the preliminary lower opening 180. The conduction layer 173 and the information storage layer 171 on the fourth upper interlayer dielectric 154 are removed by the planarization process. And, by removing the conduction layer 173, the information storage layer 171 and a part of the upper interlayer dielectrics 151 to 154 in the preliminary upper and lower openings 184 and 180, a third electrode separation opening 188 is formed. Herein, an upper width W6 of the third electrode separation opening 188 is wider than an upper width W5 of the preliminary upper opening 184, and the third electrode separation opening 188 overlaps the preliminary upper opening 184. Thereafter, a process similar to that described referring to FIG. 2 may be performed.

If a lower width of the preliminary upper opening 184 is equal to an upper width of the preliminary lower opening 180, the upper width W5 of the preliminary upper opening 184 may be equal to the upper width W6 of the third electrode separation opening 188. According to the forming method described referring to FIGS. 15 and 16, the electrode separation opening is formed by twice performing etch process, and thus the problem of difficulty of forming a deep separation opening at a time may be solved.

Embodiment 2

Figure 17:
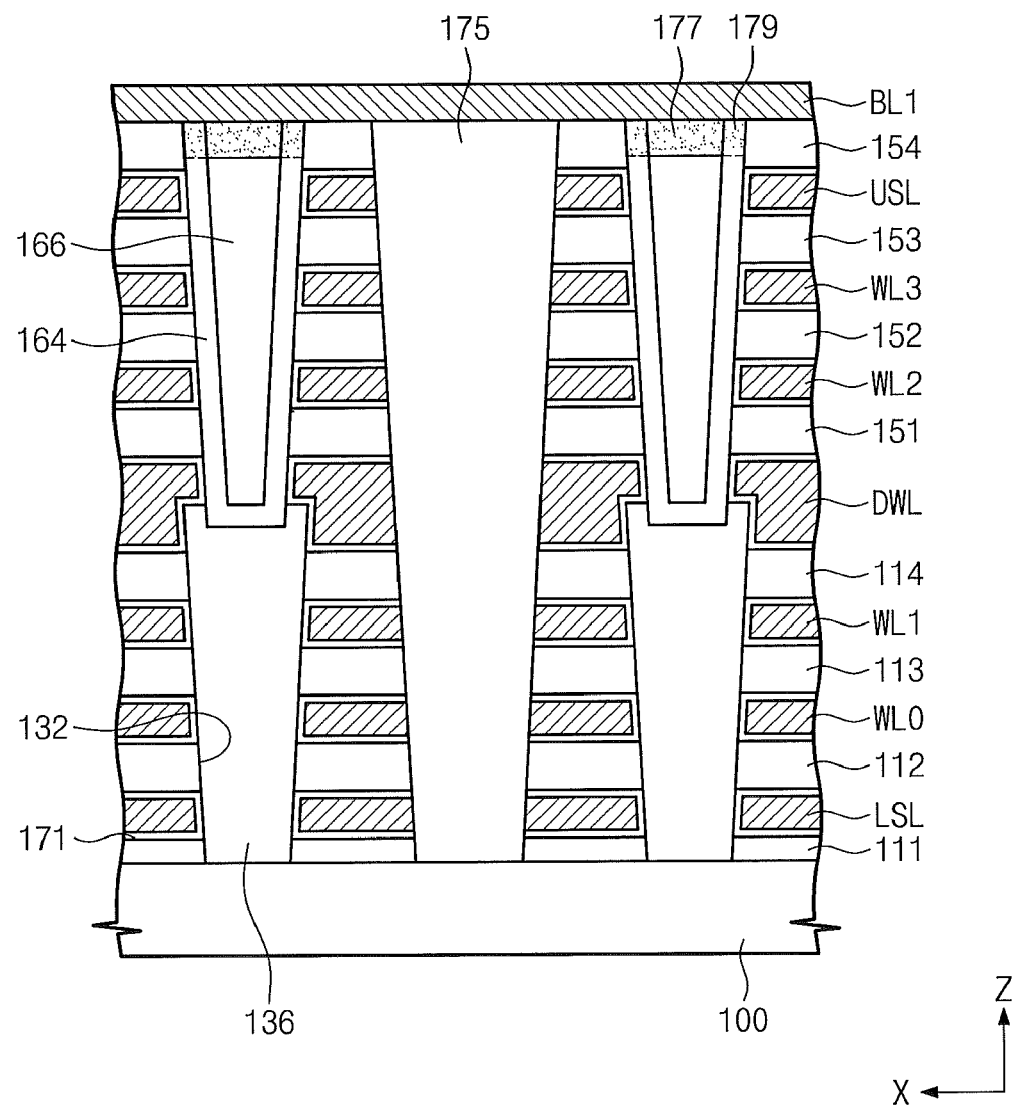
FIG. 17 is a cross-sectional view of a three-dimensional nonvolatile memory device according to a second embodiment of the inventive concept corresponding to the line I-I' of FIG. 1.

FIG. 17 is a cross-sectional view of a three-dimensional nonvolatile memory device according to a second embodiment of the inventive concept. The cross section corresponds to the line I-I' of FIG. 1. Explanations overlapped by the description above-mentioned referring to FIG. 2 are omitted; rather, differences will be explained in detail. The operating method may be similar to that of the first embodiment.

Referring to FIG. 17, the lower active pillars 136 of the three-dimensional nonvolatile memory device according to the second embodiment of the inventive concept may have a plug shape filling the lower active hole 132. The upper active pillars 164 have the above-described cup shape of the first embodiment. The above-described lower filling insulating layer 138 of the first embodiment may not be formed. The lower surface of the upper active pillars 164 may be lower than the upper surface of the lower active pillars 136.

Unlike the drawing illustrated in FIG. 17, the upper active pillars 164 may have the plug shape filling the upper active hole 132. The lower active pillars 136 have the above-described cup shape of the first embodiment. The above-described upper filling insulating layer 166 of the first embodiment may not be formed.

Embodiment 3

Figure 18:
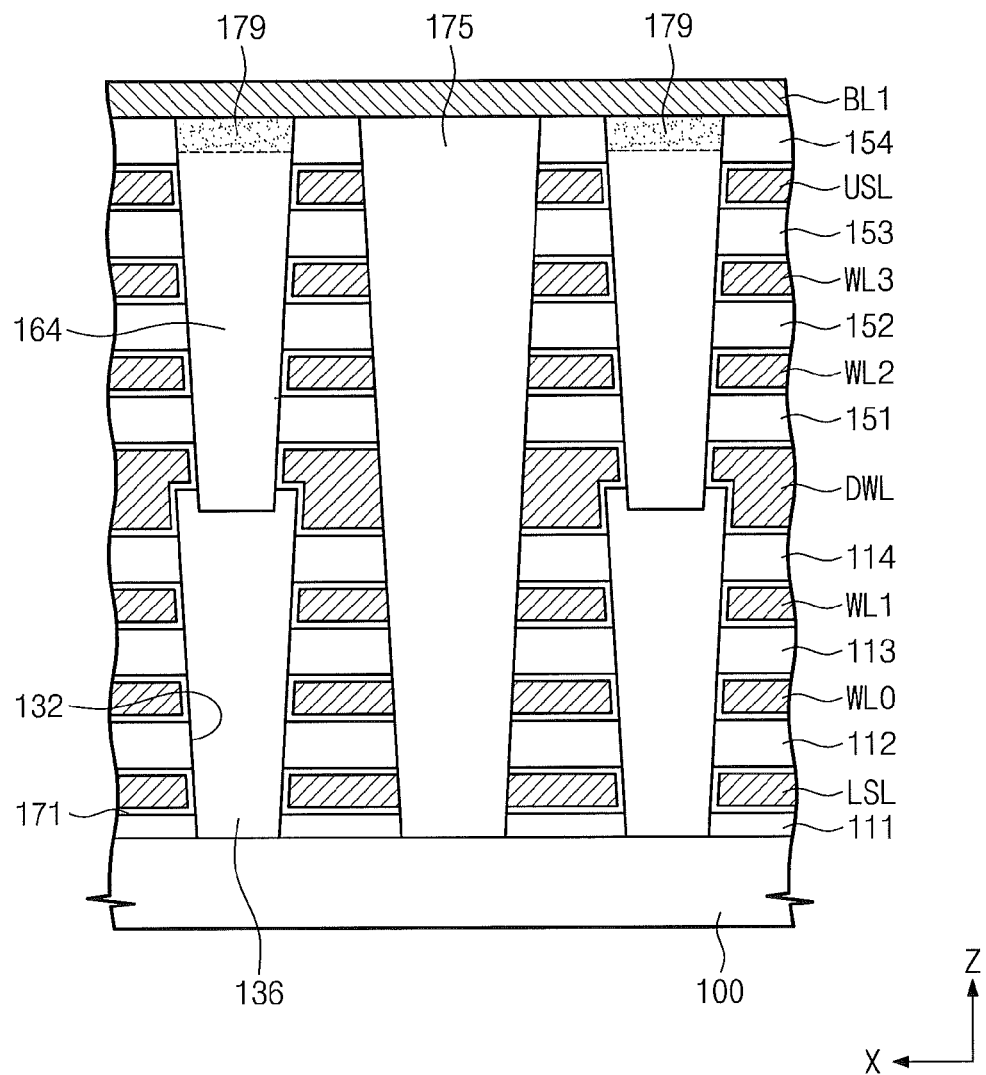
FIG. 18 is a cross-sectional view of a three-dimensional nonvolatile memory device according to a third embodiment of the inventive concept corresponding to the line I-I' of FIG. 1.

FIG. 18 is a cross-sectional view of a three-dimensional nonvolatile memory device according to a third embodiment of the inventive concept. The cross section corresponds to the line I-I' of FIG. 1. Explanations overlapped by the description above-mentioned referring to FIG. 2 are omitted; rather, differences will be explained in detail. The operating method may be similar to that of the first embodiment.

Referring to FIG. 18, both of the lower active pillars 136 and the upper active pillars 164 of the three-dimensional nonvolatile memory device according to the third embodiment of the inventive concept may have the plug shape. The above-described filling insulating layers 138 and 166 and the upper active pattern 177 of the first embodiment are not formed. The upper width of the lower active pillars 136 may be wider than the lower width of the upper active pillars 164. The lower surface of the upper active pillars 164 may be lower than the upper surface of the lower active pillars 136.

Embodiment 4

Figure 19:
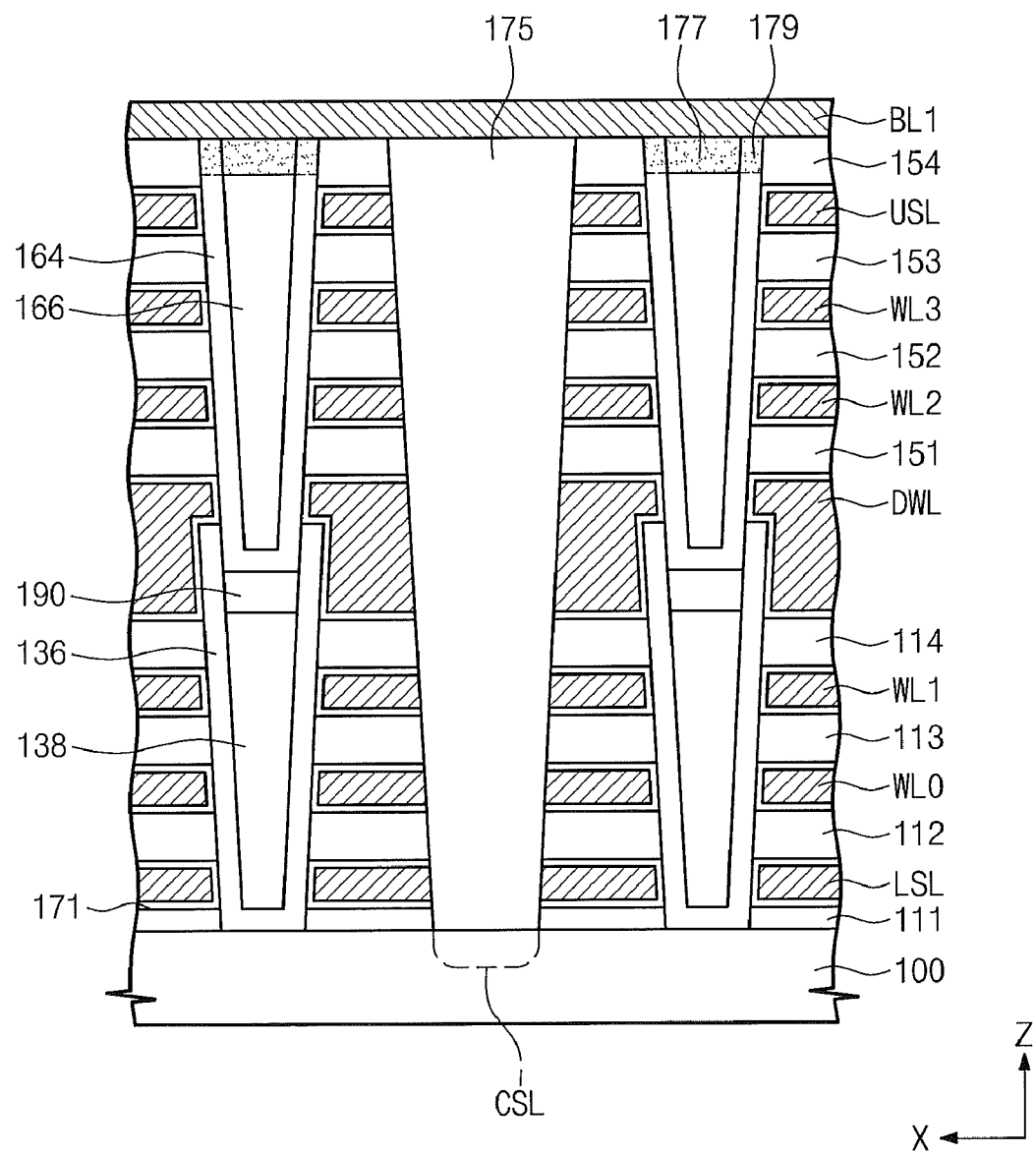
FIG. 19 is a cross-sectional view of a three-dimensional nonvolatile memory device according to a fourth embodiment of the inventive concept corresponding to the line I-I' of FIG. 1.

FIG. 19 is a cross-sectional view of a three-dimensional nonvolatile memory device according to a fourth embodiment of the inventive concept. The cross section corresponds to the line I-I' of FIG. 1. Explanations overlapped by the description above-mentioned referring to FIG. 2 are omitted; rather, differences will be explained in detail. The operating method may be similar to that of the first embodiment.

Referring to FIG. 19, the three-dimensional nonvolatile memory device according to the fourth embodiment of the inventive concept includes a lower active pattern 190 interposed between the lower filling insulating layer 138 and the upper active pillars 164 and provided within the lower active pillars 136. The lower active pattern 190 may include the semiconductor layer. The lower active pattern 190 contacts the inner side of the upper part of the lower active pillars 136. The lower active pattern 190 contacts the lower surface of the upper active pillars 164. An upper surface of the lower active pattern 190 may be lower than that of the lower active pillars 136. The lower active pattern 190 helps the upper active pillars 164 and the lower active pillars 136 be electrically connected to each other even if the upper active pillars 164 are misaligned with the lower active pillars 136. The lower active pattern 190 may be doped with the same conductive type as the lower active pillars 136 and the upper active pillars 164. For instance, the lower active pattern 190 and the active pillars 136 and 164 may be doped as P-type.

Since outer sides of the lower active pillars 136 and the upper active pillars 164 have the stepped profile at the portion where the lower active pillars 136 and the upper active pillars 164 contact to each other, characteristics of the channels formed at the lower active pattern 190, the upper active pillars 164 and the lower active pillars 136 may be different from each other. For uniformity and stabilization of characteristics of programming, read and erasing, a dummy conduction pattern DWL is provided adjacently to the contact region of the lower active pattern 190 and the lower active pillars 136 so as to cover the stepped profile. The dummy conduction pattern DWL may be a dummy word line.

Preferably, the upper surface of the dummy conduction pattern DWL may have the same height as or be higher than that of the lower active pillars 136. Preferably, the lower surface of the lower active pattern 190 may have the same height as or be higher than that of the lower interlayer dielectric 114 immediately under the dummy conduction pattern DWL. More preferably, the lower surface of the lower active pattern 190 may have the same height as or be higher than that of the dummy conduction pattern DWL. The dummy conduction pattern DWL may cover both of the lower active pillars 136 and the upper active pillars 164. Since the dummy conduction pattern DWL covers the lower active pillars 136, the upper active pillars 164 and the lower active pattern 190, the above-mentioned problem of channel non-uniformity may be reduced.

For stably performing delivery of boosting voltage during the programming, erasing voltage during the erasing and cell current during the read, the dummy conduction pattern DWL is required to form a channel which connects the lower active pillars 136, the upper active pillars 164 and the lower active pattern 190. Accordingly, if thickness of the lower active pattern 190 is increased, thickness of the dummy conduction pattern DWL may also be increased corresponding to the increase of the thickness of the lower active pattern 190.

Figure 20:
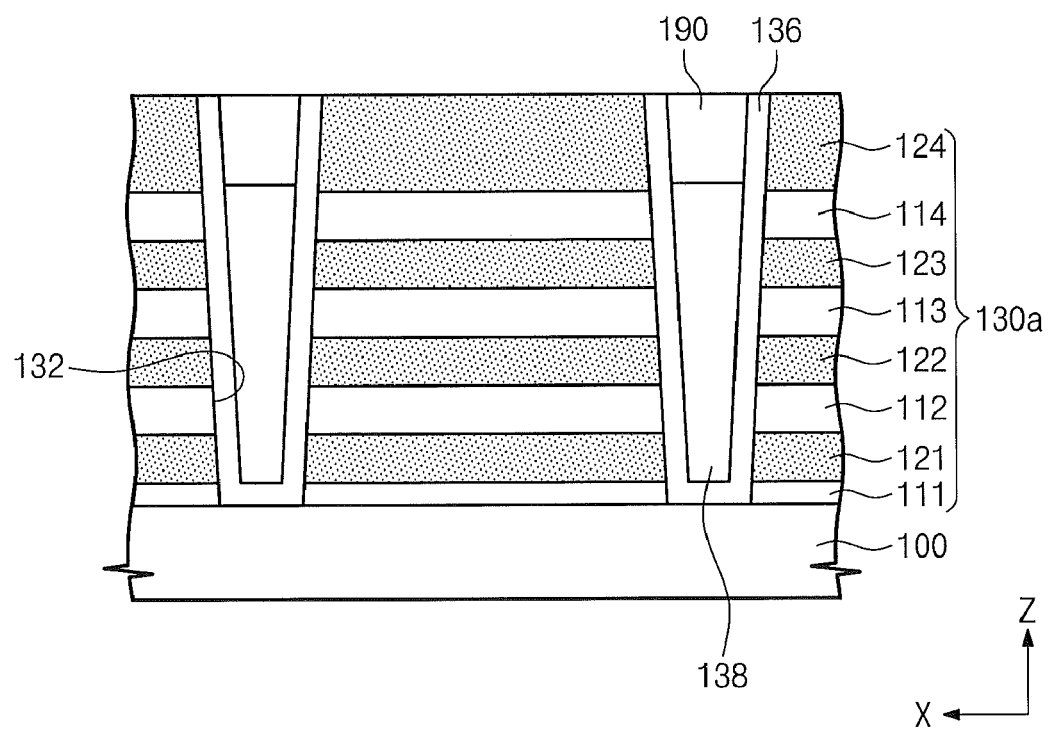
FIGS. 20 to 22 are cross-sectional views corresponding to the line I-I' of FIG. 1 for explaining a method for forming the three-dimensional nonvolatile memory device according to the fourth embodiment of the inventive concept.
Figure 21:
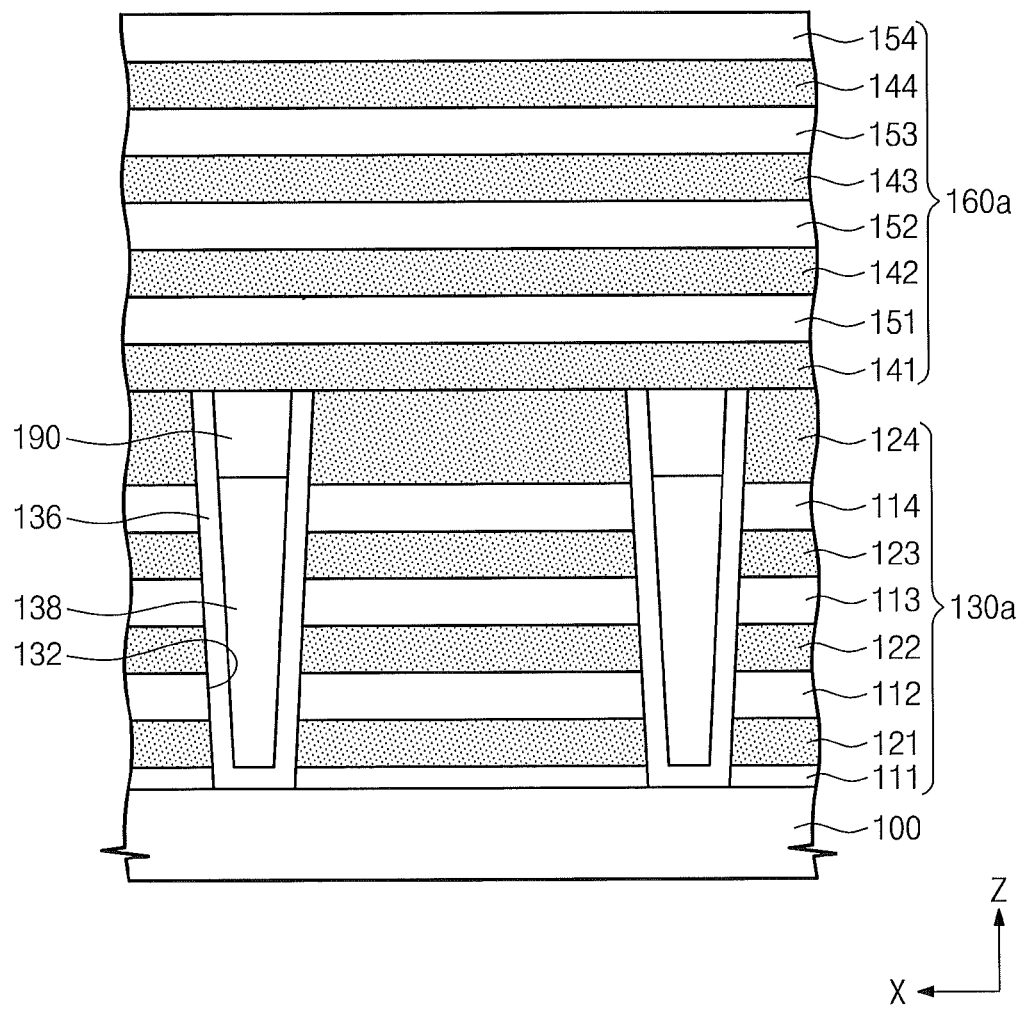
Figure 22:
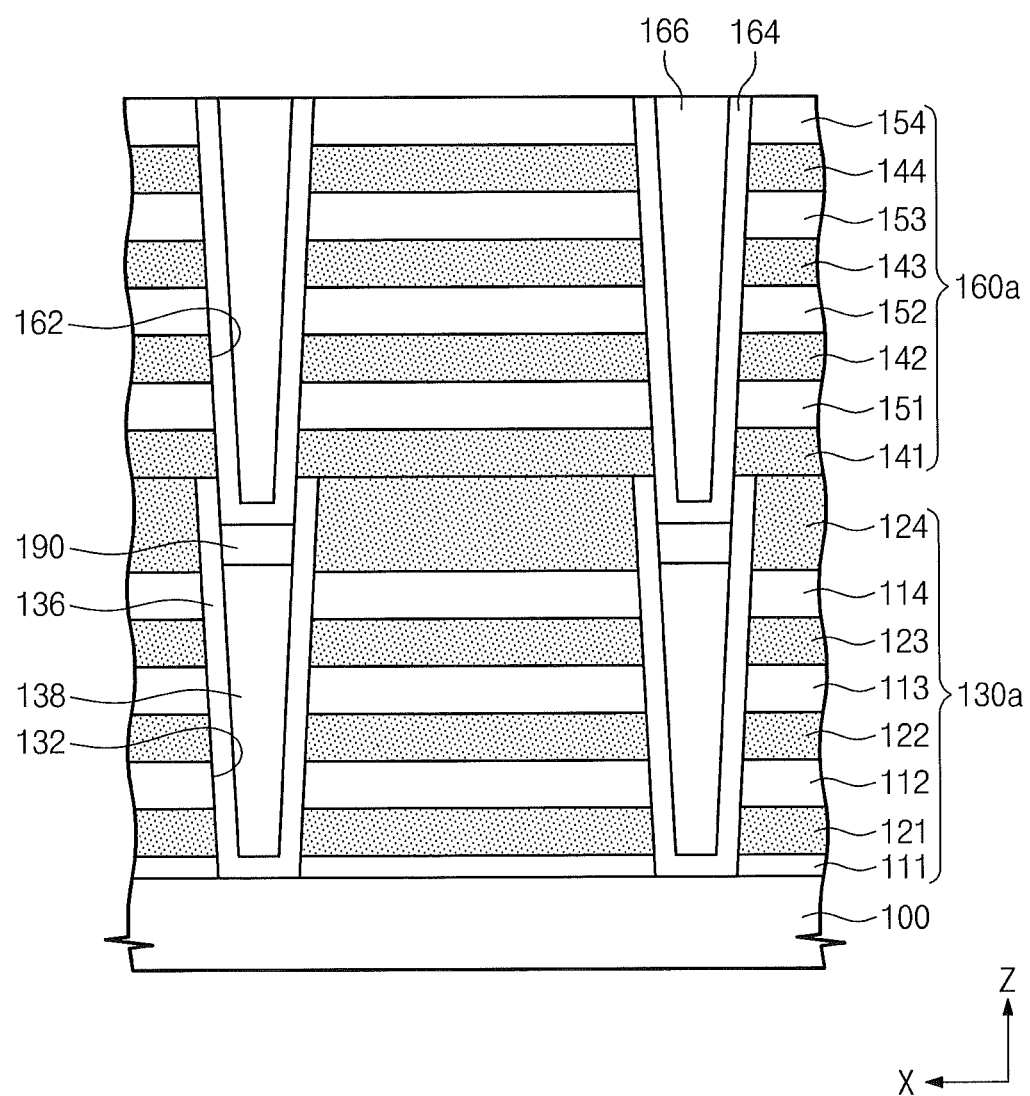

A method for forming the three-dimensional nonvolatile memory device according to the fourth embodiment of the inventive concept will be described. FIGS. 20 to 22 are cross-sectional views corresponding to the line I-I' of FIG. 1.

Referring to FIG. 20, a lower layer 130a is formed on the substrate 100. The lower layer 130a may be formed by alternately stacking lower interlayer dielectrics and lower sacrifice layers. For instance, the lower interlayer dielectrics may be formed with the silicon oxide layer. The lower sacrifice layers may be formed with material which has an etching selectivity with respect to the lower interlayer dielectrics. For instance, the lower sacrifice layers may be formed with the silicon nitride layer.

The lower interlayer dielectrics may include first to fourth lower interlayer dielectrics 111 to 114 upward. The lower sacrifice layers may include first to fourth lower sacrifice layers 121 to 124 upward. The undermost lower interlayer dielectric 111 may be thinner than the other interlayer dielectrics 112 to 114. The uppermost lower sacrifice layer 124 may be thicker than the other lower sacrifice layers 121 to 123.

The lower interlayer dielectrics 111 to 114 and the lower sacrifice layers 121 to 124 are etched so that the lower active hole 132 which exposes the substrate 100 is formed. At the lower active hole 132, the lower active pillars 136, the lower filling insulating layer 138 and the lower active pattern 190 are formed. For instance, the semiconductor layer is conformally formed on the side of the lower active hole 132 and the exposed surface of the substrate 100 to form the lower active pillars 136. For instance, the semiconductor layer may be the polysilicon layer not doped with impurities or the silicon layer doped as P-type.

By filling an insulating layer in the lower active pillars 136, the lower filling insulating layer 138 is formed. The upper portion of the lower filling insulating layer 138 is recessed. The upper surface of the recessed lower filling insulating layer 138 may have the same height as or be higher than the lower surface of the uppermost lower sacrifice layer 124. At the recessed portion, the lower active pattern 190 is formed. The lower active pattern 190 may contact the inner side of the upper part of the lower active pillars 136. The lower active pattern 190 may be doped as the same conductive type as the lower active pillars 136.

Referring to FIG. 21, an upper layer 160a is formed on the lower layer 130a. The upper layer 160a may be formed by alternately stacking upper interlayer dielectrics and upper sacrifice layers. For instance, the upper interlayer dielectric may be formed with the silicon oxide layer. The upper sacrifice layers may be formed with material which has an etching selectivity with respect to the upper interlayer dielectrics. For instance, the upper sacrifice layers may be formed with the silicon nitride layer.

The upper interlayer dielectrics may include first to fourth interlayer dielectrics 151 to 154 upward. The upper sacrifice layers may include first to fourth sacrifice layers 141 to 144 upward.

Referring to FIG. 22, the upper interlayer dielectrics 151 to 154 and the upper sacrifice layers 141 to 144 are etched so that the upper active hole 162 which exposes the lower active pattern 190 is formed. For instance, the upper active hole 162 is formed so that the lower surface of the lower active pattern 190 is lower than the upper surface of the lower active pillars 136. That is, when the upper active hole 162 is formed, the lower active pattern 190 is recessed so that the inner side of the upper part of the lower active pillars 136 is exposed.

The upper active pillars 164 which cover the bottom and inner side of the upper active hole 162 are formed. The upper filling insulating layer 166 is formed filling the inner space of the upper active pillars 164. The process of forming the upper active pillars 164 and the upper filling insulating layer 166 may similar to that of forming the lower active pillars 136 and the lower filling insulating layer 138. The upper active pillars 164 are formed so that they contact the inner side of the exposed upper part of the lower active pillars 136.

The lower surface of the upper active pillars 164 may have the same height as or be lower than that of the undermost upper sacrifice layer 141.

Thereafter, in the method described referring to FIGS. 11 to 14 and 2, the structure illustrated in FIG. 19 may be formed.

In this embodiment, for preventing the lower filling insulating layer 138 from being exposed due to the removal of the lower active pattern 190 while the upper active hole 162 is formed, thickness of the lower active pattern 190 should be sufficiently thick.

Embodiment 5

Figure 23:
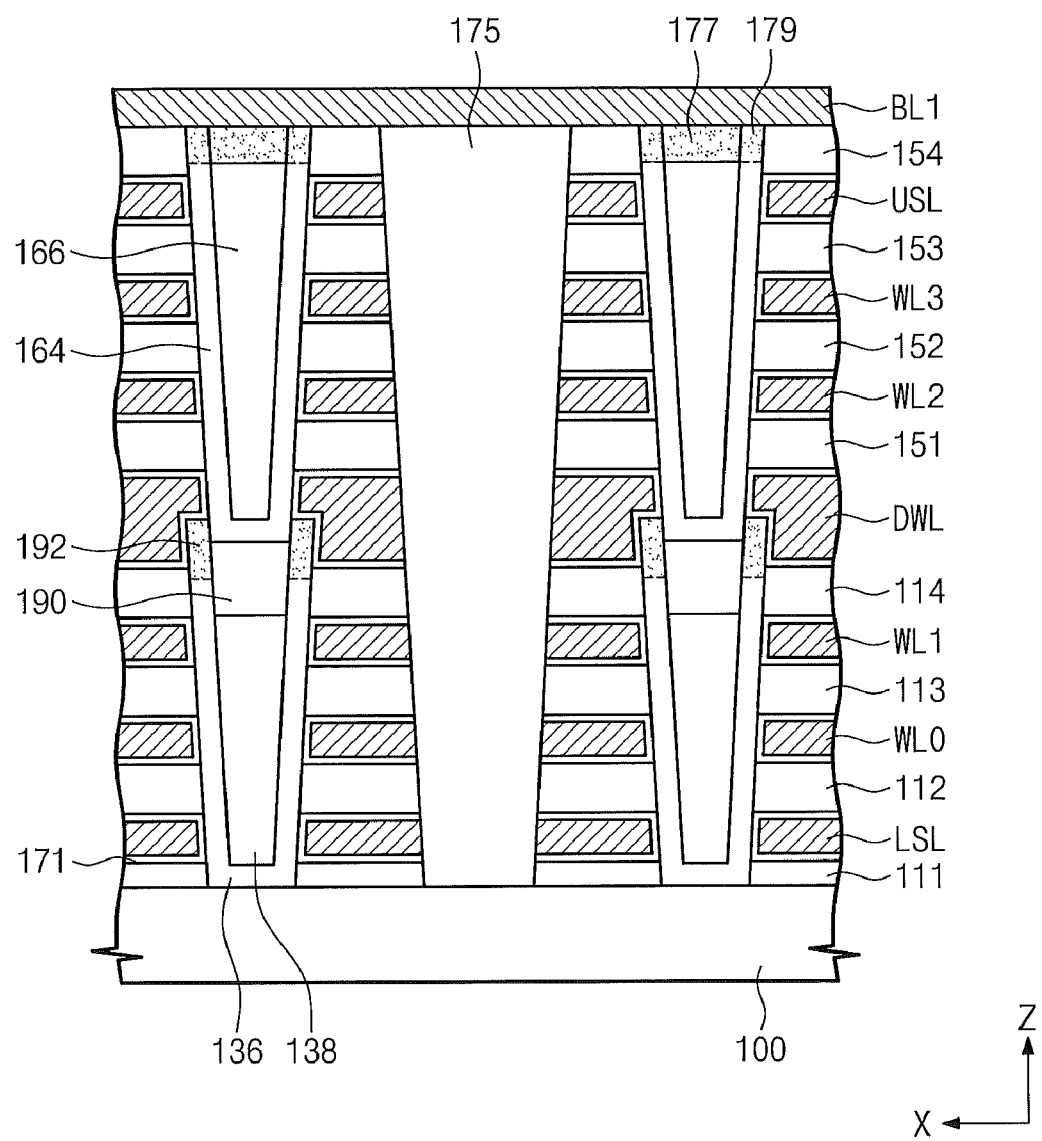
FIG. 23 is a cross-sectional view of a three-dimensional nonvolatile memory device according to a fifth embodiment of the inventive concept corresponding to the line I-I' of FIG. 1.

FIG. 23 is a cross-sectional view of a three-dimensional nonvolatile memory device according to a fifth embodiment of the inventive concept. The cross section corresponds to the line I-I' of FIG. 1. Explanations overlapped by the description above-mentioned referring to FIG. 19 are omitted; instead, differences will be explained in detail. The operating method may be similar to that of the first embodiment.

Referring to FIG. 23, an impurity doped region 192 is provided to the upper part of the lower active pillars 136 of the three-dimensional nonvolatile memory device according to the fifth embodiment of the inventive concept. The lower active pattern 190 is stacked between the lower filling insulating layer 138 and the upper active pillars 164. The lower surface of the lower active pattern 190 is lower than a lower part of the impurity doped region 192. The impurity doped region 192 may be, e.g., doped with N-type impurities. The lower active pattern 190 may be doped with P-type impurities. Due to the impurity doped region 192, the current flow adjacent to the dummy conduction pattern DWL may be improved.

Embodiment 6

Figure 24:
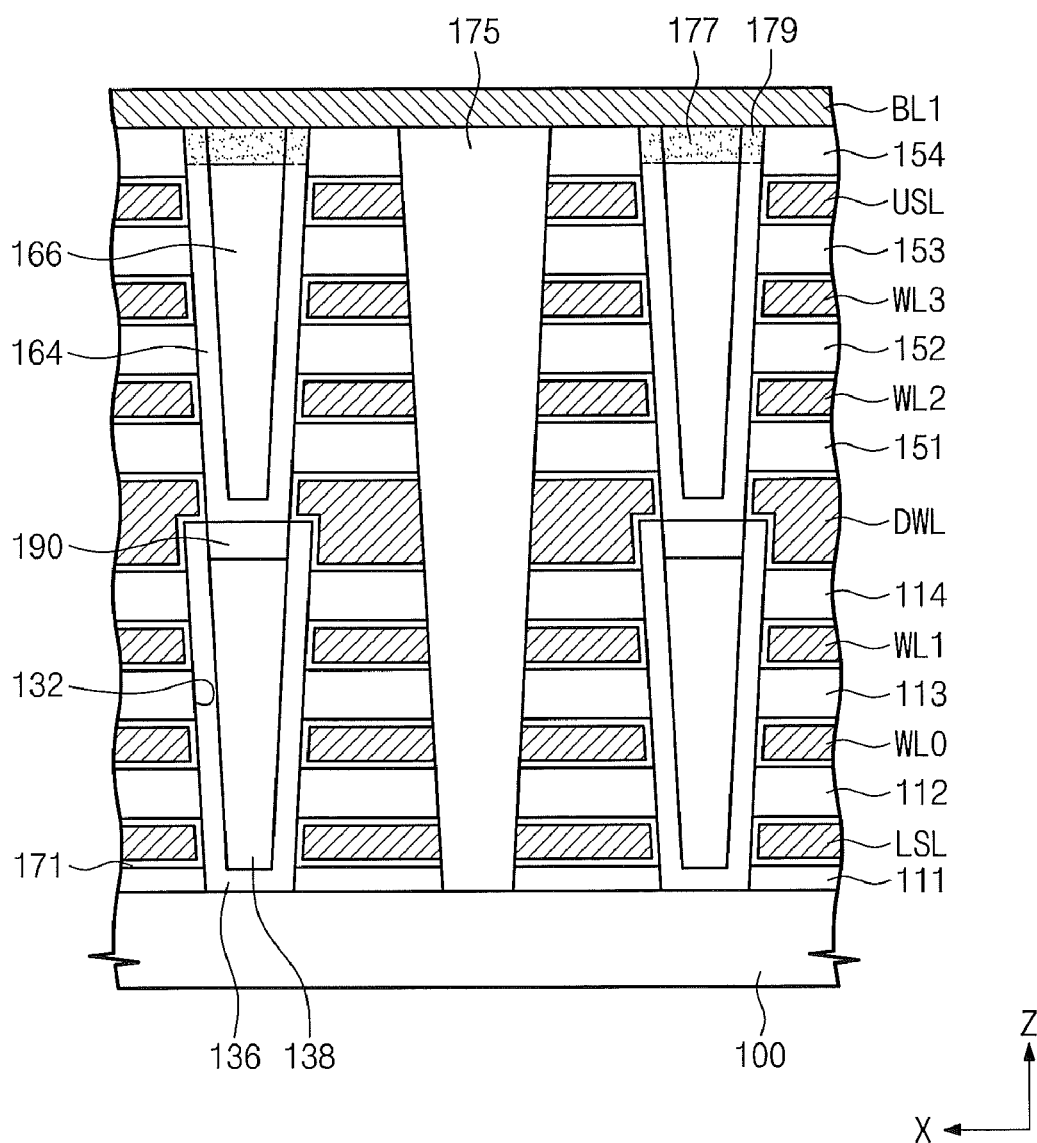
FIG. 24 is a cross-sectional view of a three-dimensional nonvolatile memory device according to a sixth embodiment of the inventive concept corresponding to the line I-I' of FIG. 1.

FIG. 24 is a cross-sectional view of a three-dimensional nonvolatile memory device according to a sixth embodiment of the inventive concept. The cross section corresponds to the line I-I' of FIG. 1. Explanations overlapped by the description above-mentioned referring to FIG. 19 are omitted; instead, differences will be explained in detail. The operating method may be similar to that of the first embodiment.

Referring to FIG. 24, the lower active pattern 190 is provided between the upper active pillars 164 and the lower filling insulating layer 138 of the three-dimensional nonvolatile memory device according to the sixth embodiment of the inventive concept. The outer side of the lower part of the upper active pillars 164 does not contact the inner side of the upper part of the lower active pillars 136. The lower surface of the upper active pillars 164, the upper surface of the lower active pillars 136 and the upper surface of the lower active pattern 190 may be coplanar.

Embodiment 7

Figure 25:
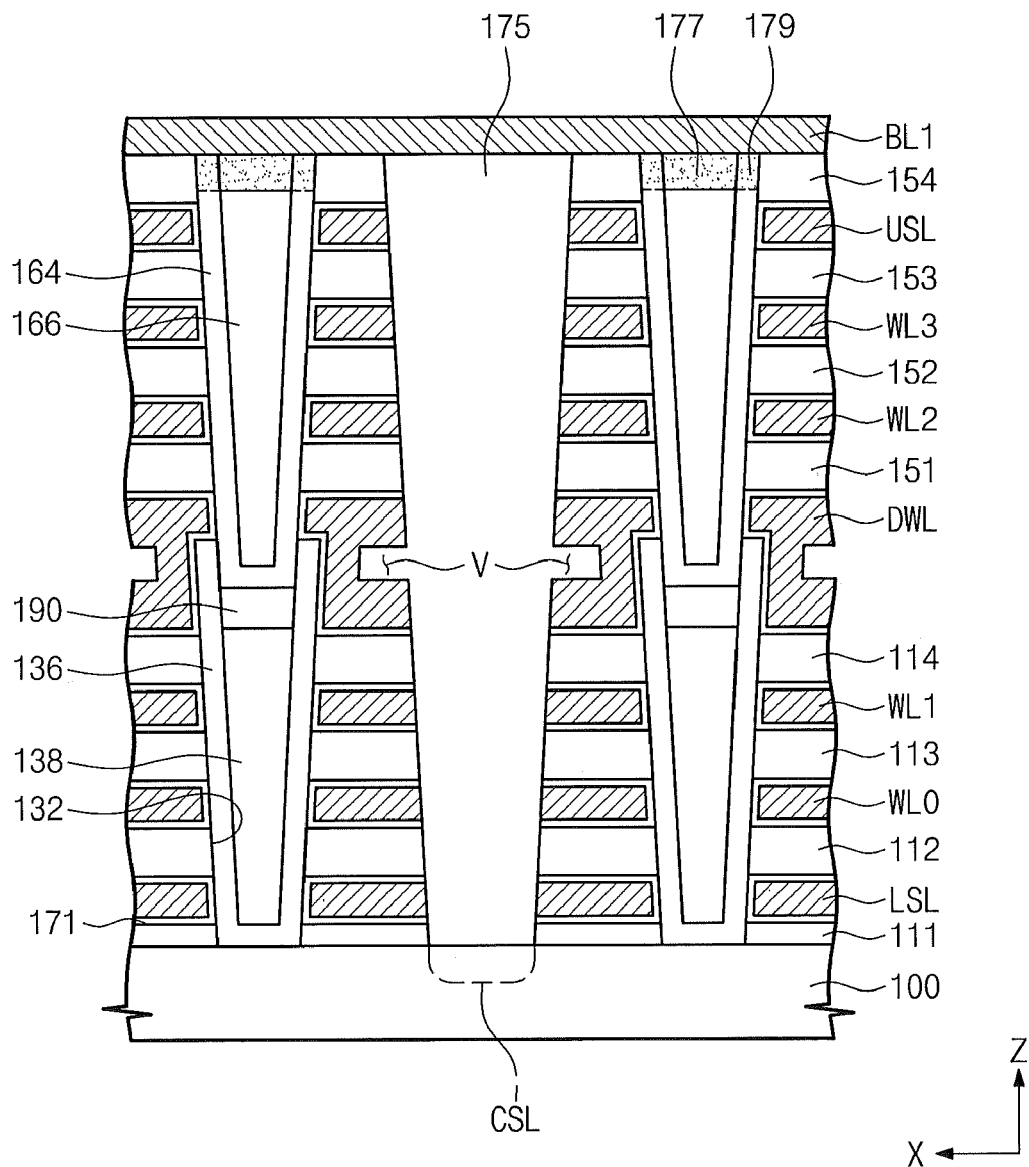
FIG. 25 is a cross-sectional view of a three-dimensional nonvolatile memory device according to a seventh embodiment of the inventive concept corresponding to the line I-I' of FIG. 1.

FIG. 25 is a cross-sectional view of a three-dimensional nonvolatile memory device according to a seventh embodiment of the inventive concept. The cross section corresponds to the line I-I' of FIG. 1. Explanations overlapped by the description above-mentioned referring to FIG. 19 are omitted; instead, differences will be explained in detail. The operating method may be similar to that of the first embodiment.

Referring to FIG. 25, the dummy word line DWL of the three-dimensional nonvolatile memory device according to the seventh embodiment of the inventive concept has a cave-in part V at the side of the dummy conduction pattern facing the active pillars. The cave-in part V may be filled with the same material as the electrode separation pattern 175.

Figure 26:
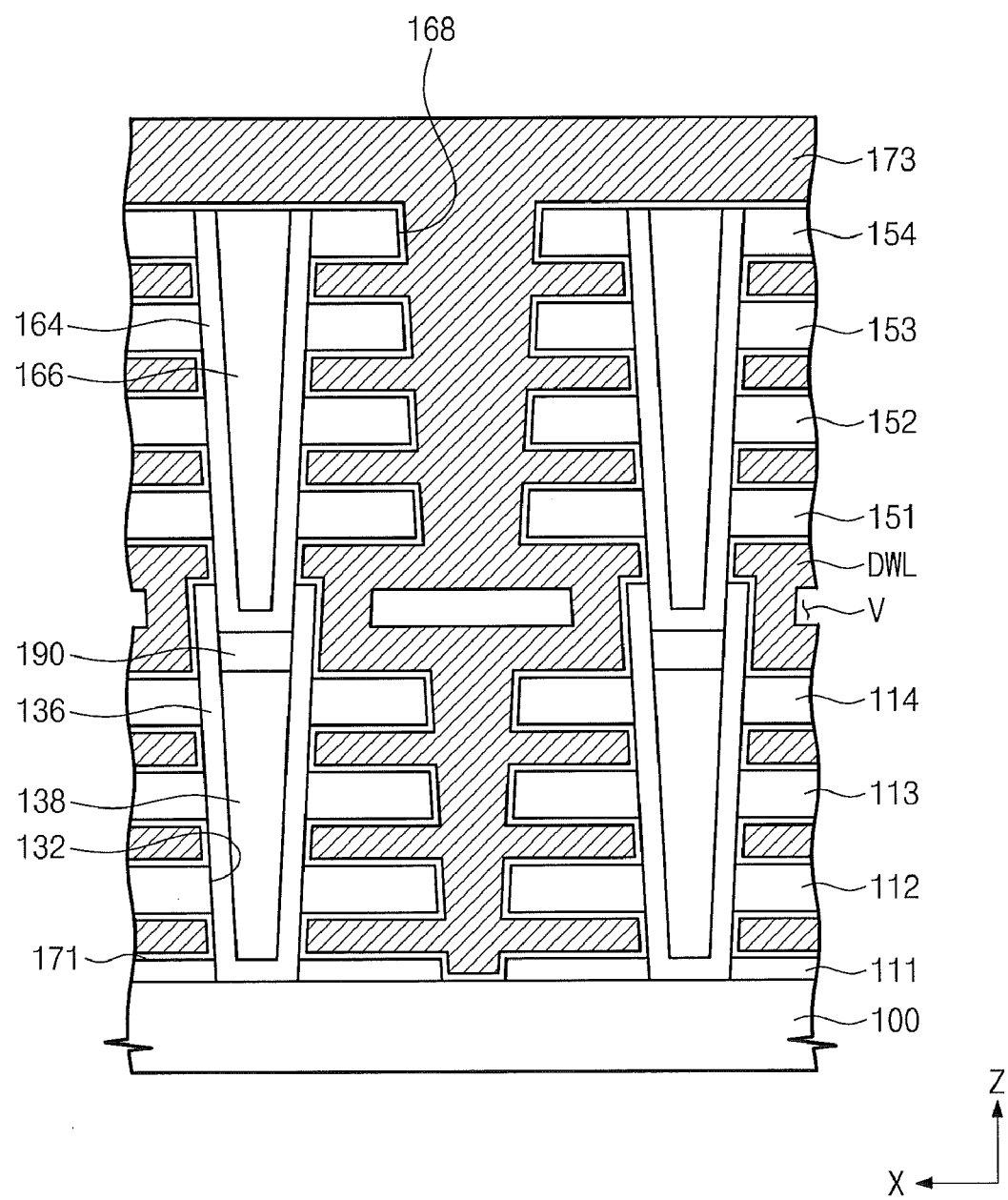
FIG. 26 is a cross-sectional view corresponding to the line I-I' of FIG. 1 for explaining a method for forming the three-dimensional nonvolatile memory device according to the seventh embodiment of the inventive concept.

Referring to FIG. 26, a method for forming the three-dimensional nonvolatile memory device according to the seventh embodiment of the inventive concept is described. In the method described referring to FIGS. 11 and 12, the first electrode separation opening 168 is formed and the sacrifice layers are removed. The information storage layer 171 is conformally formed. The region where the sacrifice layers 124 and 141 corresponding to the dummy conduction patterns DWL are removed has larger space than the regions where the other sacrifice layers 121 to 123 and 142 to 144 are removed. Accordingly, before the region where the sacrifice layers 124 and 141 corresponding to the dummy conduction patterns DWL are sufficiently filled with the conduction layer 173, the first electrode separation opening 168 may be filled with the conduction layer 173. In the inside of the conduction layer 173 corresponding to the dummy conduction pattern DWL, a void V may be formed.

Thereafter, in the method described referring to FIG. 14, the conduction layer 173 in the first electrode separation opening 168 is removed so that the second electrode separation opening which exposes the substrate 100 is formed. By injecting impurities to the substrate 100 exposed by the second electrode separation opening, the common source line CSL is formed. In the method described referring to FIG. 2, the structure illustrate in FIG. 25 may be formed.

Embodiment 8

Figure 27:
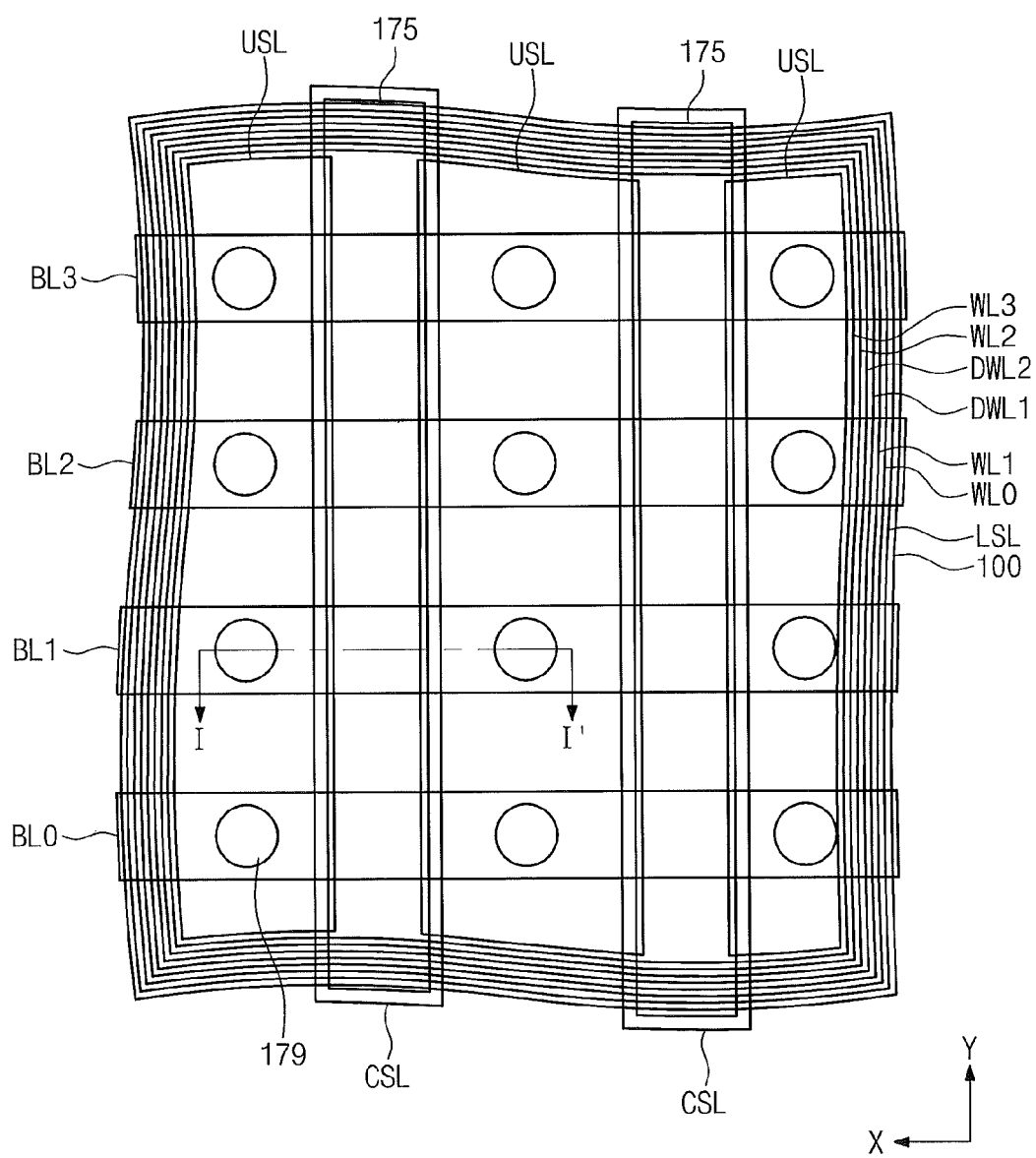
FIG. 27 is a planar diagram illustrating a three-dimensional nonvolatile memory device according to an eighth embodiment of the inventive concept.
Figure 28:
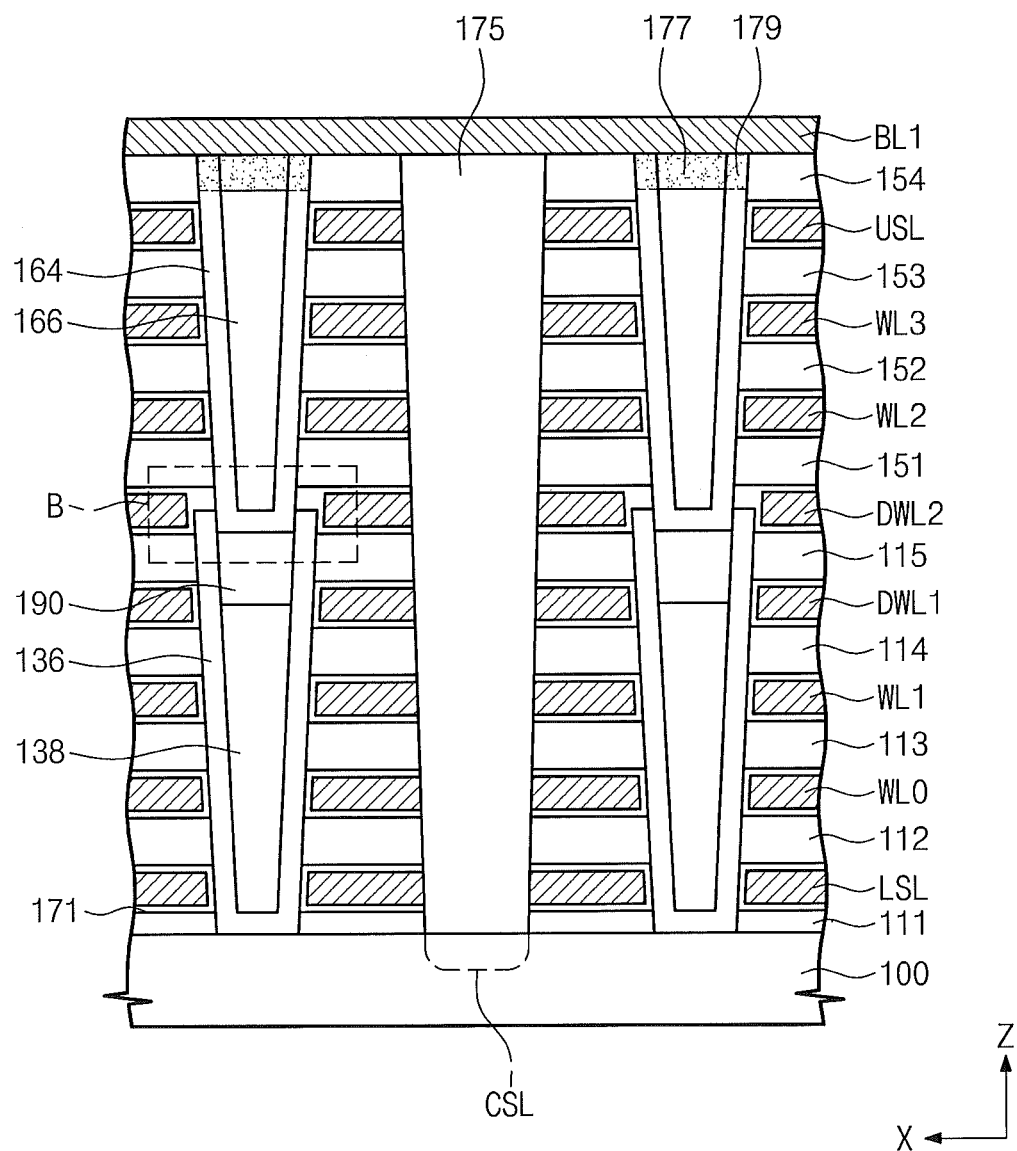
FIG. 28 is a cross-sectional view along the line of FIG. 27.

FIG. 27 is a planar diagram illustrating a three-dimensional nonvolatile memory device according to an eighth embodiment of the inventive concept. FIG. 28 is a cross-sectional view along the line I-I' of FIG. 27. Explanations overlapped by the description above-mentioned referring to FIG. 19 are omitted; instead, differences will be explained in detail.

Referring to FIGS. 27 and 28, the three-dimensional nonvolatile memory device according to the eighth embodiment of the inventive concept includes the lower active pattern 190 interposed between the lower filling insulating layer 138 and the upper active pillars 164. The lower active pattern 190 contacts the inner side of the upper part of the lower active pillars 136 and contacts the lower surface of the upper active pillars 164. The lower active pattern 190 helps the upper active pillars 164 and the lower active pillars 136 be electrically connected to each other.

At least two dummy conduction patterns DWL1 and DWL2 are provided adjacently to the contact region of the lower active pillars 136 and the upper active pillars 164. Hereinafter, the dummy conduction patterns DWL1 and DWL2 are defined as a first dummy conduction pattern DWL1 and a second dummy conduction pattern DWL2 respectively from the bottom. The first dummy conduction pattern DWL1 covers the lower active pillars 136. The second dummy conduction pattern DWL2 covers the stepped profile of the region where the lower active pillars 136 and the upper active pillars 164 contact each other. The problem of channel non-uniformity due to different characteristics of the channels formed at the lower active pillars 136, the upper active pillars 164 and the lower active pattern 190 may be reduced.

Preferably, the lower surface of the lower active pattern 190 may have the same height as or be higher than that of the lower interlayer dielectric 114 immediately under the first dummy conduction pattern DWL1. More preferably, the lower surface of the lower active pattern 190 may have the same height as or be higher than that of the first dummy conduction pattern DWL1. Preferably, the upper surface of the lower active pillars 136 may have the same height as or be lower than that of the interlayer dielectric 151 just on the second dummy conduction pattern DWL2. More preferably, the upper surface of the lower active pattern 136 may have the same height as or be lower than that of the second dummy conduction pattern DWL2. Preferably, the lower surface of the upper active pillars 164 may have the same height as or be higher than that of the lower interlayer dielectric 114 immediately under the first dummy conduction pattern DWL1. More preferably, the lower surface of the upper active pillars 164 may have the same height as or be higher than that of the first dummy conduction pattern DWL1.

The dummy conduction patterns DWL1 and DWL2 and/or the interlayer dielectrics 114 and 151 immediately adjacent to them cover the lower active pillars 136, the upper active pillars 164 and the lower active pattern 190. Accordingly, the above-mentioned regions where the channels are non-uniform may be separated from the conduction patterns used as the memory cell, and thus the effect to the memory cell due to the channel non-uniformity may be reduced.

Meanwhile, the conduction patterns WL0 to WL3 except for the conduction patterns LSL and USL corresponding to the selection lines, and the dummy conduction patterns DWL1 and DWL2 may have the same thickness. Accordingly, at the edge of the cell region, the process of forming the stepped contact region by patterning the conduction patterns LSL, WL0 to WL3, USL, DWL1 and DWL2 may be performed more easily.

Figure 29:
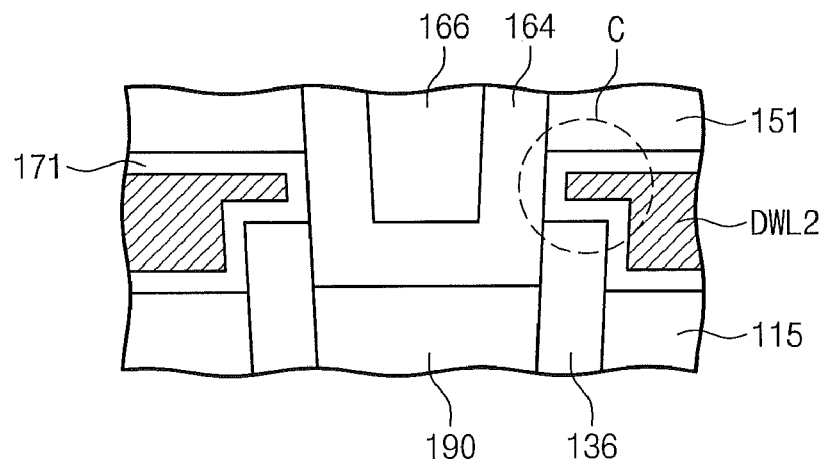
FIG. 29 is a magnified diagram of a part B adjacent to a second dummy conduction pattern described with reference to FIG. 28.

FIG. 29 is a magnified diagram of a part B adjacent to the second dummy conduction pattern DWL2 described referring to FIG. 28. Referring to FIG. 29, the second dummy conduction pattern DWL2 may include a protrusion part C provided along the stepped profile and protruded toward the upper active pillar 164. The protrusion part C of the second dummy conduction pattern DWL2 may be more protruded to the outer side of the lower part of the upper active pillars 164 than a first surface facing the outer side of the upper part of the lower active pillars 136 and thinner than the dummy conduction pattern. The charge storage layer 171 may be conformally formed along the surfaces of the active pillars 136 and 164 and the interlayer dielectrics 115 and 151.

Figure 30:
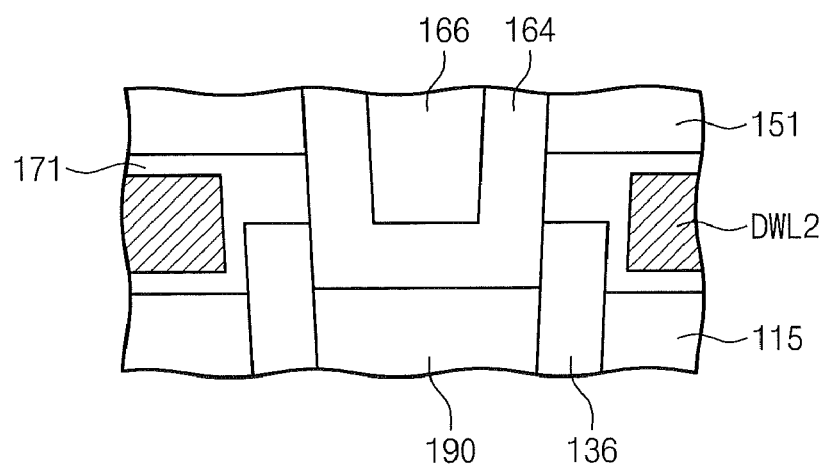
FIG. 30 is another magnified diagram of the part B adjacent to the second dummy conduction pattern described with reference to FIG. 28.

FIG. 30 is another magnified diagram of the part B adjacent to the second dummy conduction pattern DWL2 described referring to FIG. 28. Referring to FIG. 30, the second dummy conduction pattern DWL2 does not include the protrusion part described referring to FIG. 29. The charge storage layer 171 may be thicker on the surface of the upper active pillars 164 than on the surface of the lower active pillars 136 and the interlayer dielectrics 115 and 151.

Figure 31:
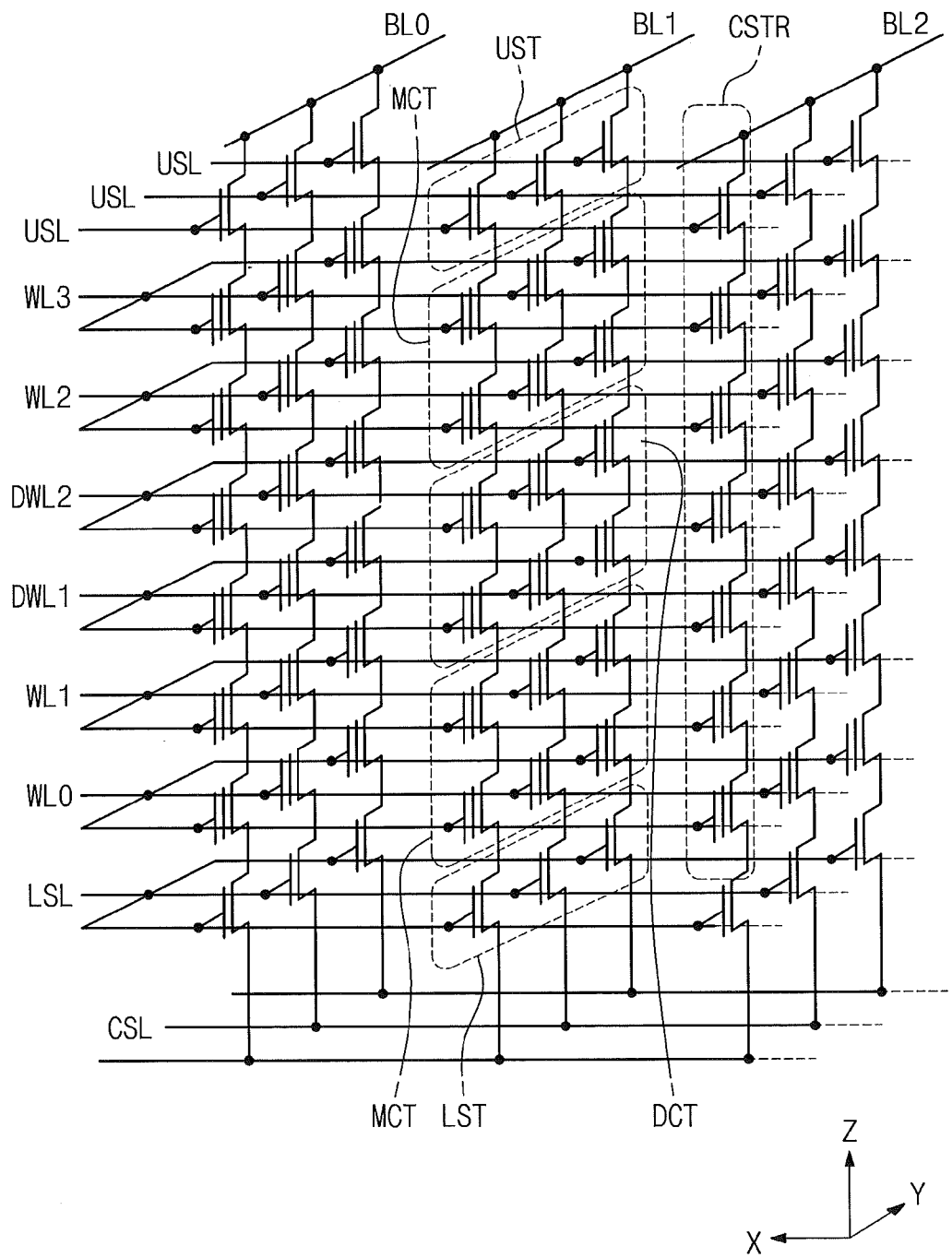
FIG. 31 is a circuit diagram illustrating the three-dimensional nonvolatile memory device according to the eighth embodiment of the inventive concept.

FIG. 31 is a circuit diagram illustrating the three-dimensional nonvolatile memory device according to the embodiment of the inventive concept. In comparison with the circuit diagram illustrated in FIG. 3 according to the first embodiment of the inventive concept, two dummy word lines DWL1 and DWL2 are provided between the lower word lines WL0 and WL1 and the upper word lines WL2 and WL3. The two dummy word lines DWL1 and DWL2 may be used as gate electrodes of the dummy cell transistors DCT.

Voltages applied to the lines connected to one cell string CSTR in the circuit diagram illustrated in FIG. 31 may be determined, e.g., as shown in Table. 3.

TABLE. 3

| | erase | program | read |
|---|---|---|---|
| selected WL | ground voltage (Vss) | program voltage (Vpgm) (e.g., 15-20 V) | read voltage (Vrd) (e.g., 0 V) |
| non-selected WL | ground voltage (Vss) | pass voltage (Vpass) (e.g., 10 V) | non-selection read voltage (Vread) (e.g., 4.5 V) |
| DWL1 | intermediate voltage (VDWL) (e.g., Vss < VDWL < Vers) | intermediate voltage (VDWL) (e.g., Vss < VDWL < Vpgm) | intermediate voltage (VDWL) (e.g., Vss < VDWL ≦ Vread) |
| DWL2 | intermediate voltage (VDWL) (e.g., Vss < VDWL < Vers) | intermediate voltage (VDWL) (e.g., Vss < VDWL < Vpgm) | intermediate voltage (VDWL) (e.g., Vss < VDWL ≦ Vread) |
| USL | floating | power supply voltage (Vcc) | turn-on voltage (e.g., 4.5 V) |
| LSL | floating | ground voltage (Vss) | turn-on voltage (e.g., 4.5 V) |
| CSL | floating | ground voltage (Vss) | ground voltage (Vss) |
| selected BL | floating | ground voltage (Vss) | power supply voltage (Vcc) |
| non-selected BL | floating | power supply voltage (Vcc) | low voltage (e.g., <0.8 V) |
| substrate | erasing voltage (Vers) (e.g., 21 V) | ground voltage (Vss) | ground voltage (Vss) |

Figure 32:
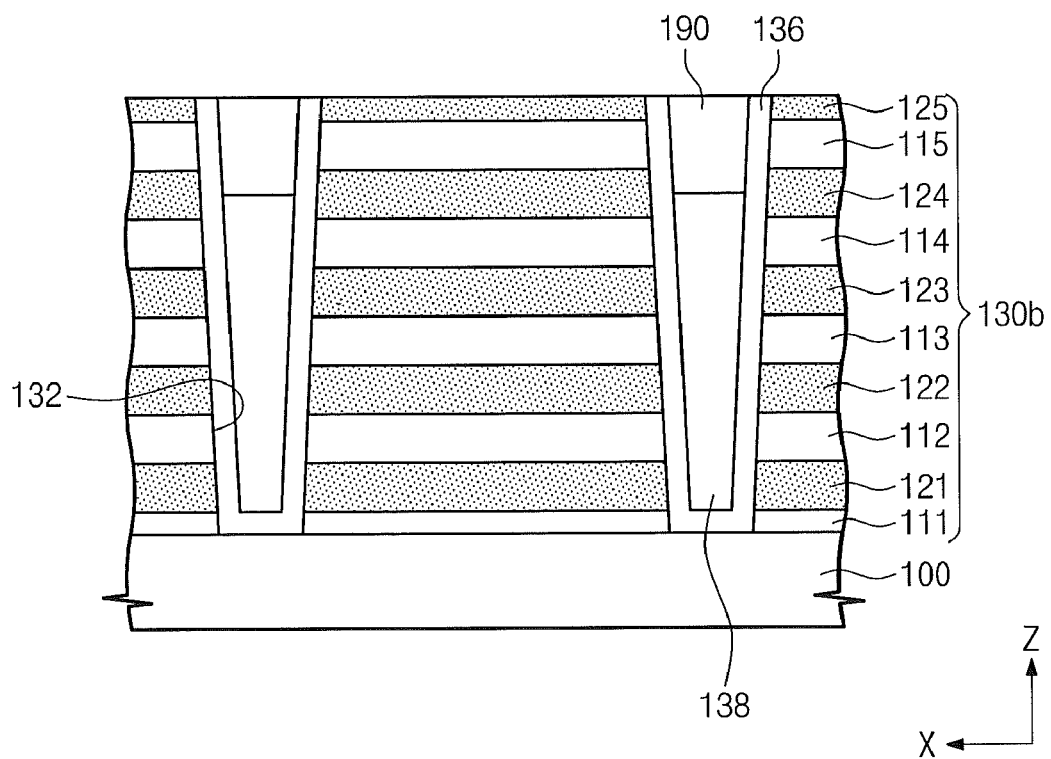
FIGS. 32 to 34 are cross-sectional views corresponding to the line I-I' of FIG. 27 for explaining a method for forming the three-dimensional nonvolatile memory device according to the eighth embodiment of the inventive concept.
Figure 33:
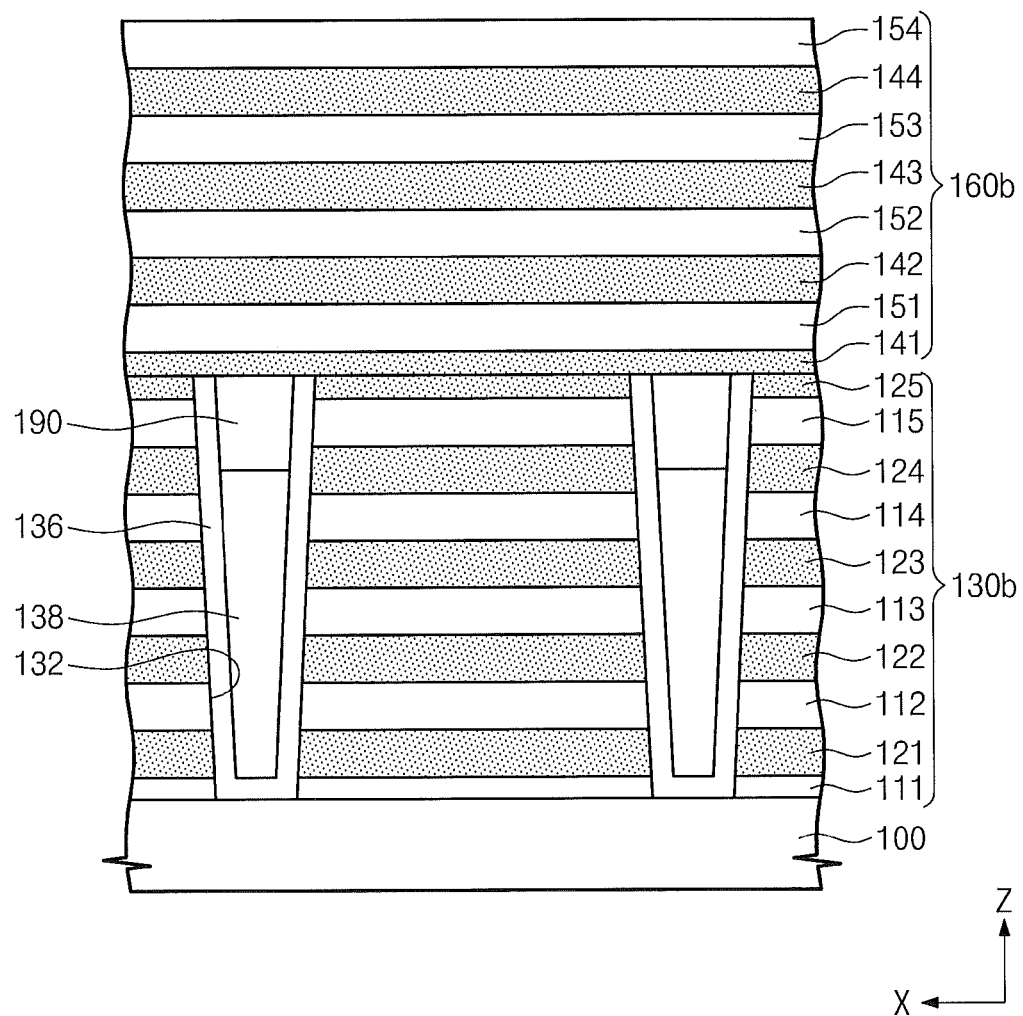
Figure 34:
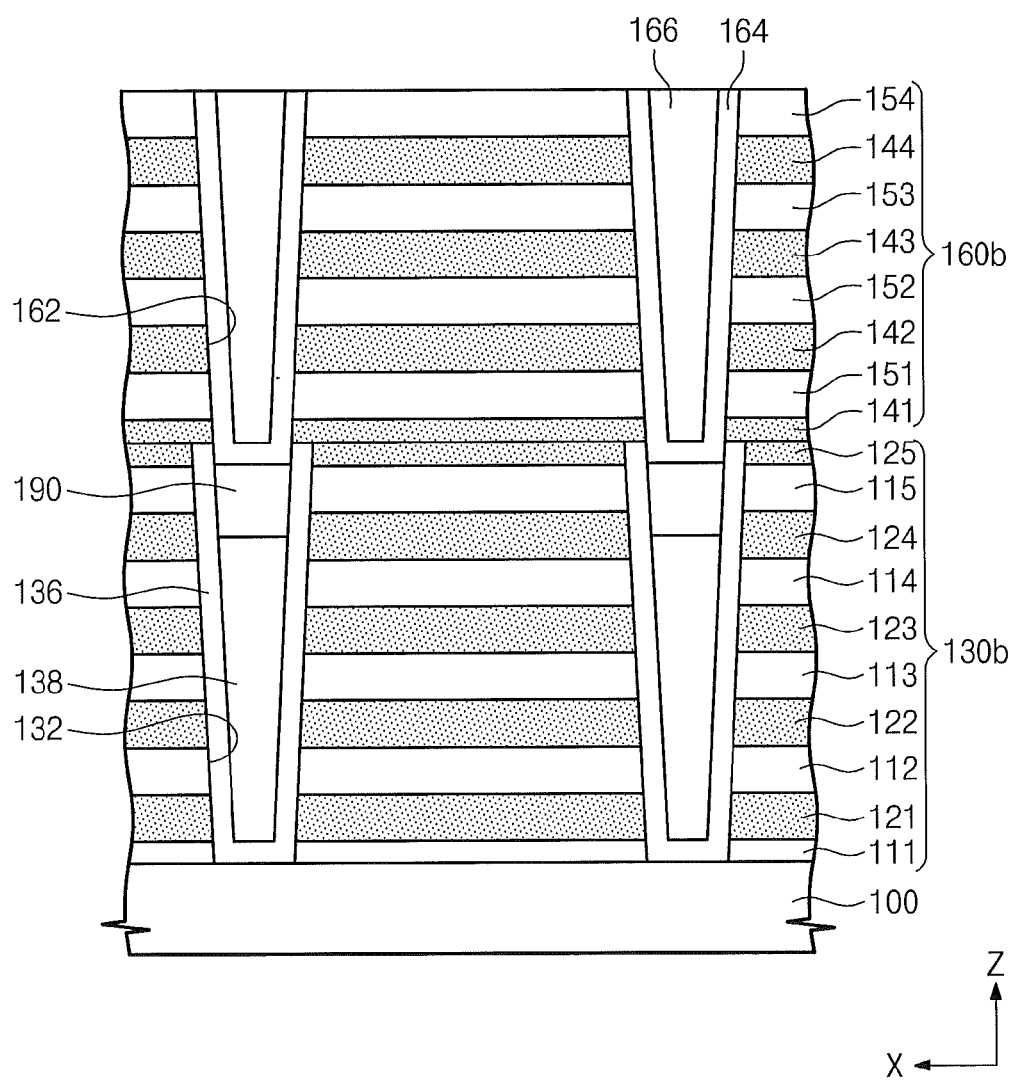

A method for forming the three-dimensional nonvolatile memory device according to the embodiment of the inventive concept will be described. FIGS. 32 to 34 are cross-sectional views along the line I-I' of FIG. 27. Explanations overlapped by the description above-mentioned referring to FIGS. 4 to 14 are omitted; instead, differences will be explained in detail.

Referring to FIG. 32, a lower layer 130B is formed on the substrate 100. The lower layer 130B may be formed by alternately stacking lower interlayer dielectrics and lower sacrifice layers. The lower interlayer dielectrics may include first to fifth lower interlayer dielectrics 111 to 115 from the bottom. The lower sacrifice layers may include first to fifth lower sacrifice layers 121 to 125 from the bottom. The lower interlayer dielectrics 111 to 115 may be formed with, e.g., the silicon oxide layer. The lower sacrifice layers 121 to 125 may be formed with material whose etching selection ratio is higher than that of the lower interlayer dielectrics 111 to 115. For instance, the lower sacrifice layers 121 to 125 may be formed with the silicon nitride layer. The first lower interlayer dielectric 111 may be thinner than the other interlayer dielectrics and formed undermost to contact the substrate 100. The fifth lower sacrifice layer 125 may be formed uppermost. The fifth lower sacrifice layer 125 may be thinner than the first to fourth lower sacrifice layers 121 to 124.

By sequentially etching the lower interlayer dielectrics 111 to 115 and the lower sacrifice layers 121 to 125, the lower active hole 132 which exposes the substrate 100 is formed. The lower active pillars 136 are formed on the bottom and side of the lower active hole 132. The lower active pillars 136 are formed with the semiconductor layer, and the semiconductor layer may be formed with thickness not filling the lower active hole 132. The lower filling insulating layer 138 may be formed and fill the inner space of the lower active hole 132. The lower filling insulating layer 138 may be the silicon oxide layer.

By recessing the lower filling insulating layer 138, the inner side of the upper part of the lower active pillars 136 is exposed. It is preferable that the upper surface of the recessed lower filling insulating layer 138 is higher than the lower surface of the second interlayer dielectric from the top, e.g., the fourth interlayer dielectric 114. More preferably, the upper surface of the recessed lower filling insulating layer 138 is higher than the lower surface of the second sacrifice layer from the top, e.g., the fourth sacrifice layer 124.

The lower active pattern 190 is formed on the recessed lower filling insulating layer 138. The lower active pattern 190 contacts the inner side of the upper part of the lower active pillars 136. Preferably, the lower surface of the lower active pattern 190 has the same height as or is higher than that of the interlayer dielectric 114 immediately under the fourth sacrifice layer 124. More preferably, the lower surface of the lower active pattern 190 has the same height as or is higher than that of the fourth sacrifice layer 124.

Referring to FIG. 33, an upper layer 160b is formed on the lower layer 130b. The upper layer 160b is formed by alternately stacking upper interlayer dielectrics and upper sacrifice layers. The upper interlayer dielectrics may include first to fourth upper interlayer dielectrics 151 to 154 from the bottom. The upper sacrifice layers may include first to fourth upper sacrifice layers 141 to 144. The upper interlayer dielectrics 151 to 154 may be formed with, e.g., the silicon oxide layer. The upper sacrifice layers 141 to 144 may be formed with material which has an etching selectivity with respect to the upper interlayer dielectrics 151 to 154. For instance, the upper sacrifice layers 141 to 144 may be formed with the silicon nitride layer. The first upper sacrifice layer 141 formed undermost may be thinner than the second to fourth upper sacrifice layers 142 to 144. For instance, the sum of thicknesses of the fourth lower sacrifice layer 124 and the first upper sacrifice layer 141 may be equal to the thicknesses of the second to fourth lower sacrifice layers 121 to 124 and the second to fourth upper sacrifice layers 142 to 144.

Referring to FIG. 34, by sequentially etching the upper interlayer dielectrics 151 to 154 and the upper sacrifice layers 141 to 144, the upper active hole 162 which exposes the lower active pattern 190 is formed. Herein, the lower active pattern 190 may be recessed, and thus the inner side of the upper part of the lower active pillars 136 may be exposed. The recessed upper surface of the lower active pattern 190 is higher than the lower surface of the fourth sacrifice layer 124. The side of the upper active hole 162 may slope.

The upper active pillars 164 and the upper filling insulating layer 166 are formed at the upper active hole 162.

The lower active pillars 136, the lower active pattern 190 and the upper active pillars 164 have the same conductive type. That is, the lower active pillars 136, the lower active pattern 190 and the upper active pillars 164 are electrically connected to each other. Since the lower active pattern 190 is recessed, the lower active pattern 190 contacts the inner side of the upper part of the lower active pillars 136 and contacts the lower surface of the upper active pillars 164. The inner side of the upper part of the lower active pillars 136 contacts the outer side of the lower part of the upper active pillars 164. Therefore, the lower active pillars 136, the lower active pattern 190 and the upper active pillars 164 sequentially contact each other, and thus they may be stably connected to each other.

Thereafter, in the method described referring to FIGS. 12 to 14 and 2, the structure illustrated in FIG. 28 may be formed.

In this embodiment, the thickness of the lower active pattern 190 is adjusted for the lower active pattern 190 not to be removed when the upper active hole 162 is formed. For instance, for the lower active pattern 190 not to be recessed and removed, the thickness of the lower active pattern 190 is adjusted. In this embodiment, at least two dummy conduction patterns DWL1 and DWL2 are provided. Accordingly, the thickness of the lower active pattern 190 may be increased corresponding to the two dummy conduction patterns DWL1 and DWL2. In spite of the increase of the thickness of the lower active pattern 190, the thicknesses of the conduction patterns WL0 to WL3 except for the conduction patterns LSL and USL corresponding to the election lines and the dummy conduction patterns DWL1 and DWL2 may be the same, and the thicknesses of the interlayer dielectrics 111 to 115 and 151 to 154 may be the same.

The lower surface of the lower active pattern 190 has the same height as or is higher than that of the first dummy conduction pattern DWL1. The upper surface of the lower active pillars 136 have the same height or are lower than that of the second dummy conduction pattern DWL2. Accordingly, the channel may be stably formed at the lower active pillars 136, the upper active pillars 164 and the lower active pattern 190.

The three-dimensional nonvolatile memory device described referring to FIG. 28 according to the eighth embodiment of the inventive concept may be formed in another method as above-described referring to FIGS. 15 and 16.

Figure 35:
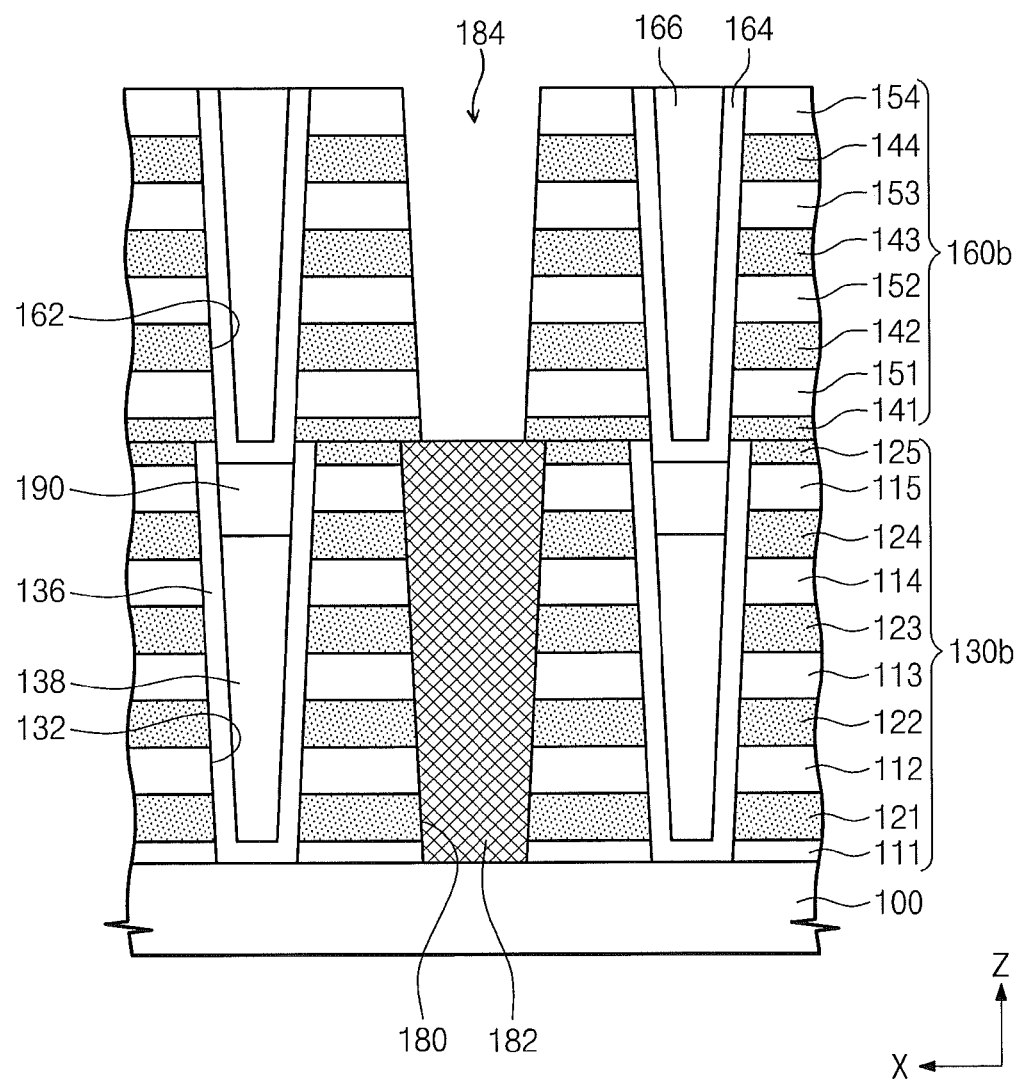
FIG. 35 is a cross-sectional view corresponding to the line I-I' of FIG. 27 for describing another method for forming the three-dimensional nonvolatile memory device according to the eighth embodiment of the inventive concept.

Referring to FIG. 35, by patterning the lower layer 130B between the lower active pillars 136 neighboring each other in the first direction illustrated in FIG. 32, a preliminary lower opening 180 which exposes the substrate 100 is formed. The preliminary lower opening 180 is filled with, e.g., a sacrifice pattern 182. The sacrifice pattern 182 may include the same material as the lower sacrifice layers 121 to 125. On the lower layer 130b, the upper layer 160b is formed in the method described referring to FIG. 33. In the method described referring to FIG. 34, the upper active pillars 164 and the upper filling insulating layer 166 are formed. Referring to FIG. 35 again, by patterning the upper layer 160B between the upper active pillars 164 neighboring each other in the first direction, a preliminary upper opening 184 which overlaps the preliminary lower opening 180 and exposes the sacrifice pattern 182 is formed.

Referring to FIG. 28 again, the upper sacrifice layers 141 to 144 and the sacrifice pattern 182 exposed by the preliminary upper opening 184 are selectively removed. Thereafter, the lower sacrifice layers 121 and 125 are exposed and selectively removed. Therefore, the upper and lower surfaces of the interlayer dielectrics 111 to 115 and 151 to 154 and the outer surfaces of the active pillars 136 and 164 are exposed. The information storage layer 171 and the conduction layer (not shown) are formed to fill the empty space between the interlayer dielectrics 111 to 115 and 151 to 154, the preliminary upper opening 184 and the preliminary lower opening 180. The conduction layer (not shown) and the information storage layer 171 on the fourth upper interlayer dielectric 154 are removed by the planarization process. And, the conduction layer (not shown), the information storage layer 171 and a part of the upper interlayer dielectrics 151 to 154 in the preliminary upper and lower openings 184 and 180 are removed. Thereafter, a process similar to that described referring to FIG. 28 may be performed.

Embodiment 9

Figure 36:
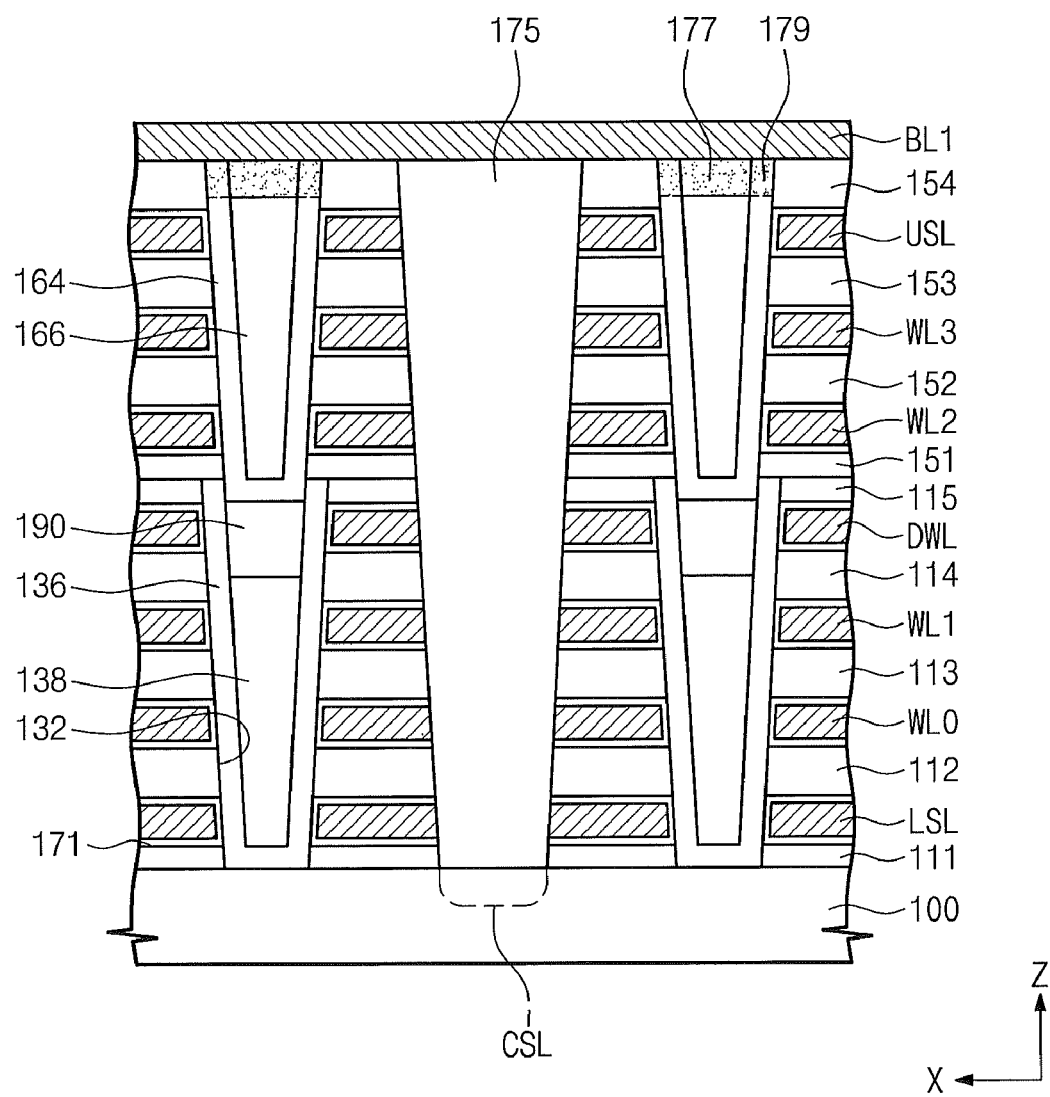
FIG. 36 is a cross-sectional view of a three-dimensional nonvolatile memory device according to a ninth embodiment of the inventive concept corresponding to the line I-I' of FIG. 1.

FIG. 36 is a cross-sectional view of a three-dimensional nonvolatile memory device according to a ninth embodiment of the inventive concept. The cross section corresponds to the line I-I' of FIG. 1. Explanations overlapped by the description above-mentioned referring to FIG. 28 are omitted; instead, differences will be explained in detail. The operating method may be similar to that of the first embodiment.

Referring to FIGS. 1 and 36, the three-dimensional nonvolatile memory device according to the ninth embodiment of the inventive concept includes the lower active pattern 190 interposed between the lower filling insulating layer 138 and the upper active pillars 164. The dummy conduction pattern DWL is provided adjacently to the contact region of the lower active pillars 136 and the upper active pillars 164.

The interlayer dielectric immediately on the dummy conduction pattern DWL includes a first sub interlayer dielectric 115 and a second sub interlayer dielectric 151 on the first sub interlayer dielectric 115. The interface between the first sub interlayer dielectric 115 and the second sub interlayer dielectric 151 may be discontinuous. The upper surface of the dummy conduction pattern DWL, the upper surface of the first sub interlayer dielectric 115 and the lower surface of the second sub interlayer dielectric 151 may be coplanar. The interlayer dielectric (the combination of the first and second sub interlayer dielectrics) immediately on the dummy conduction pattern DWL may cover both of the upper part of the lower active pillars 136 and the lower part of the upper active pillars 164.

Preferably, the lower surface of the lower active pattern 190 may have the same height as or be higher than that of the lower interlayer dielectric 114 immediately under the dummy conduction pattern DWL. The upper surface of the lower active pillars 136 may have the same height as or be lower than that of the interlayer dielectric (the combination of the first and second sub interlayer dielectrics) immediately on the dummy conduction pattern DWL. More preferably, the lower surface of the lower active pattern 190 may have the same height as or be higher than that of the dummy conduction pattern DWL. The upper surface of the lower active pattern 136 may have the same height as or be lower than the lower surface of the interlayer dielectric (the combination of the first and second sub interlayer dielectrics) right on the dummy conduction pattern DWL.

Figure 37:
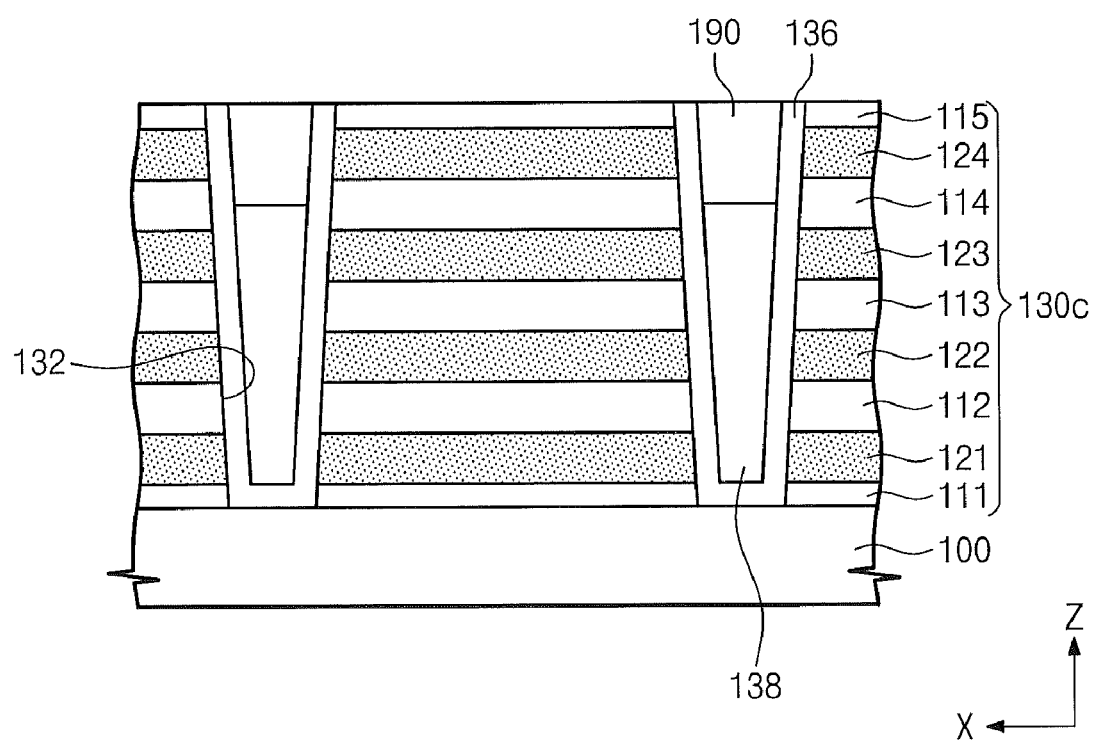
FIGS. 37 to 39 are cross-sectional views corresponding to the line I-I' of FIG. 1 for explaining a method for forming the three-dimensional nonvolatile memory device according to the ninth embodiment of the inventive concept.
Figure 38:
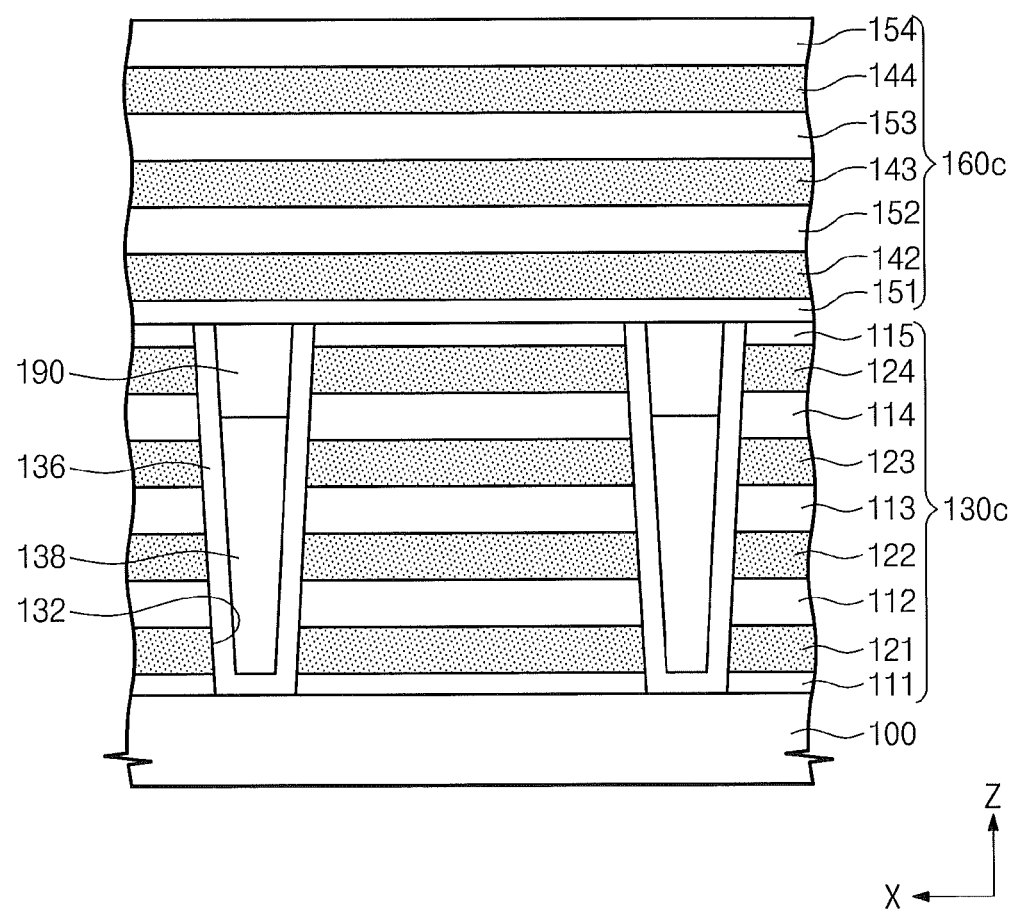
Figure 39:
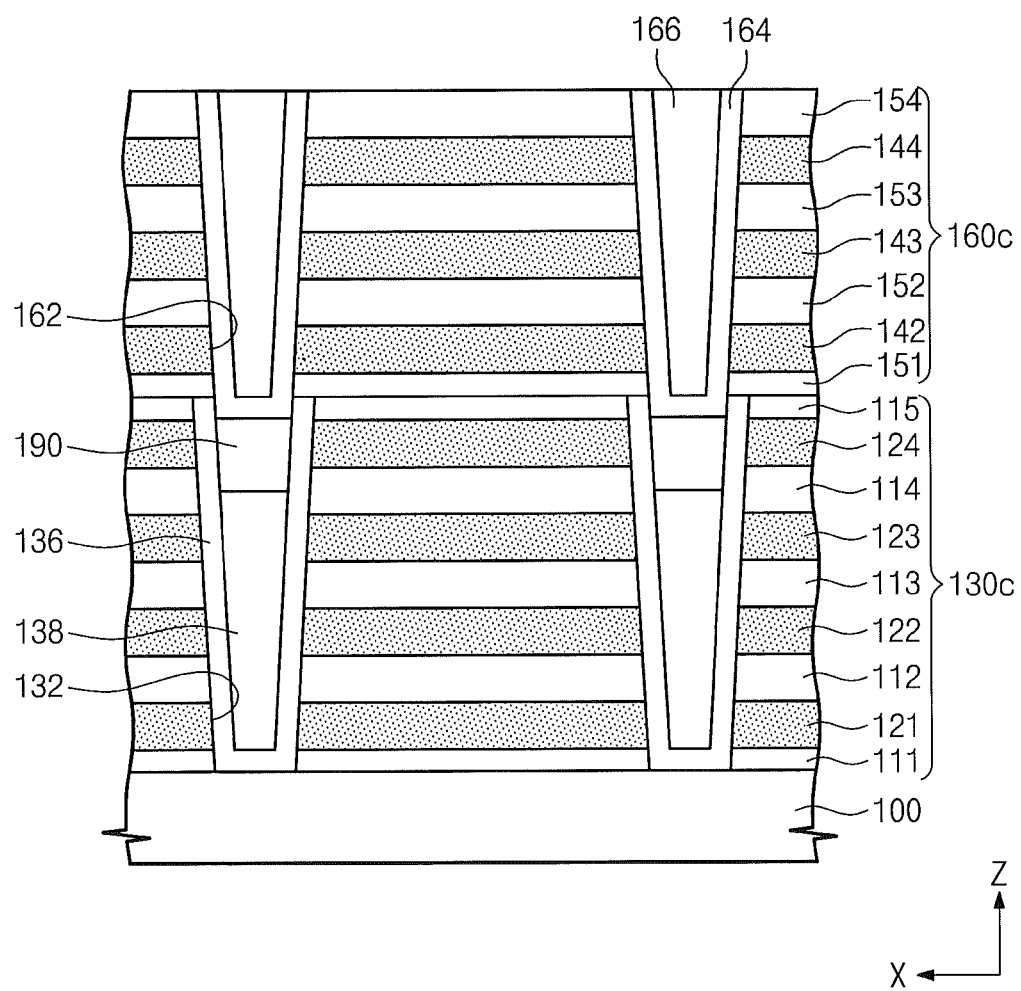

A method for forming the three-dimensional nonvolatile memory device according to the embodiment of the inventive concept will be described. FIGS. 37 to 39 are cross-sectional views along the line I-I' of FIG. 1. Explanations overlapped by the description above-mentioned referring to FIGS. 32 to 34 are omitted; instead, differences will be explained in detail.

Referring to FIG. 37, a lower layer 130C is formed on the substrate 100. The lower layer 130C may be formed by alternately stacking lower interlayer dielectrics and lower sacrifice layers. The lower interlayer dielectrics may include first to fifth lower interlayer dielectrics 111 to 115 from the bottom. The lower sacrifice layers may include first to fourth lower sacrifice layers 121 to 124 from the bottom. The lower interlayer dielectrics 111 to 115 may be formed with, e.g., the silicon oxide layer. The lower sacrifice layers 121 to 124 may be formed with material which has an etching selectivity with respect to the lower interlayer dielectrics 111 to 115. For instance, the lower sacrifice layers 121 to 124 may be formed with the silicon nitride layer. The first lower interlayer dielectric 111 may be thinner than the other interlayer dielectrics and formed undermost to contact the substrate 100. The fifth lower interlayer dielectric 115 may be formed uppermost. The fifth lower interlayer dielectric 115 may be thinner than the first to fourth lower interlayer dielectrics 111 to 114.

By sequentially etching the lower interlayer dielectrics 111 to 115 and the lower sacrifice layers 121 to 124, the lower active hole 132 which exposes the substrate 100 is formed. The lower active pillars 136 are formed on the bottom and side of the lower active hole 132. The lower active pillars 136 are formed with the semiconductor layer, and the semiconductor layer may be formed with thickness not filling the lower active hole 132. The lower filling insulating layer 138 may be formed and fill the inner space of the lower active hole 132. The lower filling insulating layer 138 may be the silicon oxide layer.

By recessing the lower filling insulating layer 138, the inner side of the upper portion of the lower active pillars 136 is exposed. It is preferable that the upper surface of the recessed lower filling insulating layer 138 is higher than the lower surface of the second interlayer dielectric from the top, e.g., the fourth interlayer dielectric 114. More preferably, the upper surface of the recessed lower filling insulating layer 138 is higher than the lower surface of the uppermost sacrifice layer from the top, e.g., the fourth sacrifice layer 124.

The lower active pattern 190 is formed on the recessed lower filling insulating layer 138. The lower active pattern 190 contacts the inner side of the upper part of the lower active pillars 136. Preferably, the lower surface of the lower active pattern 190 has the same height as or is higher than that of the interlayer dielectric 114 immediately under the fourth sacrifice layer 124. More preferably, the lower surface of the lower active pattern 190 has the same height as or is higher than that of the fourth sacrifice layer 124.

Referring to FIG. 38, an upper layer 160C is formed on the lower layer 130c. The upper layer 160c is formed by alternately stacking upper interlayer dielectrics and upper sacrifice layers. The upper interlayer dielectrics may include first to fourth upper interlayer dielectrics 151 to 154 from the bottom. The upper sacrifice layers may include first to third upper sacrifice layers 141 to 143. The upper interlayer dielectrics 151 to 154 may be formed with, e.g., the silicon oxide layer. The upper sacrifice layers 141 to 143 may be formed with material which has an etching selectivity with respect to the upper interlayer dielectrics 151 to 154. For instance, the upper sacrifice layers 141 to 143 may be formed with the silicon nitride layer. The first upper interlayer dielectric 151 formed undermost may be thinner than the second to fourth upper interlayer dielectrics 152 to 154. For instance, the sum of thicknesses of the fifth lower interlayer dielectric 115 and the first upper interlayer dielectric 151 may be equal to the thicknesses of the second to fourth lower interlayer dielectrics 112 to 114 and the second to fourth upper interlayer dielectrics 152 to 154.

Referring to FIG. 39, by sequentially etching the upper interlayer dielectrics 151 to 154 and the upper sacrifice layers 141 to 143, the upper active hole 162 which exposes the lower active pattern 190 is formed. Herein, the lower active pattern 190 may be recessed, and thus the inner side of the upper portion of the lower active pillars 136 may be exposed. The recessed upper surface of the lower active pattern 190 may be higher than the lower surface of the fourth lower sacrifice layer 124.

The upper active pillars 164 and the upper filling insulating layer 166 are formed at the upper active hole 162. The bottom surface of the upper active pillars 164 has the same height as or is lower than the upper surface of the first upper interlayer dielectric 151.

Thereafter, in the method described referring to FIGS. 12 to 14 and 2, the structure illustrated in FIG. 36 may be formed.

In this embodiment, the thickness of the lower active pattern 190 is adjusted for the lower active pattern 190 not to be removed when the upper active hole 162 is formed. For instance, for the lower active pattern 190 not to be recessed and removed, the thickness of the lower active pattern 190 is adjusted. In this embodiment, the thickness of the lower active pattern 190 is adjusted based on the dummy conduction pattern DWL and the interlayer dielectrics (combination of 114, 115 and 151) adjacent to the dummy conduction pattern DWL. By extending the lower active pattern 190 to the interlayer dielectrics (combination of 114, 115 and 151) adjacent to the dummy conduction pattern DWL, in spite of the increase of the thickness of the lower active pattern 190, the thicknesses of the conduction patterns WL0 to WL3 except for the conduction patterns corresponding to the selection lines and the dummy patterns DWL1 and DWL2 may be the same, and the thicknesses of the interlayer dielectrics (112 to 114, combination of 115 and 151, 152 to 154) except for the first lower interlayer dielectric 111 may be the same.

Embodiment 10

Figure 40:
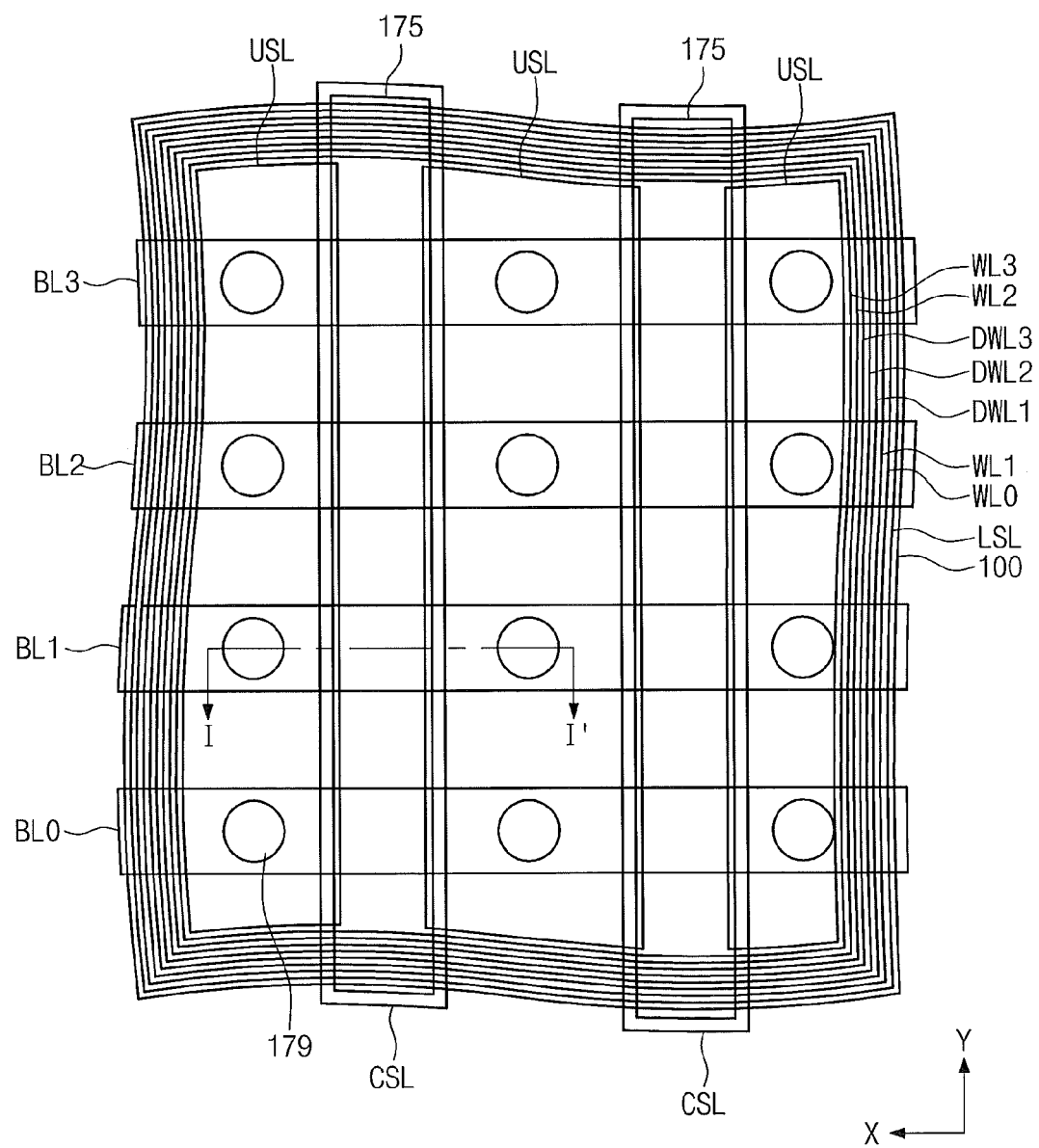
FIG. 40 is a planar diagram illustrating a three-dimensional nonvolatile memory device according to a tenth embodiment of the inventive concept.
Figure 41:
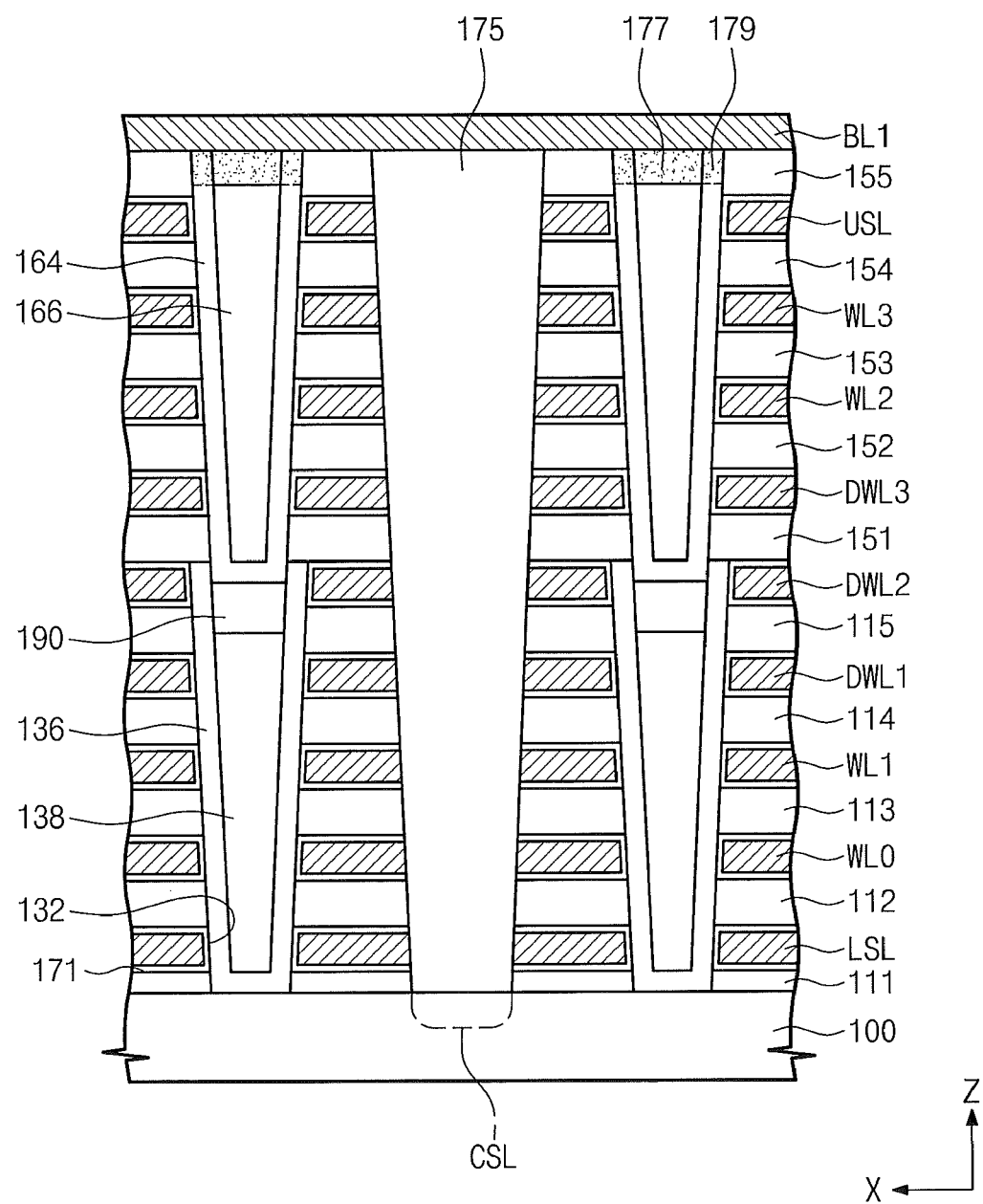
FIG. 41 is a cross-sectional view along the line I-I' of FIG. 40.

FIG. 40 is a planar diagram illustrating a three-dimensional nonvolatile memory device according to a tenth embodiment of the inventive concept. FIG. 41 is a cross-sectional view along the line I-I' of FIG. 40. Explanations overlapped by the description above-mentioned referring to FIG. 28 are omitted; instead, differences will be explained in detail.

Referring to FIGS. 40 and 41, the three-dimensional nonvolatile memory device according to the tenth embodiment of the inventive concept includes the lower active pattern 190 interposed between the lower filling insulating layer 138 and the upper active pillars 164. The lower active pattern 190 contacts the inner side of the upper portion of the lower active pillars 136 and contacts the lower surface of the upper active pillars 164. The lower active pattern 190 helps the upper active pillars 164 and the lower active pillars 136 be electrically connected to each other.

Dummy conduction patterns DWL1 to DWL3 are provided to the part where the lower active pillars 136 and the upper active pillars 164 contact each other. The dummy conduction patterns DWL1 to DWL3 are defined as first to third dummy conduction patterns DWL1 to DWL3 from the bottom.

Preferably, the lower surface of the lower active pattern 190 has the same height as or is higher than the upper surface of the first dummy conduction pattern DWL1. The upper surface of the lower active pillars 136 has the same height as or is lower than the lower surface of the third dummy conduction pattern DWL3.

Except that the number of the dummy conduction patterns is 3, the operating method may be similar to that of the eighth embodiment.

Figure 42:
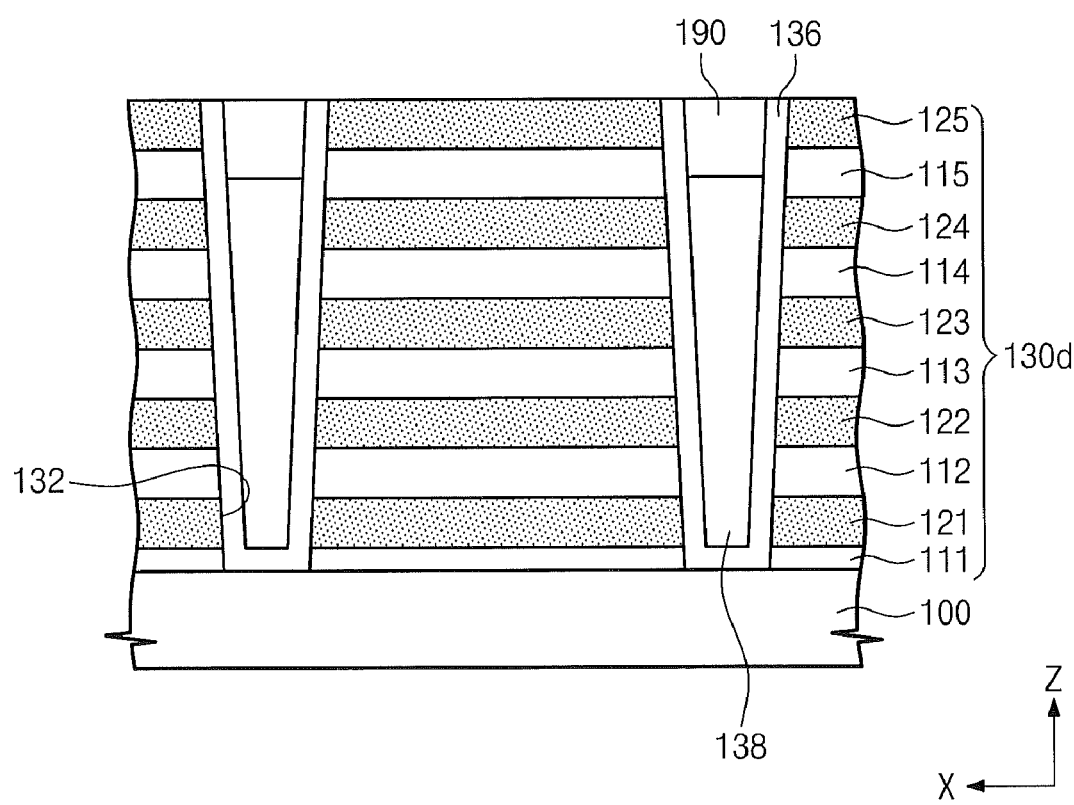
FIGS. 42 to 44 are cross-sectional views corresponding to the line I-I' of FIG. 40 for explaining a method for forming the three-dimensional nonvolatile memory device according to the tenth embodiment of the inventive concept.
Figure 43:
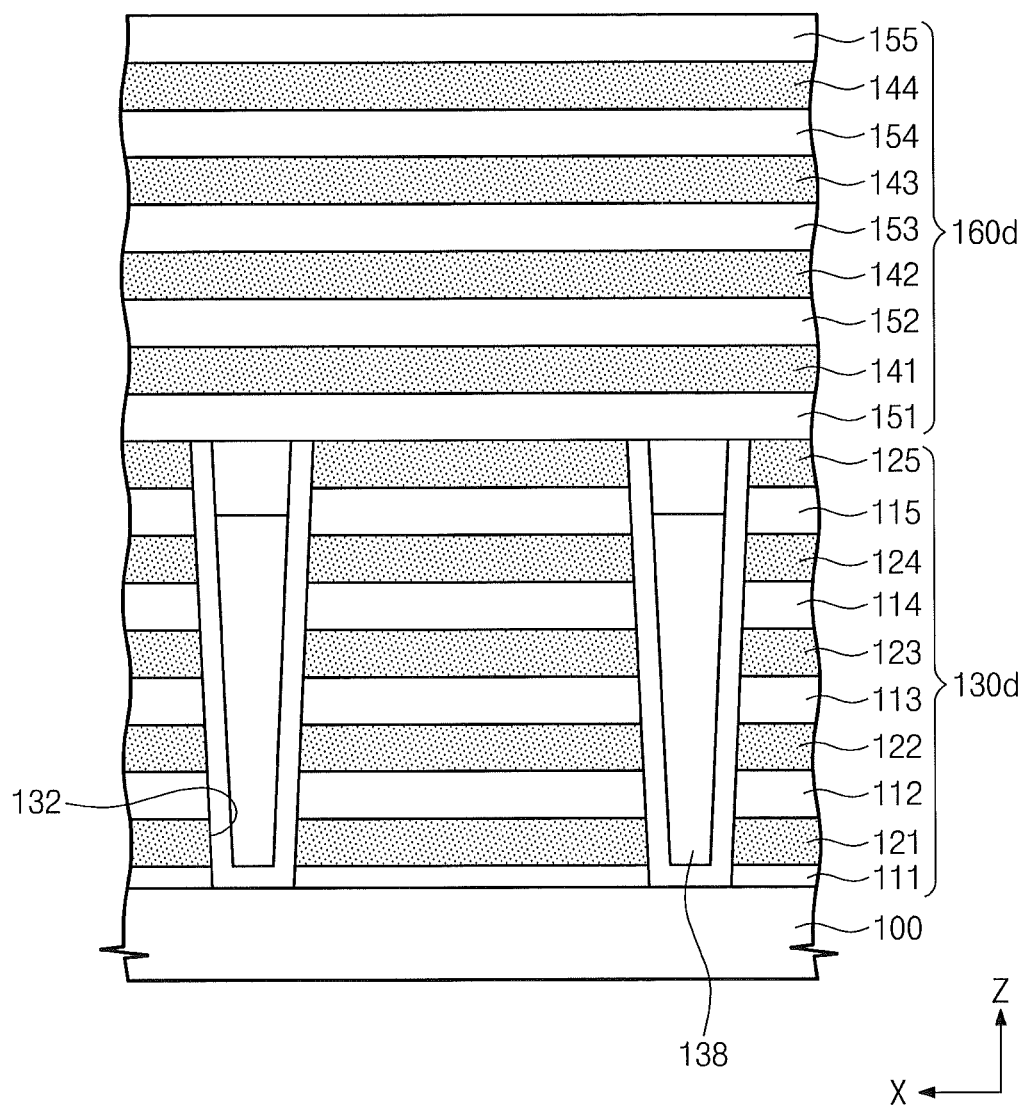
Figure 44:
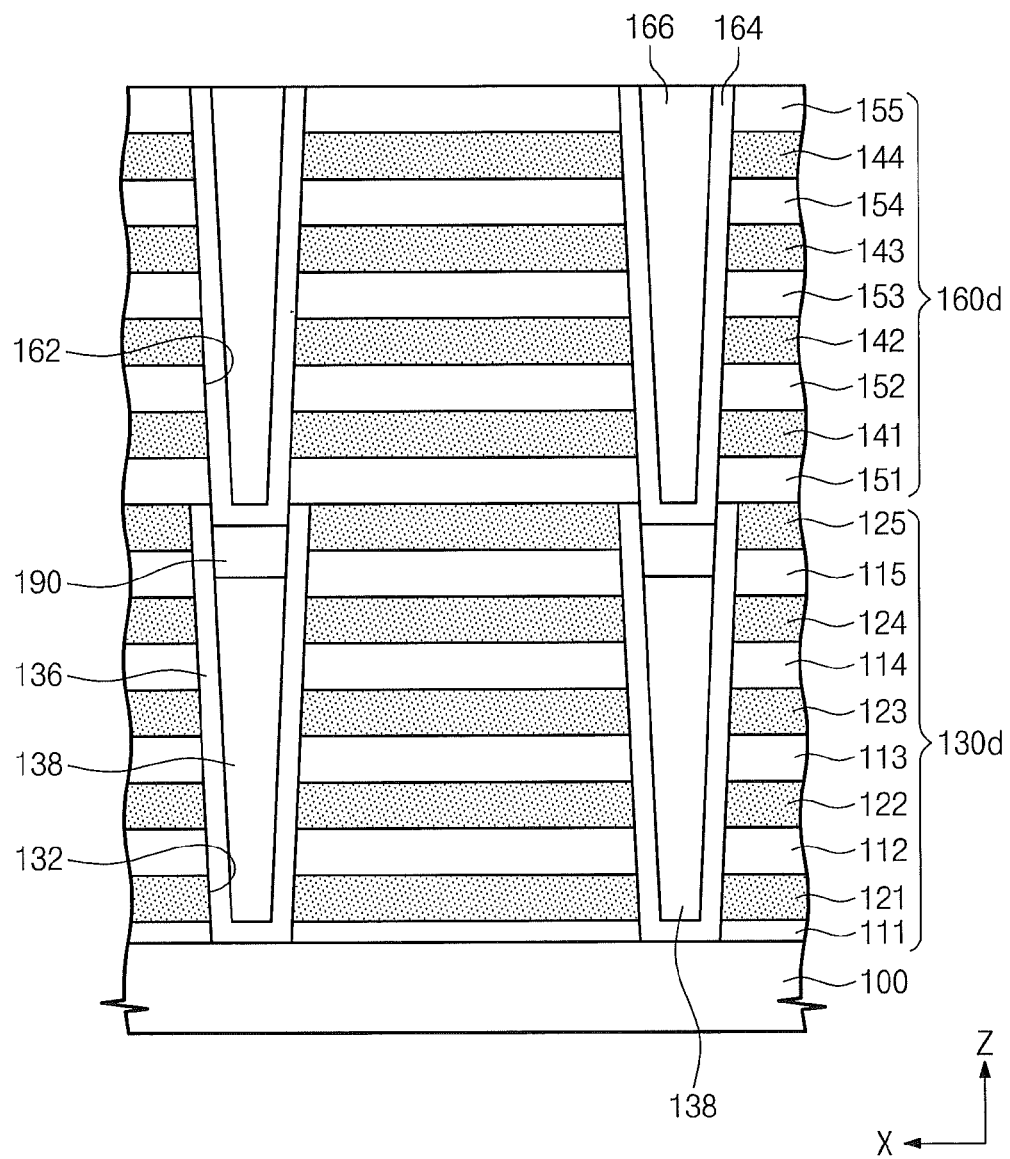

A method for forming the three-dimensional nonvolatile memory device according to the embodiment of the inventive concept will be described. FIGS. 42 to 44 are cross-sectional views along the line I-I' of FIG. 40. Explanations overlapped by the description above-mentioned referring to FIGS. 4 to 14 are omitted; instead, differences will be explained in detail.

Referring to FIG. 42, a lower layer 130d is formed on the substrate 100. The lower layer 130d may be formed by alternately stacking lower interlayer dielectrics and lower sacrifice layers. The lower interlayer dielectrics may include first to fifth lower interlayer dielectrics 111 to 115 from the bottom. The lower sacrifice layers may include first to fifth lower sacrifice layers 121 to 125 from the bottom. The lower interlayer dielectrics 111 to 115 may be formed with, e.g., the silicon oxide layer. The lower sacrifice layers 121 to 125 may be formed with material which has an etching selectivity with respect to the lower interlayer dielectrics 111 to 115. For instance, the lower sacrifice layers 121 to 125 may be formed with the silicon nitride layer. The first lower interlayer dielectric 111 may be thinner than the other interlayer dielectrics and formed undermost to contact the substrate 100. The fifth lower sacrifice layer 125 may be formed uppermost.

By sequentially etching the lower interlayer dielectrics 111 to 115 and the lower sacrifice layers 121 to 125, the lower active hole 132 which exposes the substrate 100 is formed. The lower active pillars 136 are formed on the bottom and side of the lower active hole 132. The lower active pillars 136 are formed with the semiconductor layer, and the semiconductor layer may be formed with thickness not filling the lower active hole 132. The lower filling insulating layer 138 may be formed and fill the inner space of the lower active hole 132. The lower filling insulating layer 138 may be the silicon oxide layer.

By recessing the lower filling insulating layer 138, the inner side of the upper portion of the lower active pillars 136 is exposed. It is preferable that the upper surface of the recessed lower filling insulating layer 138 is higher than that of the second lower sacrifice layer from the top, e.g., the fourth lower sacrifice layer 124.

The lower active pattern 190 is formed on the recessed lower filling insulating layer 138. The lower active pattern 190 contacts the inner side of the upper portion of the lower active pillars 136. Preferably, the recessed lower filling insulating layer 138 is formed so that its upper surface is higher than that of the second lower sacrifice layer from the top, e.g., the fourth lower sacrifice layer 124.

Referring to FIG. 43, an upper layer 160d is formed on the lower layer 130d. The upper layer 160d is formed by alternately stacking upper interlayer dielectrics and upper sacrifice layers. The upper interlayer dielectrics may include first to fifth upper interlayer dielectrics 151 to 155 from the bottom. The upper sacrifice layers may include first to fourth upper sacrifice layers 141 to 144. The upper interlayer dielectrics 151 to 155 may be formed with, e.g., the silicon oxide layer. The upper sacrifice layers 141 to 144 may be formed with material which has an etching selectivity with respect to the upper interlayer dielectrics 151 to 155. For instance, the upper sacrifice layers 141 to 144 may be formed with the silicon nitride layer. The first upper interlayer dielectric 151 may be formed undermost.

Referring to FIG. 44, by sequentially etching the upper interlayer dielectrics 151 to 155 and the upper sacrifice layers 141 to 144, the upper active hole 162 which exposes the lower active pattern 190 is formed. Herein, the lower active pattern 190 may be recessed, and thus the inner side of the lower active pillars 136 may be exposed. The recessed upper surface of the lower active pattern 190 is higher than the lower surface of the fifth lower sacrifice layer 125.

The upper active pillars 164 and the upper filling insulating layer 166 are formed at the upper active hole 162.

Thereafter, in the method described referring to FIGS. 12 to 14 and 2, the structure illustrated in FIG. 41 may be formed.

Embodiment 11

Figure 45:
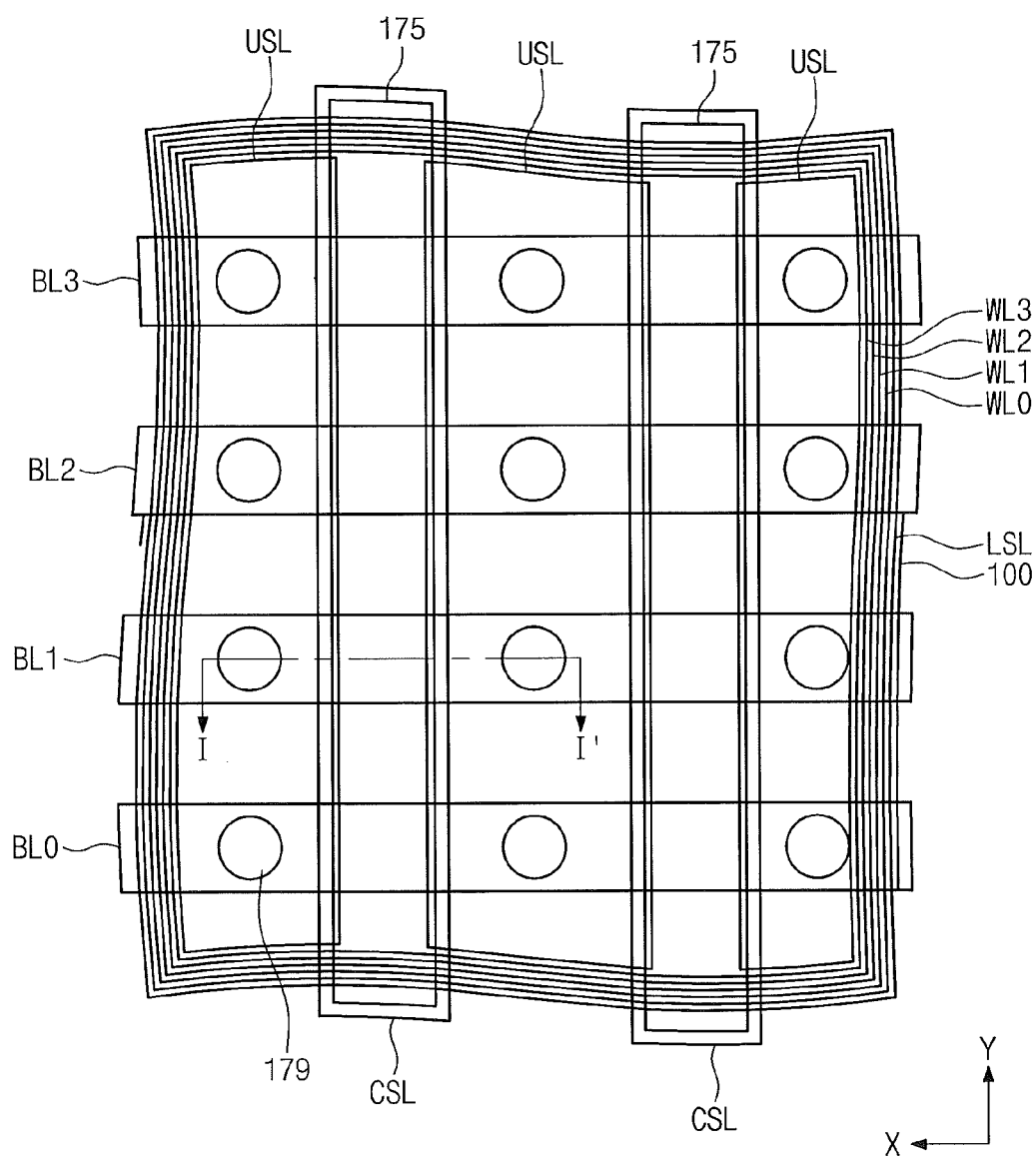
FIG. 45 is a planar diagram illustrating a three-dimensional nonvolatile memory device according to an eleventh embodiment of the inventive concept.
Figure 46:
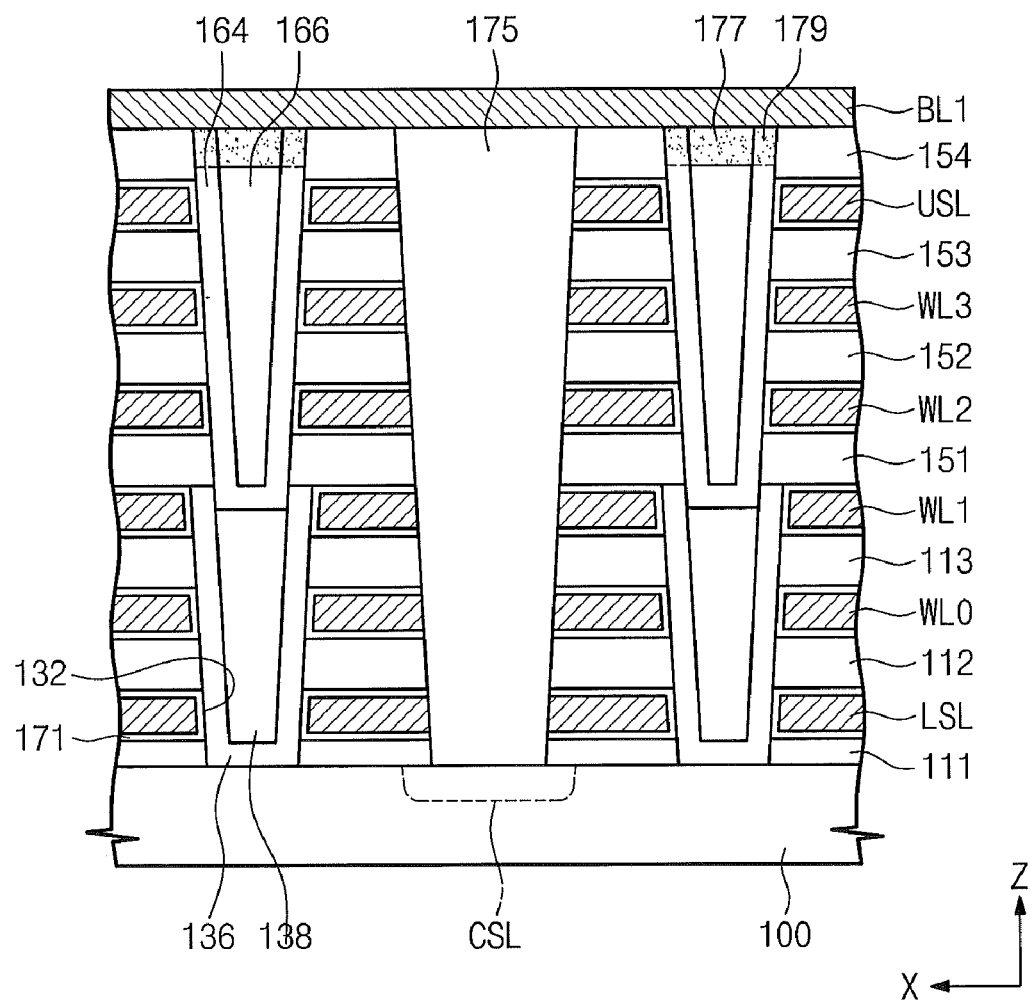
FIG. 46 is a cross-sectional view along the line I-I' of FIG. 45.

FIG. 45 is a planar diagram illustrating a three-dimensional nonvolatile memory device according to an eleventh embodiment of the inventive concept. FIG. 46 is a cross-sectional view along the line I-I' of FIG. 45. Explanations overlapped by the description above-mentioned referring to FIG. 2 are omitted; instead, differences will be explained in detail.

Referring to FIGS. 45 and 46, first to third lower interlayer dielectrics 111 to 113 and lower conduction patterns LSL, WL0 and WL1 are alternately stacked on the substrate 100. The undermost lower interlayer dielectric may be thinner than the other lower interlayer dielectrics. The lower active pillars 136 penetrate the lower interlayer dielectrics 111 to 113 and the lower conduction patterns LSL, WL0 and WL1 and contact the substrate 100. Upper interlayer dielectrics 151 to 154 and upper conduction patterns WL2, WL3 and USL are alternately stacked on the uppermost lower interlayer dielectric 113. The upper active pillars 164 penetrate the upper interlayer dielectrics 151 to 154 and the upper conduction patterns WL2, WL3 and USL and contact the lower active pillars 136. The side of the lower part of the upper active pillars 164 contacts the inner side of the upper part of the lower active pillars 136.

Unlike the above-described embodiments, the dummy conduction pattern is not provided. Preferably, the lower surface of the upper active pillars 164 may be higher than the upper surface of the lower interlayer dielectric 113 immediately under the uppermost lower conduction pattern WL1. More preferably, the lower surface of the upper active pillars 164 may be higher than that of the uppermost lower conduction pattern WL1. The upper surface of the lower active pillars 136 and the upper surface of the information storage layer 171 which covers the uppermost lower conduction pattern WL1 may be coplanar. The upper surface of the lower active pillars 136 and the lower surface of the undermost upper interlayer dielectric 151 may be coplanar.

Meanwhile, the thicknesses of the upper and lower conduction patterns LSL, WL0 to WL3 and USL may be the same. Accordingly, at the edge of the cell region, the process of forming the stepped contact region by patterning the conduction patterns LSL, WL0 to WL3 and USL may be performed more easily.

Figure 47:
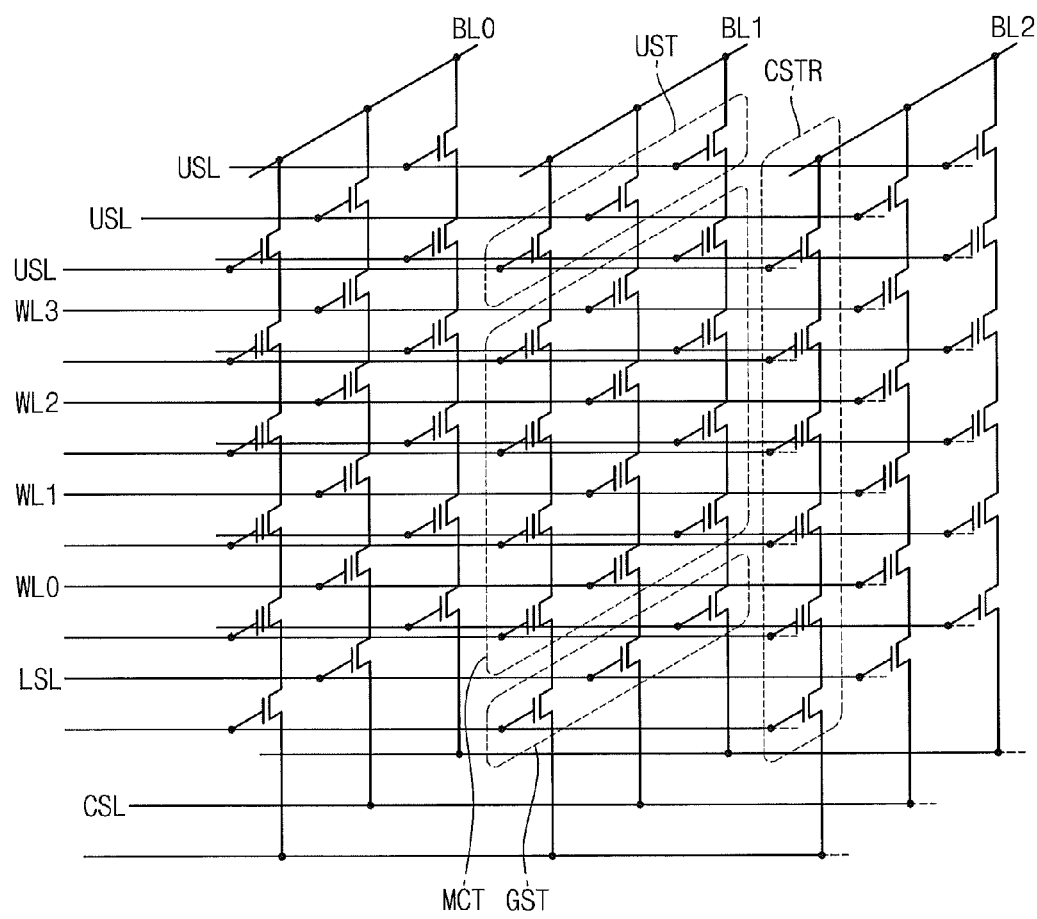
FIG. 47 is a circuit diagram illustrating the three-dimensional nonvolatile memory device according to the eleventh embodiment of the inventive concept.

A method for operating the three-dimensional nonvolatile memory device according to the embodiment of the inventive concept may be similar to that of the three-dimensional nonvolatile memory device corresponding to a circuit diagram illustrated in FIG. 47.

In detail, referring to FIG. 47, the three-dimensional nonvolatile memory device according to the embodiment of the inventive concept may include a common source line CSL, a plurality of bit lines BL0 to BL2 and a plurality of cell strings CSTR arranged between the common source line CSL and the bit lines BL0 to BL2. The bit lines BL0 to BL2 are arranged two-dimensionally and to each of which the cell strings CSTR are connected in parallel.

Each of the cell strings CSTR may include a lower selection transistor LST connected to the common source line CSL, an upper selection transistor UST connected to the bit lines BL0 to BL2, and a plurality of memory cell transistors MCT between the selection transistors LST and UST. The lower selection transistor LST, the memory cell transistors MCT and the upper selection transistor UST may be connected in series. The lower selection line LSL, the word lines WL0 to WL3, and the upper selection lines USL may be respectively used as gate electrodes of the lower selection transistor LST, the memory cell transistors MCT and the upper selection transistors UST.

Voltages applied to lines connected to one cell string CSTR in the circuit illustrated in FIG. 47 may be determined, e.g., as expressed in Table. 4.

TABLE 4

| | erase | program | read |
| --- | --- | --- | --- |
| selected WL | ground voltage (Vss) | program voltage (Vpgm) (e.g., 15-20 V) | read voltage (Vrd) (e.g., 0 V) |
| non-selected WL | ground voltage (Vss) | pass voltage (Vpass) (e.g., 10 V) | non-selection read voltage (Vread) (e.g., 4.5 V) |
| USL | floating | power supply voltage (Vcc) | turn-on voltage (e.g., 4.5 V) |
| LSL | floating | ground voltage (Vss) | turn-on voltage (e.g., 4.5 V) |
| CSL | floating | ground voltage (Vss) | ground voltage (Vss) |
| selected BL | floating | ground voltage (Vss) | power supply voltage (Vcc) |
| non-selected BL | floating | power supply voltage (Vcc) | low voltage (e.g., <0.8 V) |
| substrate | erasing voltage (Vers) (e.g., 21 V) | ground voltage (Vss) | ground voltage (Vss) |

Figure 48:
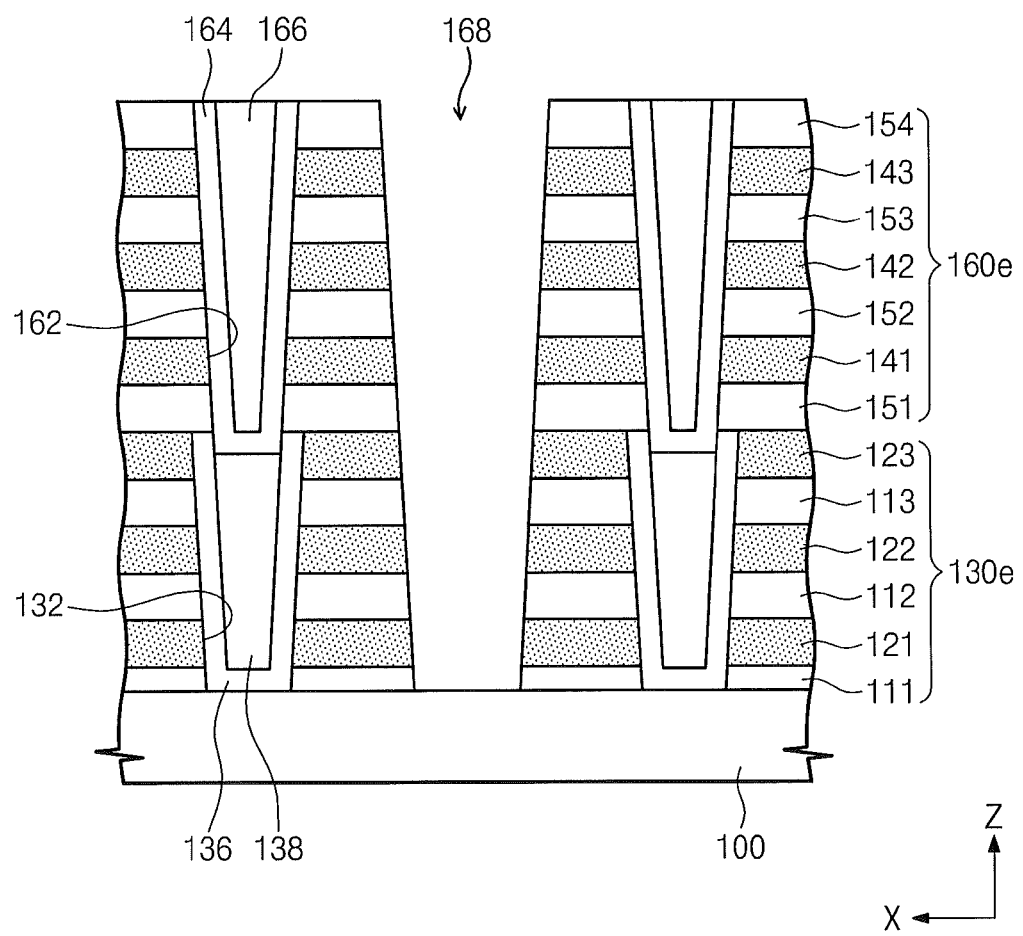
FIG. 48 is a cross-sectional view corresponding to the line I-I' of FIG. 45 for explaining a method for forming the three-dimensional nonvolatile memory device according to the eleventh embodiment of the inventive concept.

A method for forming the three-dimensional nonvolatile memory device according to the embodiment of the inventive concept will be described. FIG. 48 is a cross-sectional view along the line I-I' of FIG. 45. Explanations overlapped by the description above-mentioned referring to FIGS. 4 to 14 are omitted; instead, differences will be explained in detail.

Referring to FIG. 48, a lower layer 130e is formed on the substrate 100. The lower layer 130e may be formed by alternately stacking lower interlayer dielectrics and lower sacrifice layers. The lower interlayer dielectrics may include first to third lower interlayer dielectrics 111 to 113 from the bottom. The lower sacrifice layers may include first to third lower sacrifice layers 121 to 123 from the bottom. The lower interlayer dielectrics 111 to 113 may be formed with, e.g., the silicon oxide layer. The lower sacrifice layers 121 to 123 may be formed with material which has an etching selectivity with respect to the lower interlayer dielectrics 111 to 113. For instance, the lower sacrifice layers 121 to 123 may be formed with the silicon nitride layer. The first lower interlayer dielectric 111 may be thinner than the other interlayer dielectrics and formed undermost to contact the substrate 100. The third lower sacrifice layer 123 may be formed uppermost.

By sequentially etching the lower interlayer dielectrics 111 to 113 and the lower sacrifice layers 121 to 123, the lower active hole 132 which exposes the substrate 100 is formed. The lower active pillars 136 are formed on the bottom and side of the lower active hole 132. The lower active pillars 136 are formed with the semiconductor layer, and the semiconductor layer may be formed with thickness not filling the lower active hole 132. The lower filling insulating layer 138 may be formed and fill the inner space of the lower active hole 132. The lower filling insulating layer 138 may be the silicon oxide layer.

An upper layer 160e is formed on the lower layer 130eE. The upper layer 160e is formed by alternately stacking upper interlayer dielectrics and upper sacrifice layers. The upper interlayer dielectrics may include first to fourth upper interlayer dielectrics 151 to 154 from the bottom. The upper sacrifice layers may include first to third upper sacrifice layers 141 to 143. The upper interlayer dielectrics 151 to 154 may be formed with, e.g., the silicon oxide layer. The upper sacrifice layers 141 to 143 may be formed with material which has an etching selectivity with respect to the upper interlayer dielectrics 151 to 154. For instance, the upper sacrifice layers 141 to 143 may be formed with the silicon nitride layer.

By sequentially etching the upper interlayer dielectrics 151 to 154 and the upper sacrifice layers 141 to 143, the upper active hole 162 which exposes the lower filling insulating layer 138 is formed. Herein, the lower filling insulating layer 138 may be recessed, and thus the inner side of the lower active pillars 136 may be exposed. The recessed upper surface of the lower filling insulating layer 138 is higher than the lower surface of the third sacrifice layer 123.

The upper active pillars 164 and the upper filling insulating layer 166 are formed at the upper active hole 162. Between the active pillars 136 and 164 adjacent to each other in the first direction, the first electrode separation opening 168 which exposes the substrate 100 is formed by sequentially etching the upper layer 160e and the lower layer 130e.

Thereafter, in the method described referring to FIGS. 12 to 14 and 2, the structure illustrated in FIG. 46 may be formed.

Embodiment 12

Figure 49:
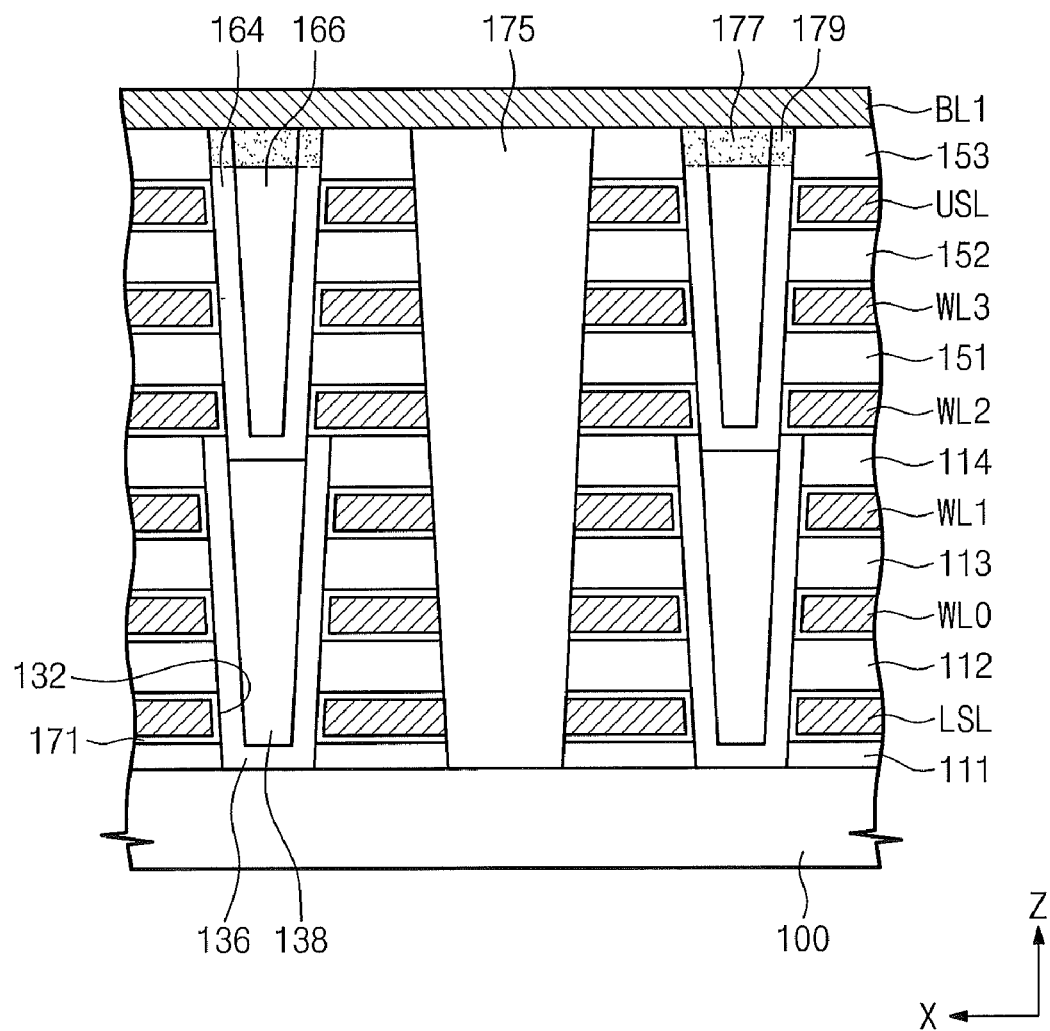
FIG. 49 is a cross-sectional view of a three-dimensional nonvolatile memory device according to a twelfth embodiment of the inventive concept corresponding to the line I-I' of FIG. 45.

FIG. 49 is a cross-sectional view of a three-dimensional nonvolatile memory device according to a twelfth embodiment of the inventive concept. The cross section corresponds to the line I-I' of FIG. 45. Explanations overlapped by the description above-mentioned referring to FIG. 46 are omitted; instead, differences will be explained in detail. The operating method may be similar to that of the eleventh embodiment.

Referring to FIG. 49, the lower surface of the upper active pillars 164 of the three-dimensional nonvolatile memory device according to the twelfth embodiment of the inventive concept may be lower than the upper surface of the uppermost lower interlayer dielectric 114 and higher than the lower surface of the uppermost lower interlayer dielectric 114. The upper surface of the lower active pillars 136 and the upper surface of the uppermost interlayer dielectric 114 may be coplanar.

Figure 50:
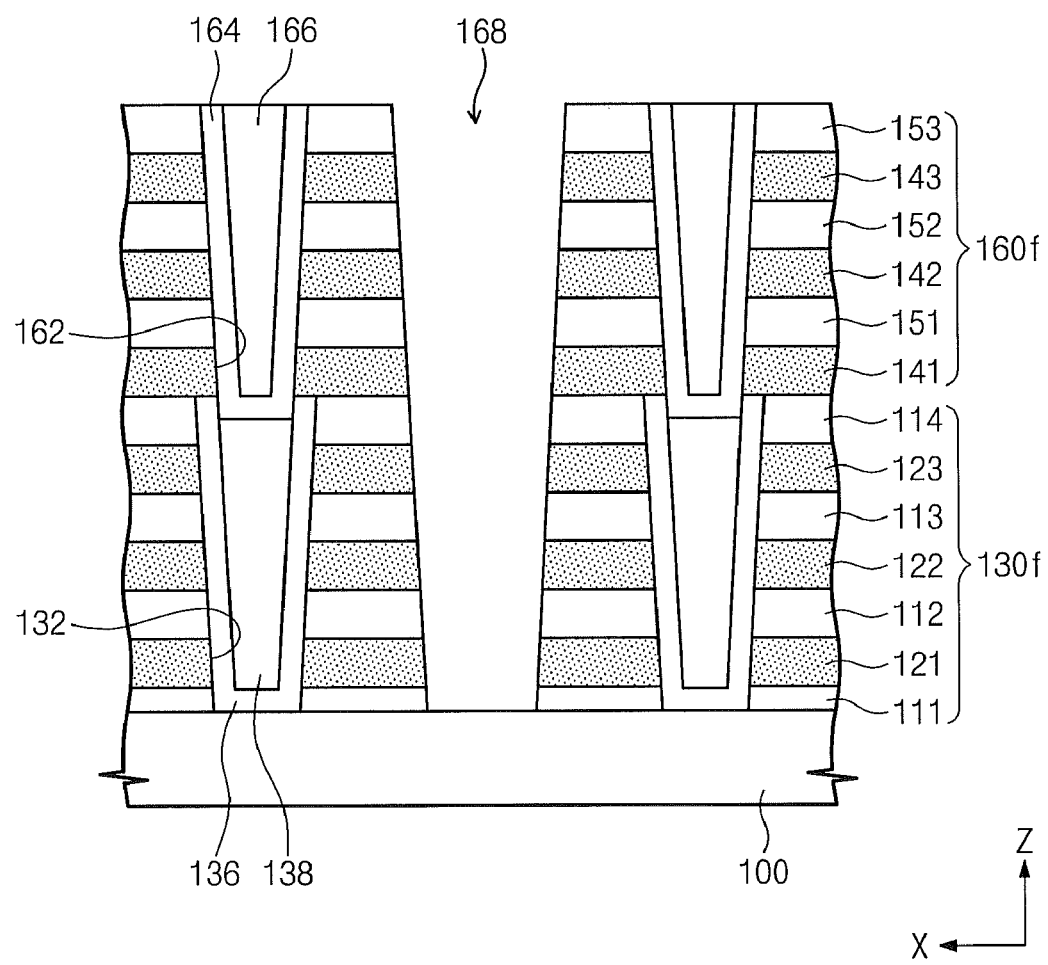
FIG. 50 is a cross-sectional view corresponding to the line I-I' of FIG. 45 for explaining a method for forming the three-dimensional nonvolatile memory device according to the twelfth embodiment of the inventive concept.

A method for forming the three-dimensional nonvolatile memory device according to the embodiment of the inventive concept will be described. FIG. 50 is a cross-sectional view along the line I-I' of FIG. 45. Explanations overlapped by the description above-mentioned referring to FIGS. 4 to 14 are omitted; instead, differences will be explained in detail.

Referring to FIGS. 45 and 50, a lower layer 130f is formed on the substrate 100. The lower layer 130F may be formed by alternately stacking lower interlayer dielectrics and lower sacrifice layers. The lower interlayer dielectrics may include first to fourth lower interlayer dielectrics 111 to 114 from the bottom. The lower sacrifice layers may include first to third lower sacrifice layers 121 to 123 from the bottom. The lower interlayer dielectrics 111 to 114 may be formed with, e.g., the silicon oxide layer. The lower sacrifice layers 121 to 123 may be formed with material which has an etching selectivity with respect to the lower interlayer dielectrics 111 to 114. For instance, the lower sacrifice layers 121 to 123 may be formed with the silicon nitride layer. The first lower interlayer dielectric 111 may be thinner than the other interlayer dielectrics and formed undermost to contact the substrate 100. The fourth lower interlayer dielectric 114 may be formed uppermost.

By sequentially etching the lower interlayer dielectrics 111 to 114 and the lower sacrifice layers 121 to 123, the lower active hole 132 which exposes the substrate 100 is formed. The lower active pillars 136 are formed on the bottom and side of the lower active hole 132. The lower active pillars 136 are formed with the semiconductor layer, and the semiconductor layer may be formed with thickness not filling the lower active hole 132. The lower filling insulating layer 138 may be formed and fill the inner space of the lower active hole 132. The lower filling insulating layer 138 may be the silicon oxide layer.

An upper layer 160f is formed on the lower layer 130f. The upper layer 160F is formed by alternately stacking upper interlayer dielectrics and upper sacrifice layers. The upper interlayer dielectrics may include first to third upper interlayer dielectrics 151 to 153 from the bottom. The upper sacrifice layers may include first to third upper sacrifice layers 141 to 143. The first upper sacrifice layer 141 may contact the uppermost lower interlayer dielectric, e.g., the fourth lower interlayer dielectric 114. The upper interlayer dielectrics 151 to 153 may be formed with, e.g., the silicon oxide layer. The upper sacrifice layers 141 to 143 may be formed with material which has an etching selectivity with respect to the upper interlayer dielectrics 151 to 153. For instance, the upper sacrifice layers 141 to 143 may be formed with the silicon nitride layer.

By sequentially etching the upper interlayer dielectrics 151 to 153 and the upper sacrifice layers 141 to 143, the upper active hole 162 which exposes the lower filling insulating layer 138 is formed. Herein, the lower filling insulating layer 138 may be recessed, and thus the inner side of the lower active pillars 136 may be exposed. The recessed upper surface of the lower filling insulating layer 138 is higher than that of the third sacrifice layer 123.

The upper active pillars 164 and the upper filling insulating layer 166 are formed at the upper active hole 162. Between the active pillars 136 and 164 adjacent to each other in the first direction, the first electrode separation opening 168 which exposes the substrate 100 is formed by sequentially etching the upper layer 160f and the lower layer 130f.

Thereafter, in the method described referring to FIGS. 12 to 14 and 2, the structure illustrated in FIG. 49 may be formed.

Embodiment 13

Figure 51:
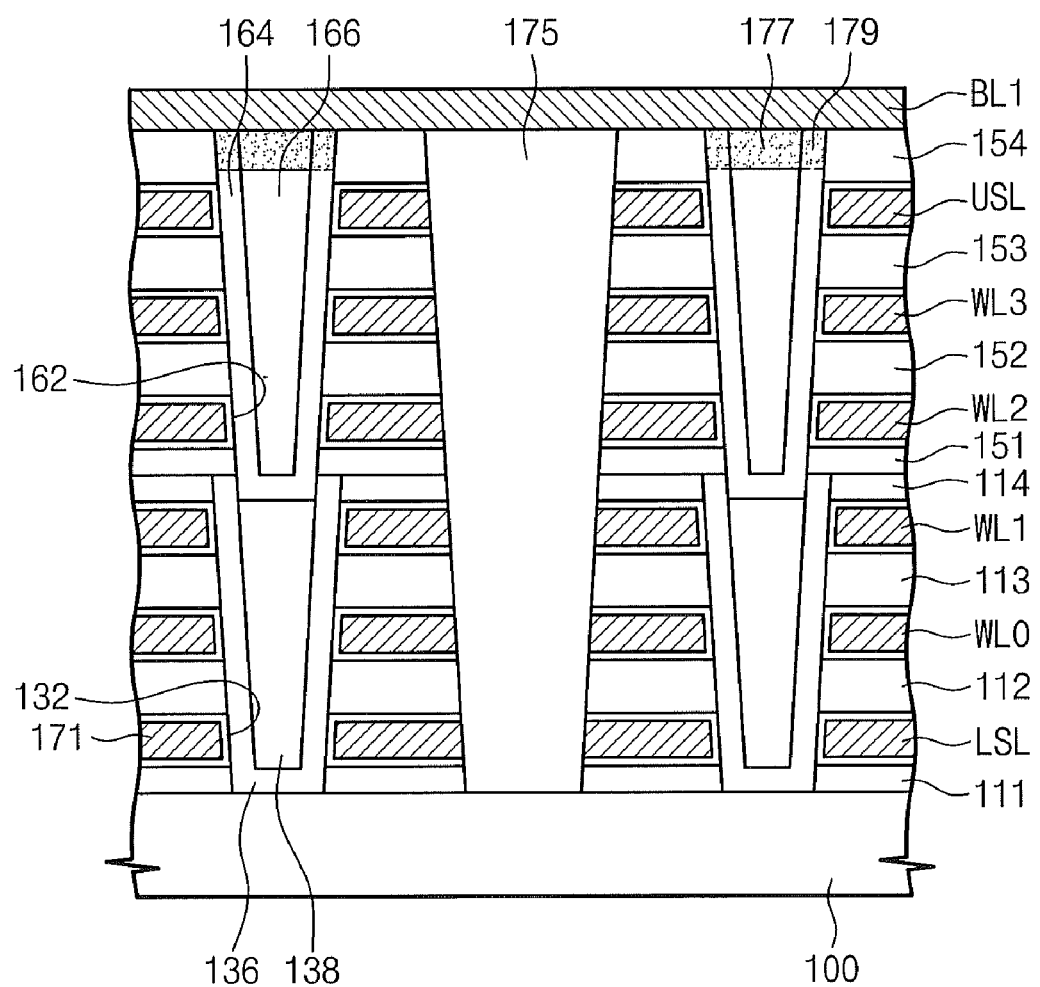
FIG. 51 is a cross-sectional view of a three-dimensional nonvolatile memory device according to a thirteenth embodiment of the inventive concept corresponding to the line I-I' of FIG. 45.

FIG. 51 is a cross-sectional view of a three-dimensional nonvolatile memory device according to a thirteenth embodiment of the inventive concept. The cross section corresponds to the line I-I' of FIG. 45. Explanations overlapped by the description above-mentioned referring to FIG. 46 are omitted; instead, differences will be explained in detail. The operating method may be similar to that of the eleventh embodiment.

Referring to FIG. 51, the height of the upper surface of the lower active pillars 136 is between the uppermost lower conduction pattern WL1 and the undermost upper conduction pattern WL2. The height of the lower surface of the upper active pillars 164 is between the uppermost lower conduction pattern WL1 and the undermost upper conduction pattern WL2.

The upper surface of the lower active pillars 136, the uppermost lower interlayer dielectric 114 and the undermost upper interlayer dielectric 151 may be coplanar.

Figure 52:
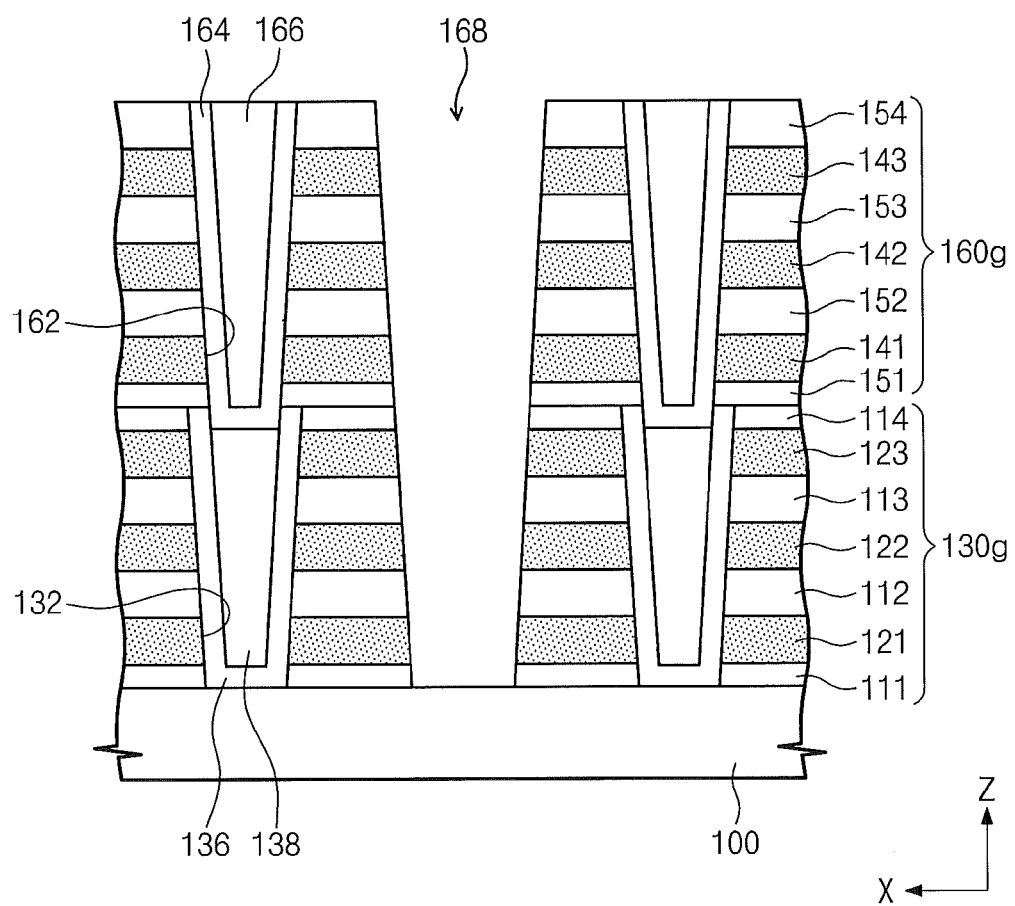
FIG. 52 is a cross-sectional view corresponding to the line I-I' of FIG. 45 for explaining a method for forming the three-dimensional nonvolatile memory device according to the thirteenth embodiment of the inventive concept.

A method for forming the three-dimensional nonvolatile memory device according to the embodiment of the inventive concept will be described. FIG. 52 is a cross-sectional view along the line I-I' of FIG. 45. Explanations overlapped by the description above-mentioned referring to FIGS. 4 to 14 are omitted; instead, differences will be explained in detail.

Referring to FIG. 52, a lower layer 130g is formed on the substrate 100. The lower layer 130g may be formed by alternately stacking lower interlayer dielectrics and lower sacrifice layers. The lower interlayer dielectrics may include first to fourth lower interlayer dielectrics 111 to 114 from the bottom. The lower sacrifice layers may include first to third lower sacrifice layers 121 to 123 from the bottom. The lower interlayer dielectrics 111 to 114 may be formed with, e.g., the silicon oxide layer. The lower sacrifice layers 121 to 123 may be formed with material which has an etching selectivity with respect to the lower interlayer dielectrics 111 to 114. For instance, the lower sacrifice layers 121 to 123 may be formed with the silicon nitride layer. The first lower interlayer dielectric 111 may be thinner than the other interlayer dielectrics and formed undermost to contact the substrate 100. The fourth lower interlayer dielectric 114 may be formed uppermost.

By sequentially etching the lower interlayer dielectrics 111 to 114 and the lower sacrifice layers 121 to 123, the lower active hole 132 which exposes the substrate 100 is formed. The lower active pillars 136 are formed on the bottom and side of the lower active hole 132. The lower active pillars 136 are formed with the semiconductor layer, and the semiconductor layer may be formed with thickness not filling the lower active hole 132. The lower filling insulating layer 138 may be formed and fill the inner space of the lower active hole 132. The lower filling insulating layer 138 may be the silicon oxide layer.

An upper layer 160g is formed on the lower layer 130g. The upper layer 160g is formed by alternately stacking upper interlayer dielectrics and upper sacrifice layers. The upper interlayer dielectrics may include first to fourth upper interlayer dielectrics 151 to 154 from the bottom. The upper sacrifice layers may include first to third upper sacrifice layers 141 to 143. The first upper sacrifice layer 141 may contact the uppermost lower interlayer dielectric, e.g., the fourth lower interlayer dielectric 114. The upper interlayer dielectrics 151 to 154 may be formed with, e.g., the silicon oxide layer. The upper sacrifice layers 141 to 143 may be formed with material which has an etching selectivity with respect to the upper interlayer dielectrics 151 to 154. For instance, the upper sacrifice layers 141 to 143 may be formed with the silicon nitride layer.

The sum of thicknesses of the fourth lower interlayer dielectric 114 and the first upper interlayer dielectric 151 may be equal to the thicknesses of the other interlayer dielectrics.

By sequentially etching the upper interlayer dielectrics 151 to 154 and the upper sacrifice layers 141 to 143, the upper active hole 162 which exposes the lower filling insulating layer 138 is formed. Herein, the lower filling insulating layer 138 may be recessed, and thus the inner side of the lower active pillars 136 may be exposed. The recessed upper surface of the lower filling insulating layer 138 is higher than that of the third sacrifice layer 123.

The upper active pillars 164 and the upper filling insulating layer 166 are formed at the upper active hole 162. Between the active pillars 136 and 164 adjacent to each other in the first direction, the first electrode separation opening 168 which exposes the substrate 100 is formed by sequentially etching the upper layer 160G and the lower layer 130G.

Thereafter, in the method described referring to FIGS. 12 to 14 and 2, the structure illustrated in FIG. 51 may be formed.

Embodiment 14

Figure 53:
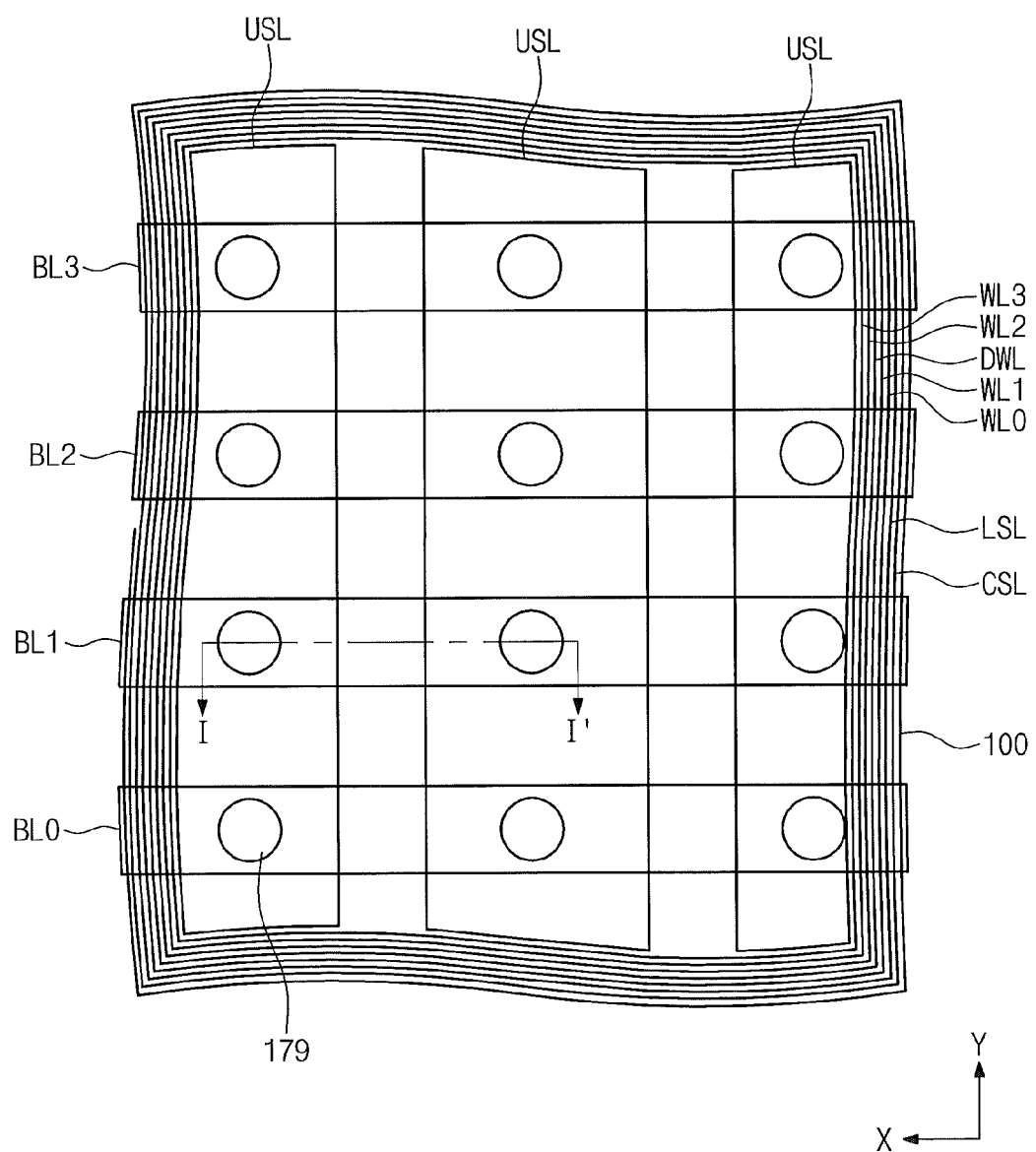
FIG. 53 is a planar diagram illustrating a three-dimensional nonvolatile memory device according to a fourteenth embodiment of the inventive concept.
Figure 54:
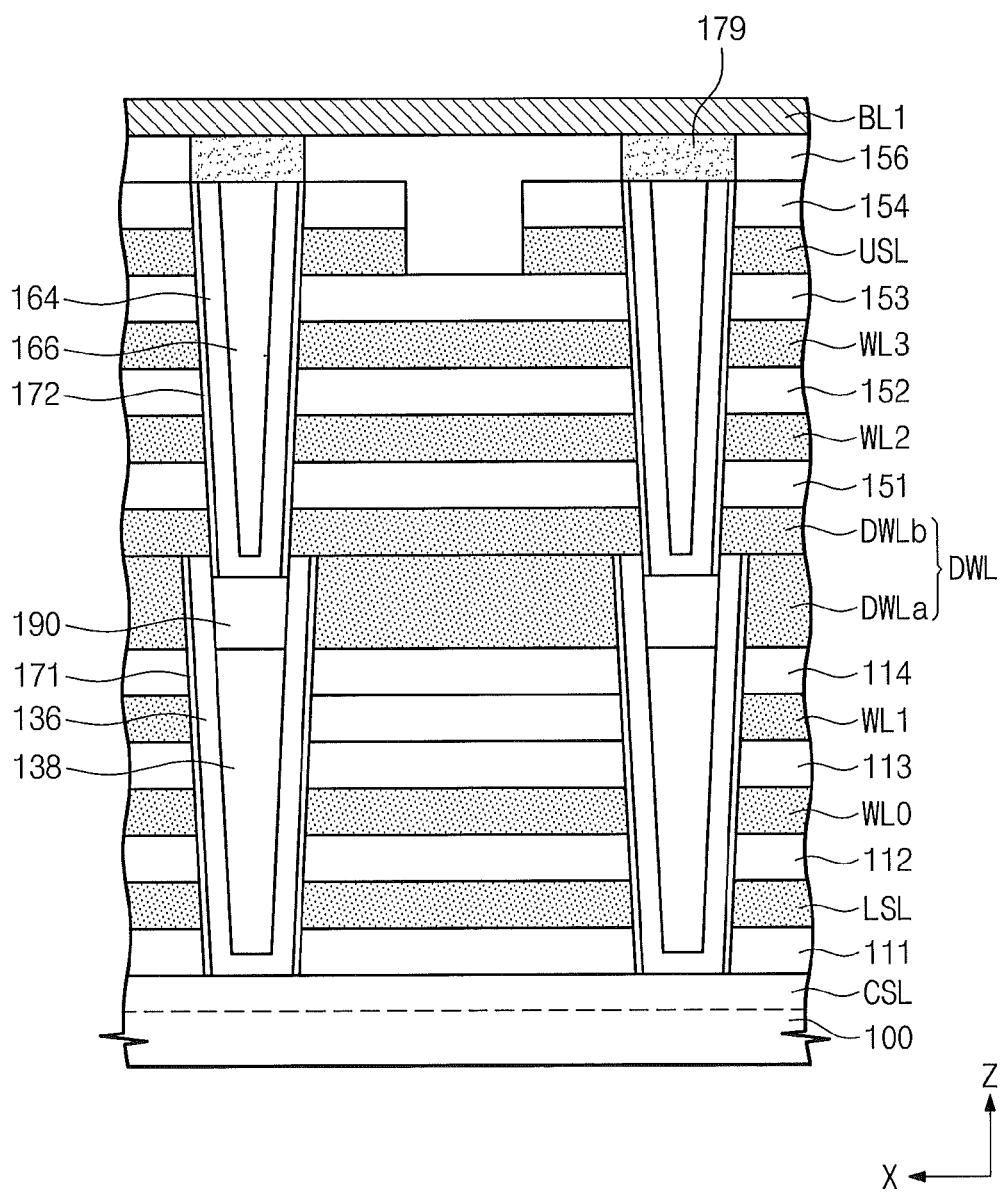
FIG. 54 is a cross-sectional view of the three-dimensional nonvolatile memory device illustrated in FIG. 53 along a line I-I'.

FIG. 53 is a planar diagram illustrating a three-dimensional nonvolatile memory device according to a fourteenth embodiment of the inventive concept. FIG. 54 is a cross-sectional view of the three-dimensional nonvolatile memory device illustrated in FIG. 53 along a line I-I'.

Referring to FIGS. 53 and 54, a substrate 100 is prepared. The substrate 100 may be a wafer (or a semiconductor substrate) formed by cutting a semiconductor ingot, or an epitaxial semiconductor layer formed on a semiconductor substrate. Although not illustrated, a well may be formed on the substrate 100. A common source line CSL is provided to the substrate 100. The common source line CSL may be, e.g., a region doped with N-type impurities at the substrate 100. The common source line CSL may be provided being overlapped by conduction patterns WL0 to WL3 and a dummy conduction pattern DWL.

Lower interlayer dielectrics 111 to 114 and lower conduction patterns LSL, WL0 and WL1 are alternately stacked. A first sub dummy conduction pattern DWLa of the dummy conduction pattern DWL is provided on the uppermost lower interlayer dielectric 114. Lower active pillars 136 penetrate the first sub dummy conduction pattern DWLa of the dummy conduction pattern DWL, the lower interlayer dielectrics 111 to 114 and the lower conduction patterns LSL, WL0 and WL1 and contact the substrate 100.

On the uppermost lower interlayer dielectric 114, a second sub dummy conduction pattern DWLb of the dummy conduction pattern DWL, upper conduction patterns WL2, WL3 and USL and upper interlayer dielectrics 151 to 154 are alternately stacked. Upper active pillars 164 penetrate the second sub dummy conduction pattern DWLb of the dummy conduction pattern DWL, the upper interlayer dielectrics 151 to 154 and the upper conduction patterns WL2, WL3 and USL and contact the lower active pillars 136.

An information storage layer is provided to the outer sides of the active pillars 136 and 164. The information storage layer may include a first information storage layer 171 and a second information storage layer 172. The first information storage layer 171 is provided between the lower active pillars 136 and the lower conduction patterns LSL, WL0 and WL1, and between the lower active pillars 136 and the first sub dummy conduction pattern DWLa of the dummy conduction pattern DWL. The second information storage layer 172 is provided between the upper active pillars 164 and the upper conduction patterns USL, WL2 and WL3, and between the upper active pillars 164 and the second sub dummy conduction pattern DWLb of the dummy conduction pattern DWL. The information storage layers 171 and 172 may include a tunnel insulating layer, a charge storage layer and a blocking insulating layer. The tunnel insulating layer is provided adjacently to the active pillars 136 and 164, and the blocking insulating layer is provided adjacently to the conduction patterns LSL, WL0 to WL3 and USL. The charge storage layer is provided between the tunnel insulating layer and the blocking insulating layer. The tunnel insulating layer may include the silicon oxide layer. The blocking insulating layer may include a high dielectric layer, e.g., an aluminum oxide layer or a hafnium oxide layer. The blocking insulating layer may be a multi-stacked layer including a plurality of thin layers. For instance, the blocking insulating layer may include the aluminum oxide layer and the silicon oxide layer, and a layering sequence of the aluminum oxide layer and the silicon oxide layer may be various. The charge storage layer may be an insulating layer including a charge trap layer or a conductive nano-particle. The charge trap layer may include, e.g., a silicon nitride layer.

The undermost lower conduction pattern LSL may be a lower selection line of a NAND flash memory device. The uppermost upper conduction patterns USL may be provided as plural numbers, and they may be upper selection lines of the NAND flash memory device extended in a second direction. The conduction patterns between the selection lines, i.e., WL0 to WL3, may be first to fourth word lines of the NAND flash memory device. The lower selection line LSL, the dummy word line DWL and the upper word lines WL2 and WL3 may have a plate structure extended in parallel with the substrate.

In the embodiment, sides of the active pillars 136 and 164 may have a slope. The active pillars 136 and 164 may have a shape of a cup. A width of the upper portion of the lower active pillars 136 is larger than that of a lower portion of the upper active pillars 164. The inside of the lower active pillars 136 is filled with a lower filling insulating layer 138 and a lower active pattern 190, and the inside of the upper active pillars 164 is filled with an upper filling insulating layer 166. The lower active pattern 190 contacts the inner side of the upper part of the lower active pillars 136. An upper surface of the lower filling insulating layer 138 may be lower than that of the lower active pillars 136. The upper surface of the lower active pattern 190 may be lower than that of the lower active pillars 136. The upper surface of the lower filling insulating layer 138 and the lower surface of the upper active pillars 164 are coplanar. The inner side of the upper part of the lower active pillars 136 may contact the outer side of the lower part of the upper active pillars 164. The lower active pillars 136 are electrically connected to the upper active pillars 164.

The upper surface of the upper filling insulating layer 166 may be lower than that of the upper active pillars 164. An upper active pattern 177 may be provided on the upper filling insulating layer 166 and contact the inner side of the upper part of the upper active pillars 164. The upper active pattern 177 may include the semiconductor layer.

At the contact region of the lower active pillars 136 and the upper active pillars 164, outer sides of the lower active pillars 136 and the upper active pillars 164 may have the stepped profile. The dummy conduction pattern DWL is provided for covering the contact region of the lower active pillars 136 and the upper active pillars 164. The dummy conduction pattern DWL may be a dummy word line. The first information storage layer 171 may be extended between the first sub dummy conduction pattern DWLa of the dummy conduction pattern DWL and the lower active pillars 136. The second information storage layer 172 may be extended between the second sub dummy conduction pattern DWLb of the dummy conduction pattern DWL and the upper active pillars 164.

Preferably, the upper surface of the lower active pillars 136 may have the same height as or be lower than that of the dummy conduction pattern DWL. Preferably, the lower surface of the lower active pattern 190 may have the same height as or be higher than that of the lower interlayer dielectric 114 immediately under the dummy conduction pattern DWL. More preferably, the lower surface of the lower active pattern 190 may have the same height as or be higher than that of the dummy conduction pattern DWL. The dummy conduction pattern DWL may cover both of the lower active pillars 136 and the upper active pillars 164. The dummy conduction pattern DWL may include a protrusion portion which is more protruded than a first surface facing the outer surface of the upper part of the lower active pillars 136 toward the outer surface of the lower part of the upper active pillars 164 and thinner than the dummy conduction pattern. The dummy conduction pattern DWL covers the lower active pillars 136 and the upper active pillars 164. Therefore, the lower active pillars 136, the upper active pillars 164 and the lower active pattern 190 may have the same channel characteristics.

A drain region 179 may be provided on the upper active pillars 164. The drain region 179 may be a silicon layer doped with impurities. On the insulating layer 156 surrounding the drain region 179, a plurality of bit lines BL0 to BL3 is provided. The plurality of bit lines BL0 to BL3 crosses the upper selection line USL and is extended in a second direction intersecting the first direction. The bit lines BL0 to BL3 are connected to the drain region 179.

The active pillars 136 and 164 may include an intrinsic semiconductor layer not doped with impurities. If a voltage is applied to one of the conduction patterns LSL, WL0 to WL3 and USL, an inversion region is formed due to a fringe field at a certain region of the active pillars 136 and 164 adjacent to the conduction pattern. This inversion region may form a source/drain region of a memory cell transistor.

Figure 55:
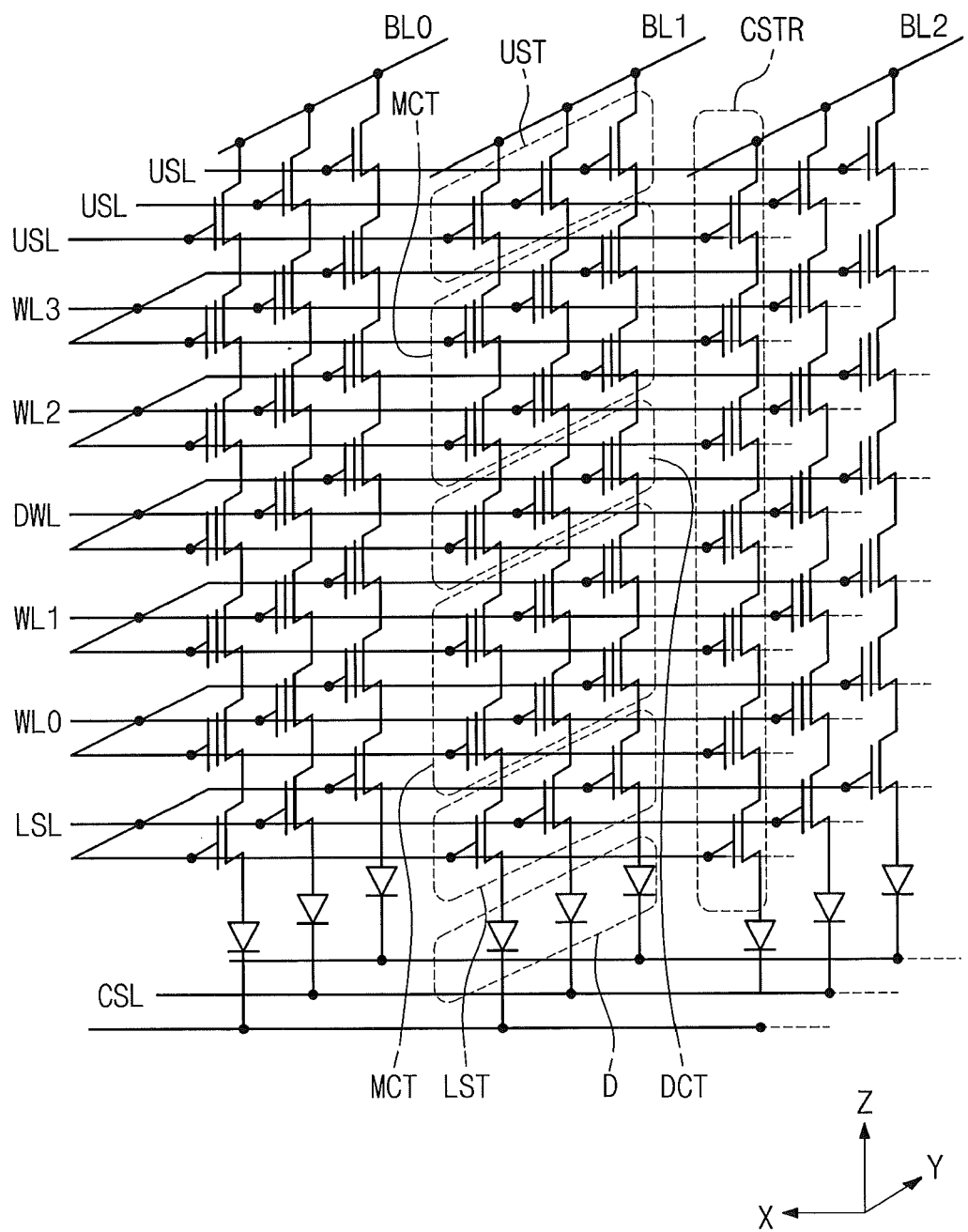
FIG. 55 is a circuit diagram illustrating the three-dimensional nonvolatile memory device according to the fourteenth embodiment of the inventive concept.

FIG. 55 is a circuit diagram illustrating the three-dimensional nonvolatile memory device according to the embodiment of the inventive concept. Except that a diode D is provided between each cell string CSTR and the common source line CSL, the circuit diagram according to the embodiment is the same as the circuit diagram described referring to FIG. 3. For instance, the common source line CSL may have N-type of conduction and the active pillars may have P-type of conduction. The lower active pillars 136 and the common source line CSL form a P-N junction to be operated as the diode D.

Voltages applied to the lines connected to one cell string CSTR in the circuit diagram illustrated in FIG. 55 may be determined, e.g., as shown in Table. 5.

TABLE 5

|  | erase | program | read |
|---|---|---|---|
| selected WL | ground voltage (Vss) | program voltage (Vpgm) (e.g., 15~20 V) | read voltage (Vrd) (e.g., 0 V) |
| non-selected WL | ground voltage (Vss) | pass voltage (Vpass) (e.g., 10 V) | non-selection read voltage (Vread) (e.g., 4.5 V) |
| DWL | intermediate voltage (VDWL) (e.g., Vss < VDWL < Vers) | intermediate voltage (VDWL) (e.g., Vss < VDWL < Vpgm) | intermediate voltage (VDWL) (e.g., Vss < VDWL ≦ Vread) |
| USL | floating | power supply voltage (Vcc) | turn-on voltage (e.g, 4.5 V) |
| LSL | ground voltage (Vss) → floating | ground voltage (Vss) | turn-on voltage (e.g., 4.5V) |
| CSL | floating | ground voltage (Vss) | ground voltage (Vss) |
| selected BL | floating | ground voltage (Vss) | power supply voltage (Vcc) |
| non-selected BL | floating | power supply voltage (Vcc) | low voltage (e.g., <0.8 V) |
| substrate | pre voltage(Vpre) → erasing voltage (Vers) (e.g., 21 V) | ground voltage (Vss) | ground voltage (Vss) |

Except that the lower election line LSL is floated after it is supplied with the ground voltage Vss, and the substrate 100 is supplied with the erasing voltage Vers after it is supplied with the pre voltage Vpre during the erasing, the voltages applied to the lines may be the same as those shown in Table. 1.

During the erasing, Gate Induced Drain Leakage (GIDL) occurs due to a voltage difference between the lower selection line LSL and the substrate 100. Due to the GIDL, a leakage current may flow from the substrate 100 to the lower active pillars 136. Due to the leakage current, the voltage of the active pillars 136 and 164 is increased so that the erasing is performed.

Figure 56:
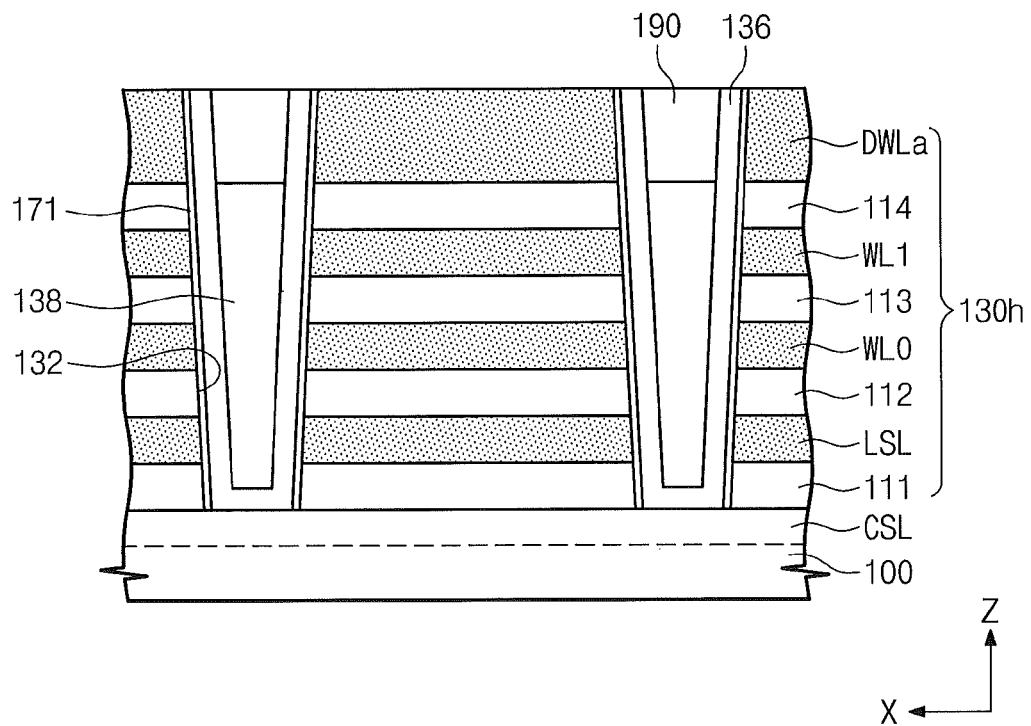
FIGS. 56 to 58 are cross-sectional views corresponding to the line I-I' of FIG. 53 for explaining a method for forming the three-dimensional nonvolatile memory device according to the fourteenth embodiment of the inventive concept.
Figure 57:
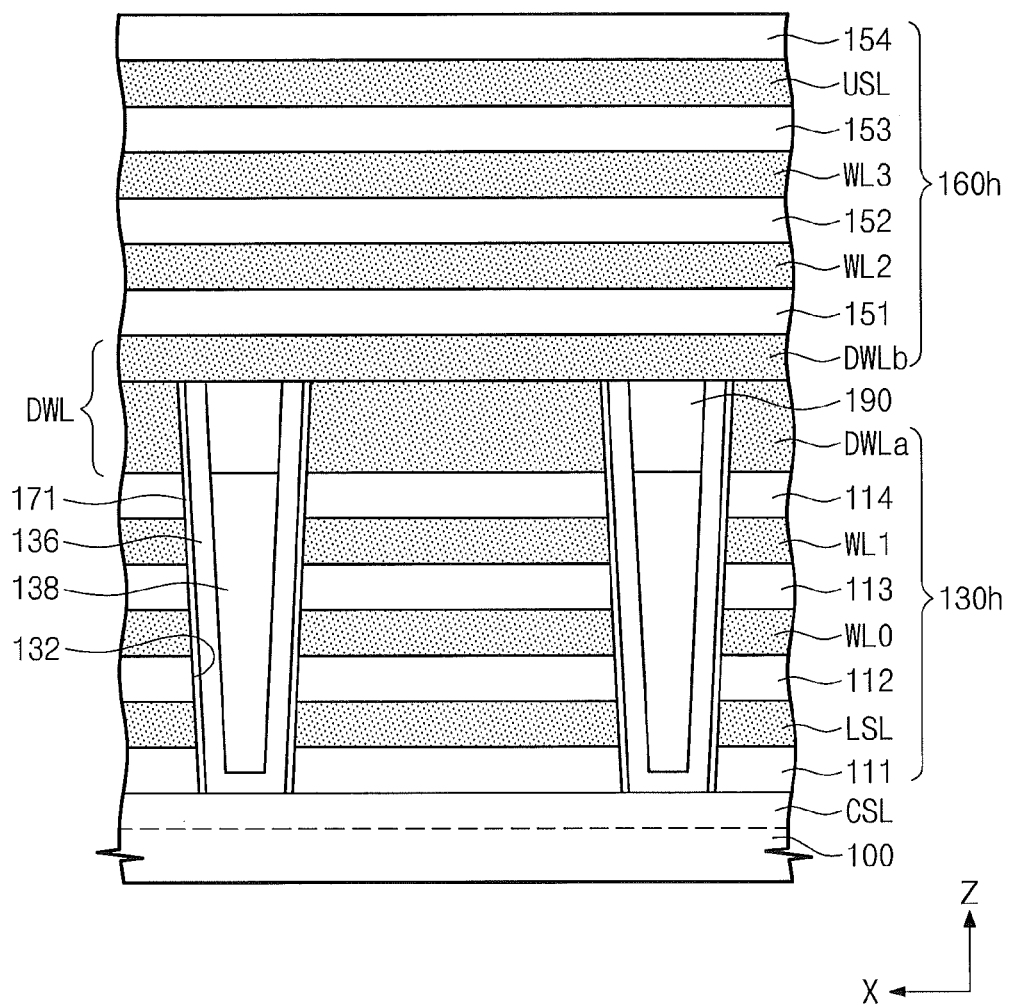
Figure 58:
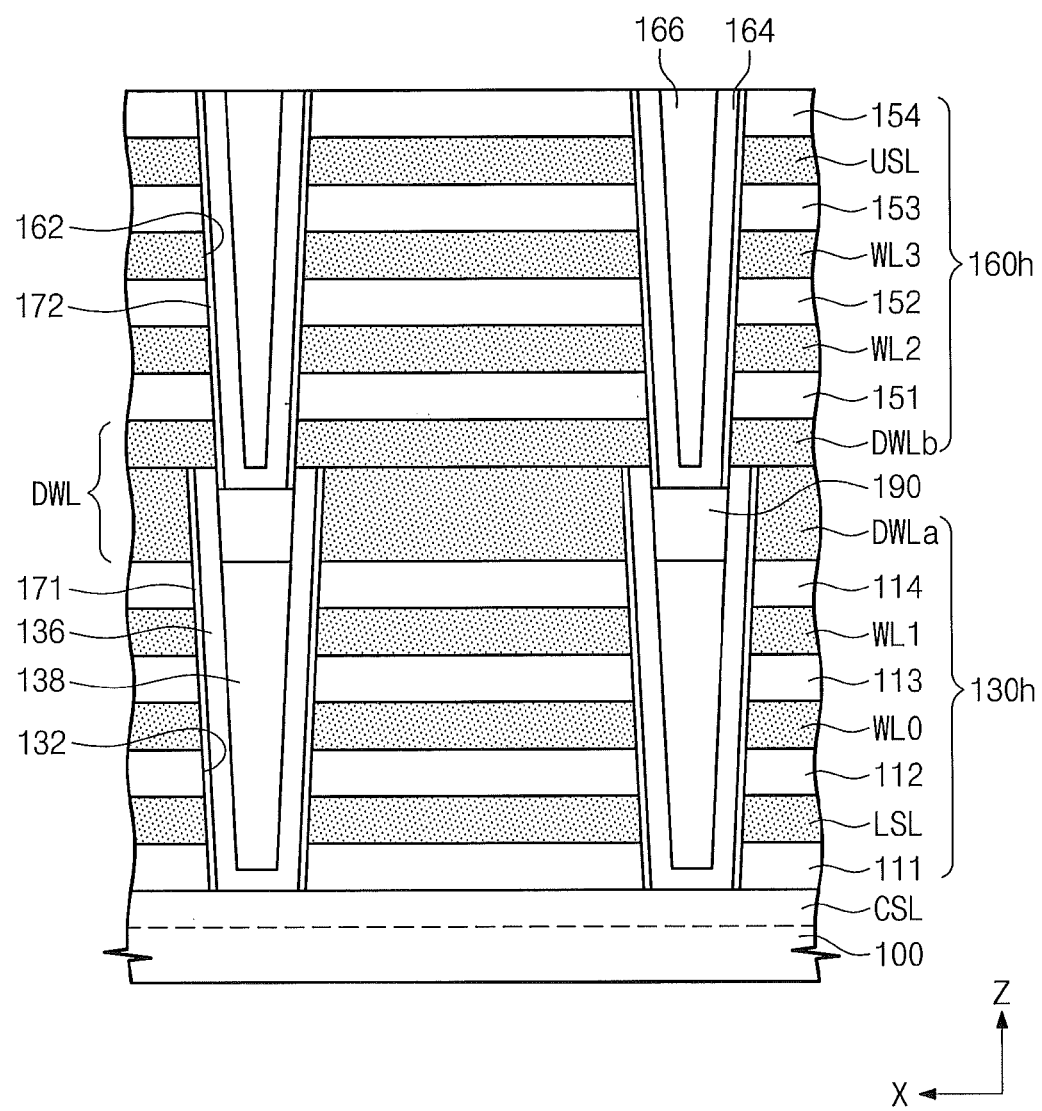

A method for forming the three-dimensional nonvolatile memory device according to the embodiment of the inventive concept will be described. FIGS. 56 to 58 are cross-sectional views along the line I-I' of FIG. 53.

Referring to FIG. 56, the common source line CSL is provided on the substrate 100. A lower layer 130H is formed on the common source line CSL. The lower layer 130H is formed by alternately stacking the lower interlayer dielectrics 111 to 114, the lower conduction patterns LSL, WL0 and WL1 and the dummy conduction pattern DWL. For instance, the lower interlayer dielectrics may be formed with the silicon oxide layer. The lower conduction patterns LSL, WL0 and WL1 and the first sub dummy conduction pattern DWLa of the dummy conduction pattern DWL may be formed with conductive material such as polysilicon. The lower interlayer dielectrics may include first to fourth interlayer dielectrics 111 to 114 from the bottom. The first lower interlayer dielectric 111 is formed undermost. The first sub dummy conduction pattern DWLa of the dummy conduction pattern DWL is formed uppermost, and may be thicker than the conduction patterns LSL, WL0 and WL1.

By sequentially etching the lower interlayer dielectrics 111 to 114, the lower conduction patterns LSL, WL0 and WL1 and the first sub dummy conduction pattern DWLa of the dummy conduction pattern DWL, a lower active hole 132 which exposes the common source line CSL is formed. The etching process may be performed as a dry etching, and the side of the lower active hole 132 may slope due to a by-product generated during the dry etching.

The first information storage layer 171 and the lower active pillars 136 are formed at the lower active hole 132. For instance, the tunnel insulating layer, the charge storage layer and the blocking insulating layer are sequentially stacked on the side of the lower active hole 132 and exposed surface of the common source line CSL so that the first information layer 171 is formed. By etching the bottom part of the first information storage layer 171, the common source line CSL is exposed. By conformally forming the semiconductor layer on the side of the first information storage layer 171 and the exposed surface of the common source line CSL, the lower active pillars 136 are formed. The semiconductor layer may be formed with thickness not filling the lower active hole 132. For instance, the semiconductor layer may be the polysilicon layer not doped with impurities or the silicon layer doped as P-type.

The lower filling insulating layer 138 may be formed and fill the inner space of the lower active hole 132. The lower filling insulating layer 138 may be the silicon oxide layer. The upper part of the lower filling insulating layer 138 is recessed. The recessed upper surface of the lower filling insulating layer 138 may have the same height as or be higher than the lower surface of the first sub dummy conduction pattern DWLa of the dummy conduction pattern DWL. At the recessed part, the lower active pattern 190 is formed. The lower active pattern 190 may contact the inner side of the upper portion of the lower active pillars 136. The lower active pattern 190 may be doped as the same conductive type as the lower active pillars 136. The lower surface of the lower active pattern 190 has the same height as or is higher than that of the first sub dummy conduction pattern DWLa of the dummy conduction pattern DWL.

Referring to FIG. 57, an upper layer 169*h* is formed on the lower layer 130*h*. The upper layer 169*h* is formed by alternately stacking the upper interlayer dielectric 151 to 154, the second sub dummy conduction pattern DWLb of the dummy conduction pattern DWL and the upper conduction patterns WL2, WL3 and USL. The first and second sub dummy conduction patterns DWLa and DWLb are included in the dummy conduction pattern DWL. The upper interlayer dielectrics 151 to 154 include first to fourth interlayer dielectrics 151 to 154 from the bottom. For instance, the upper interlayer dielectrics 151 to 154 may be formed with the silicon oxide layer. The second sub dummy conduction pattern DWLb of the dummy conduction pattern DWL and the upper conduction patterns WL2, WL3 and USL may be formed with conduction material such as the polysilicon.

Referring to FIG. 58, by etching the second sub dummy conduction pattern DWLb of the dummy conduction pattern DWL, the upper conduction patterns WL2, WL3 and USL and the upper interlayer dielectrics 151 to 154, the upper active hole 162 which exposes the lower active pattern 190 is formed. For instance, the lower surface of the upper active hole 162 is lower than the upper surface of the lower active pillars 136. When the upper active hole 162 is formed, the lower active pattern 190 may be recessed so that the inner side of the upper part of the lower active pillars 136 may be exposed. The etching process may be performed as the dry etching, and the side of the upper active hole 162 may slope due to a by-product generated during the dry etching.

The second information storage layer 172 and the upper active pillars 164 are formed at the upper active hole 162. For instance, the tunnel insulating layer, charge storage layer and blocking insulating layer are sequentially stacked on the side of the upper active hole 162 and exposed surface of the lower active pattern 190 so that the second information layer 172 is formed. The bottom portion of the second information storage layer 172 is etched so that the lower active pattern 190 is exposed. By conformally forming the semiconductor layer on the side of the second information storage layer 172 and the exposed surface of the lower active pattern 190, the upper active pillars 164 are formed. For instance, the semiconductor layer is the polysilicon layer not doped with impurities or the silicon layer doped as P-type. By filling the upper active pillars 164 with an insulating layer, the upper filling insulating layer 166 is formed.

The lower surface of the upper active pillars 164 has the same height as or is lower than the upper surface of the second sub dummy conduction pattern DWLb of the dummy conduction pattern DWL.

The lower active pillars 136, the lower active pattern 190 and the upper active pillars 164 have the same conductive type. That is, the lower active pillars 136, the lower active pattern 190 and the upper active pillars 164 are electrically connected to each other. Since the lower active pattern 190 is recessed, the lower active pattern 190 contacts the inner side of the lower active pillars 136. The inner side of the upper part of the lower active pillars 136 contacts the outer side of the lower part of the upper active pillars 164.

Thereafter, referring to FIG. 54 again, the uppermost conduction pattern USL is patterned so that the upper selection lines USL are formed. The drain region 179 which contacts the upper active pillars 164 is formed. The drain region 179 may be doped with N-type impurities. The insulating layer 156 is formed to cover the upper selection lines USL. The bit lines BL0 to BL3 are formed and connected to the drain region 179.

In the embodiment, the thickness of the lower active pattern 190 is adjusted for the lower active pattern 190 not to be removed when the upper active hole 162 is formed. For instance, for the lower active pattern 190 not to be recessed and removed, the thickness of the lower active pattern 190 is adjusted. In the embodiment, the thickness of the first sub dummy conduction pattern DWLa of the dummy conduction pattern DWL is adjusted based on the thickness of the lower active pattern 190. As the thickness of the lower active pattern 190 is increased, the thickness of the first sub dummy conduction pattern DWLa of the dummy conduction pattern DWL may be increased.

Embodiment 15

Figure 59:
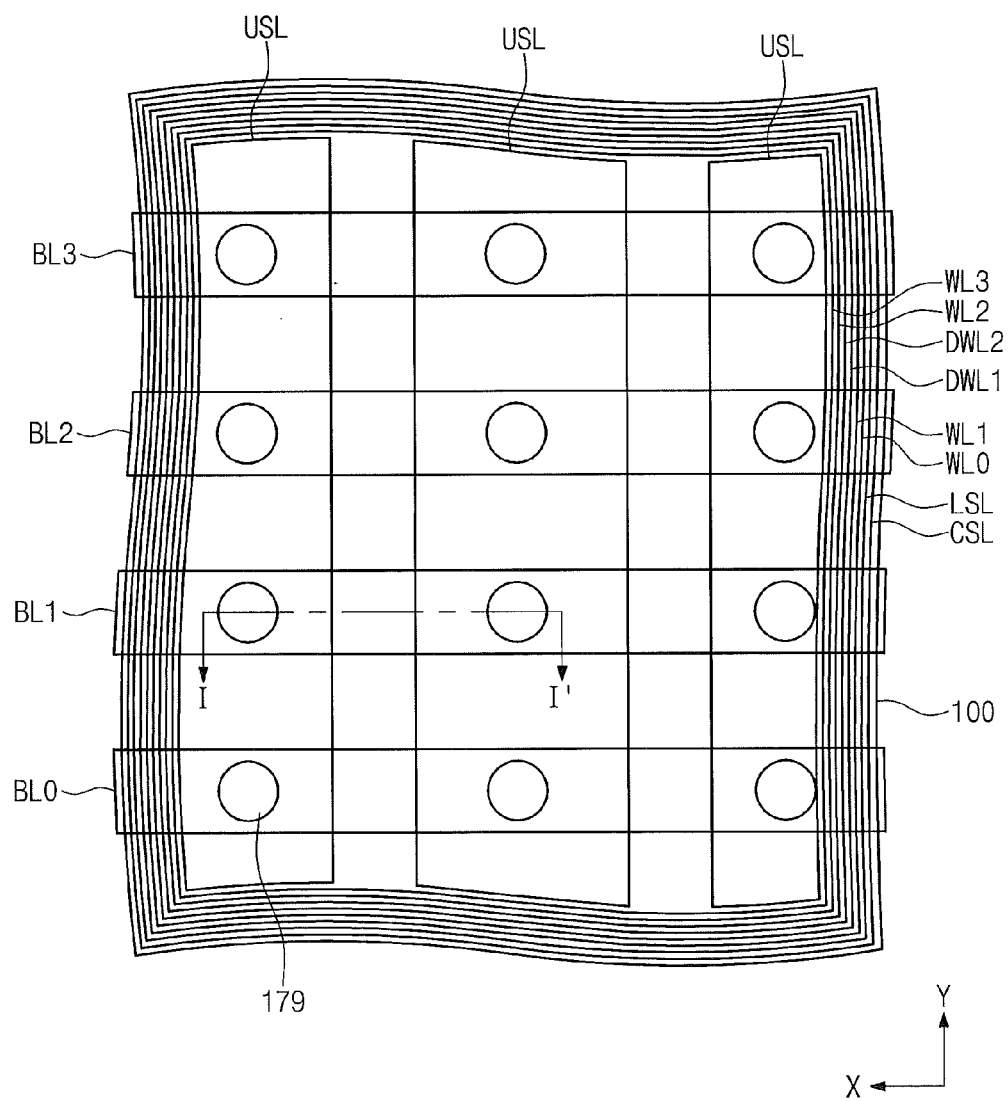
FIG. 59 is a planar diagram illustrating a three-dimensional nonvolatile memory device according to a fifteenth embodiment of the inventive concept.
Figure 60:
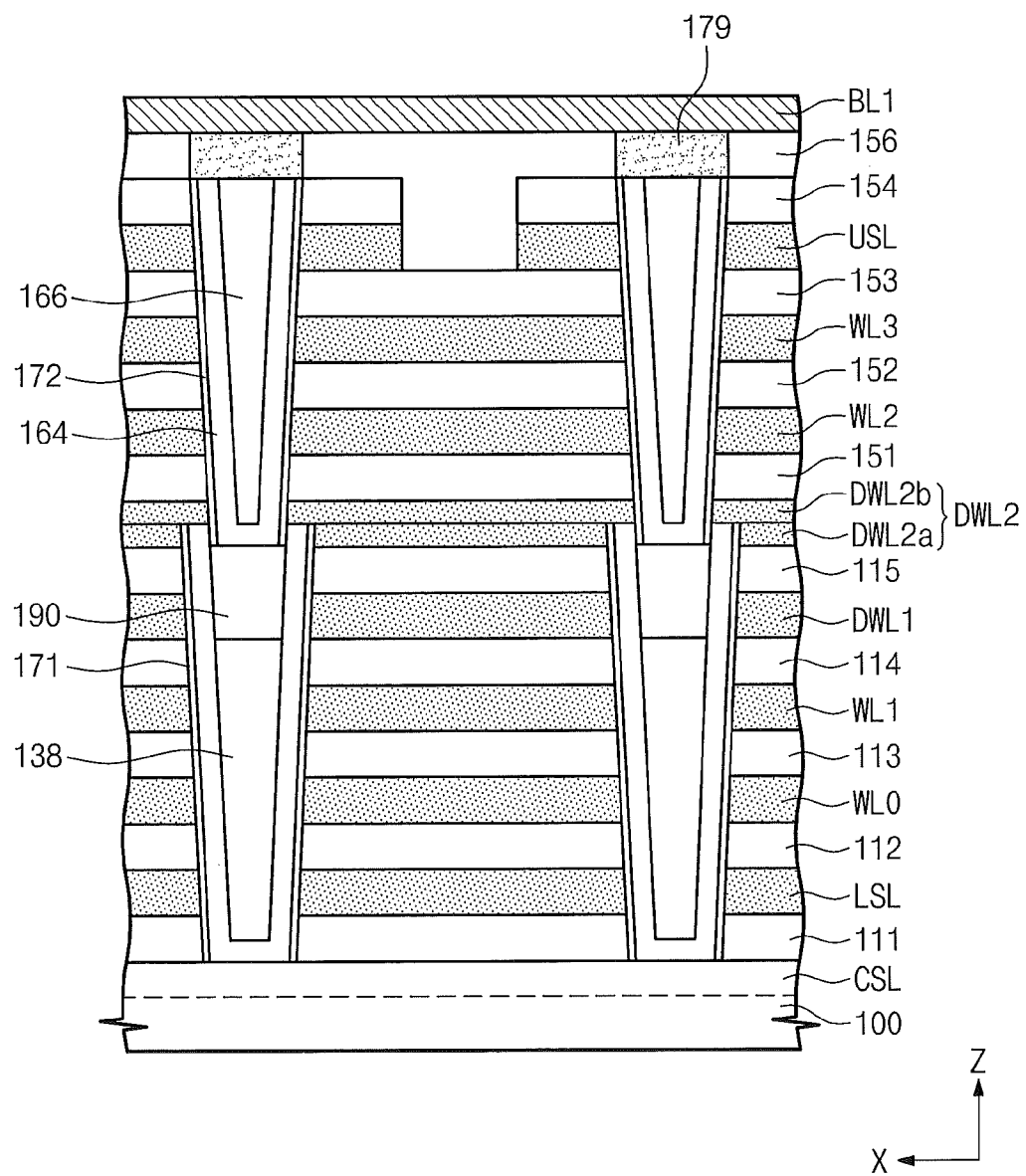
FIG. 60 is a cross-sectional view along the line I-I' of FIG. 59.

FIG. 59 is a planar diagram illustrating a three-dimensional nonvolatile memory device according to a fifteenth embodiment of the inventive concept. FIG. 60 is a cross-sectional view along the line I-I' of FIG. 59. Explanations overlapped by the description above-mentioned referring to FIG. 54 are omitted; instead, differences will be explained in detail.

Referring to FIGS. 59 and 60, the three-dimensional nonvolatile memory device according to the fifteenth embodiment of the inventive concept includes the lower active pattern 190 stacked between the lower filling insulating layer 138 and the upper active pillars 164. The lower active pattern 190 contacts the inner side of the upper part of the lower active pillars 136 and contacts the lower surface of the upper active pillars 164. The lower active pattern 190 helps the upper active pillars 164 and the lower active pillars 136 be electrically connected to each other.

The lower active pattern 190 may be doped as the same type as the lower active pillars 136 and the upper active pillars 164.

At least two dummy conduction patterns DWL1 and DWL2 are provided adjacently to the contact region of the lower active pillars 136 and the upper active pillars 164. Hereinafter, the dummy conduction patterns DWL1 and DWL2 are defined as a first dummy conduction pattern DWL1 and a second dummy conduction pattern DWL2 respectively from the bottom. The first dummy conduction pattern DWL1 covers the lower active pillars 136. The second dummy conduction pattern DWL2 covers the stepped profile of the part where the lower active pillars 136 and the upper active pillars 164 contact each other. The problem of channel non-uniformity due to different characteristics of the channels formed at the lower active pillars 136, the upper active pillars 164 and the lower active pattern 190 may be reduced.

The second dummy conduction pattern DWLs may include a first sub dummy conduction pattern DWL2a and a second sub dummy conduction pattern DWL2b. The interface between the first sub dummy conduction pattern DWL2a and the second sub dummy conduction pattern DWL2b may be discontinuous. The upper surface of the lower active pillars 136, the upper surface of the first sub dummy conduction pattern DWL2a and the lower surface of the second sub dummy conduction pattern DWL2b may be coplanar. The first sub dummy conduction pattern DWL2a of the second dummy conduction pattern DWL2 covers the lower active pillars 136. The second sub dummy conduction pattern DWL2b of the second dummy conduction pattern DWL2 covers the upper active pillars 164.

Preferably, the lower surface of the lower active pattern 190 may have the same height as or be higher than that of the lower interlayer dielectric 114 immediately under the first dummy conduction pattern DWL1. More preferably, the lower surface of the lower active pattern 190 may have the same height as or be higher than that of the first dummy conduction pattern DWL1. Preferably, the upper surface of the lower active pillars 136 may have the same height as or be lower than that of the interlayer dielectric 151 just on the second dummy conduction pattern DWL2. More preferably, the upper surface of the lower active pattern 136 may have the same height as or be lower than that of the second dummy conduction pattern DWL2. Preferably, the lower surface of the upper active pillars 164 may have the same height as or be higher than that of the lower interlayer dielectric 114 immediately under the first dummy conduction pattern DWL1. More preferably, the lower surface of the upper active pillars 164 may have the same height as or be higher than that of the first dummy conduction pattern DWL1.

Meanwhile, the conduction patterns WL0 to WL3 except for the conduction patterns LSL and USL corresponding to the selection lines, and the dummy conduction patterns DWL1 and DWL2 may have the same thickness. Accordingly, at the edge of the cell region, the process of forming the stepped contact region by patterning the conduction patterns LSL, WL0 to WL3, USL, DWL1 and DWL2 may be performed more easily.

Figure 61:
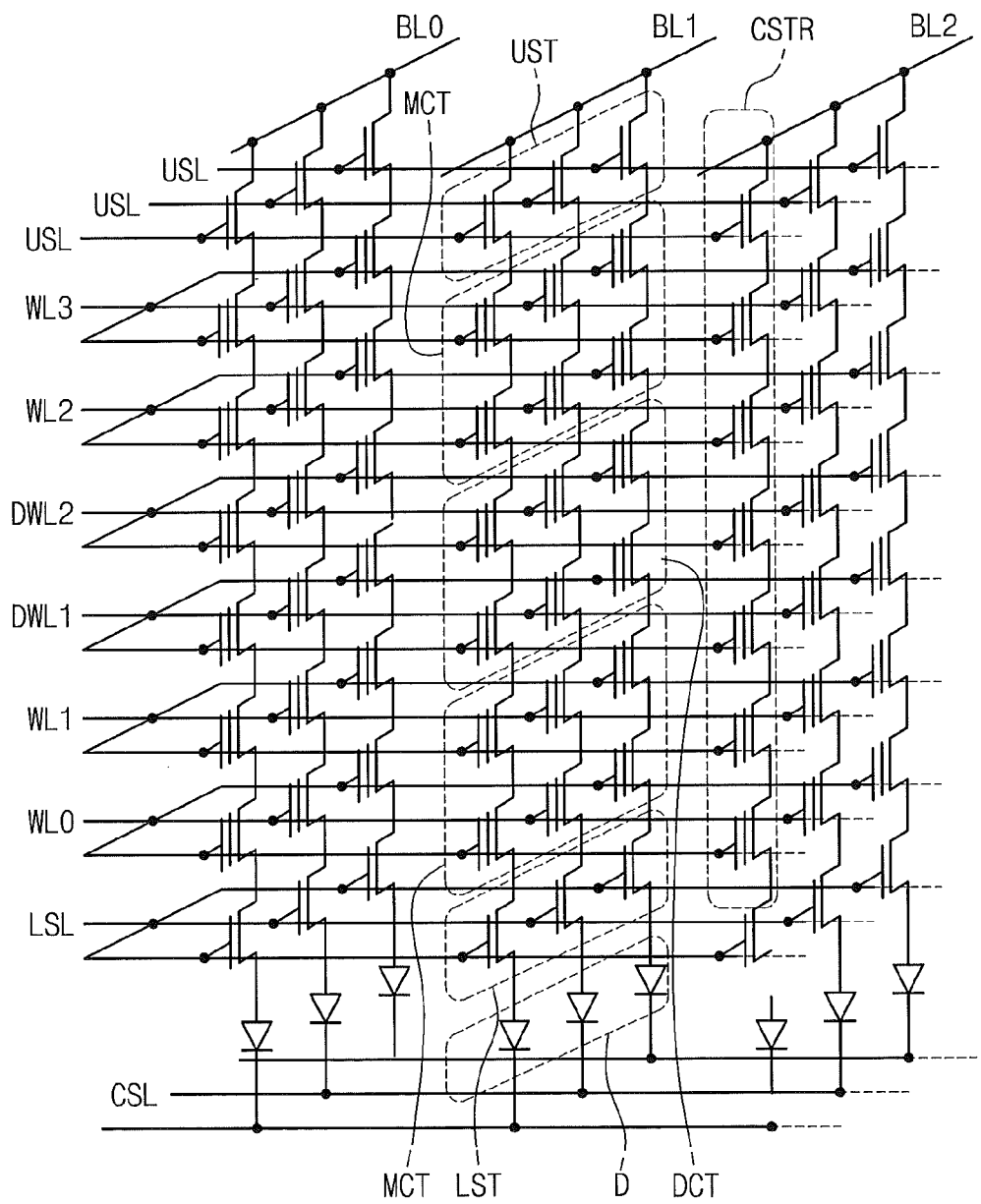
FIG. 61 is a circuit diagram illustrating the three-dimensional nonvolatile memory device according to the fifteenth embodiment of the inventive concept.

FIG. 61 is a circuit diagram illustrating the three-dimensional nonvolatile memory device according to the fifteenth embodiment of the inventive concept. Except that the two dummy conduction patterns DWL1 and DWL2 are provided, the circuit diagram according to the fifteenth embodiment of the inventive concept is the same as the circuit diagram according to the fourteenth embodiment described referring to FIG. 55.

At each cell string CSTR of the circuit diagram according to the embodiment of the inventive concept, the dummy conduction patterns DWL1 and DWL2 may be controlled as explained referring to Table. 3. At each cell string CSTR of the circuit diagram according to the embodiment of the inventive concept, the lower conduction patterns LSL, WL0 and WL1, the upper conduction patterns USL, WL2 and WL3, the common source line CSL, the substrate 100 and the bit lines BL0 to BL3 may be controlled as explained referring to Table. 5.

Figure 62:
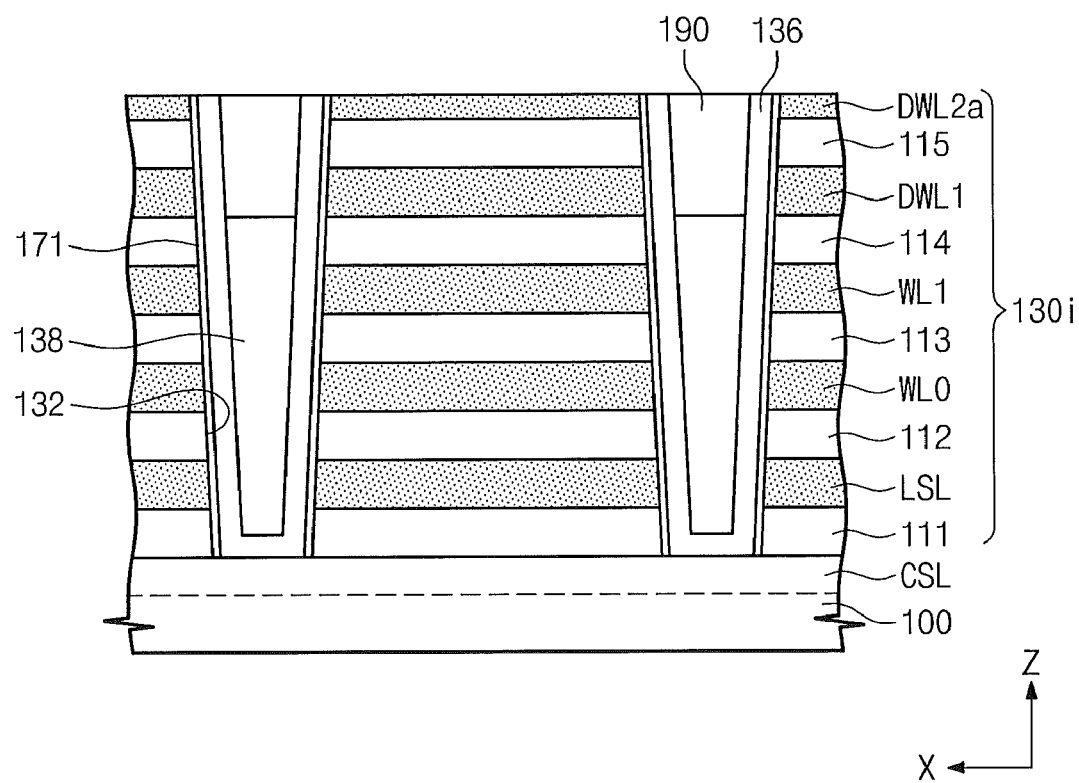
FIGS. 62 to 64 are cross-sectional views corresponding to the line I-I' of FIG. 59 for explaining a method for forming the three-dimensional nonvolatile memory device according to the fifteenth embodiment of the inventive concept.
Figure 63:
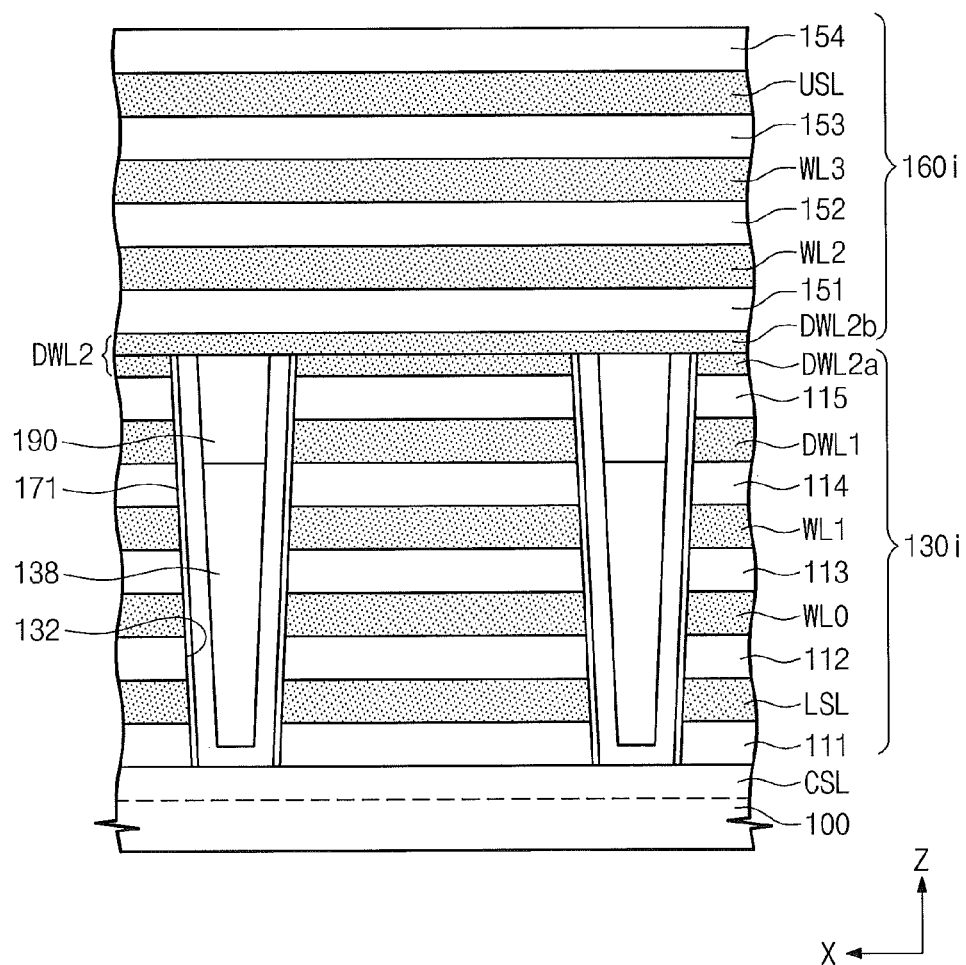
Figure 64:
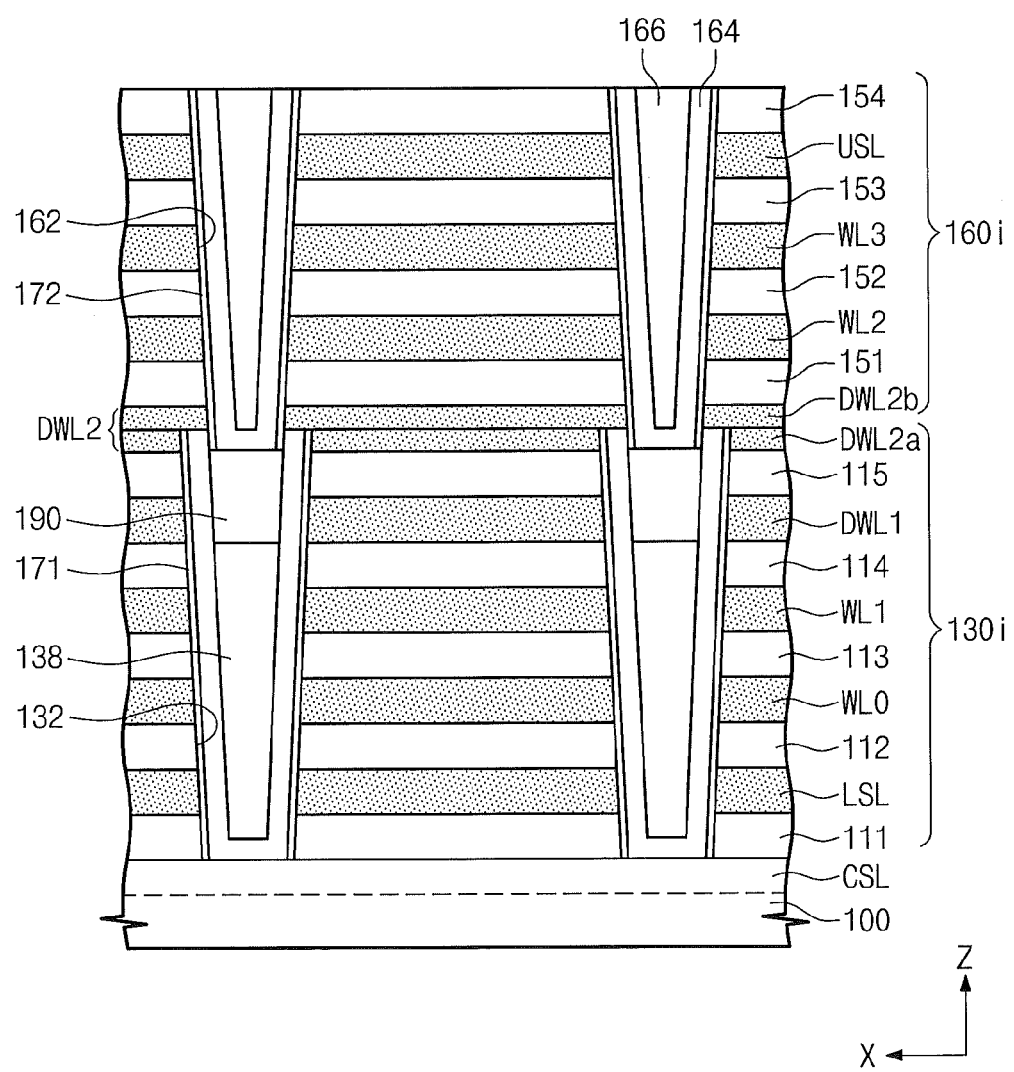

A method for forming the three-dimensional nonvolatile memory device according to the embodiment of the inventive concept will be described. FIGS. 62 to 64 are cross-sectional views along the line I-I' of FIG. 59. Explanations overlapped by the description above-mentioned referring to FIGS. 56 to 58 are omitted; instead, differences will be explained in detail.

Referring to FIG. 62, a lower layer 130$i$ is formed on the common source line CSL of the substrate 100. The lower layer 130$i$ is formed by alternately stacking the lower interlayer dielectrics 111 to 115, the lower conduction patterns LSL, WL0 and WL1, the first dummy conduction pattern DWL1 and the first sub dummy conduction pattern DWL2$a$ of the second dummy conduction pattern DWL2.

In the embodiment, the lower interlayer dielectrics may include first to fourth interlayer dielectrics 111 to 115 from the bottom. The first lower interlayer dielectric 111 is formed undermost. The first sub dummy conduction pattern DWL2$a$ of the second dummy conduction pattern DWL2 is formed uppermost and may be thinner than the other conduction patterns LSL, WL0, WL1 and DWL1.

By sequentially etching the lower interlayer dielectrics 111 to 115, the lower conduction patterns LSL, WL0 and WL1, the first dummy conduction pattern DWL1 and the first sub dummy conduction pattern DWL2$a$ of the second dummy conduction pattern DWL2, a lower active hole 132 which exposes the common source line CSL is formed.

The first information storage layer 171, the lower active pillars 136 and the lower active pattern 190 are formed at the lower active hole 132. The lower active pattern 190 contacts the inner side of the upper portion of the lower active pillars 136. The lower surface of the lower active pattern 190 has the same height as or is higher than that of the first dummy conduction pattern DWL1.

Referring to FIG. 63, an upper layer 160$i$ is formed on the lower layer 130$i$. The upper layer 160$i$ is formed by alternately stacking the upper interlayer dielectrics 151 to 154, the second sub dummy conduction pattern DWL2$b$ of the second dummy conduction pattern DWL2 and the upper conduction patterns WL2, WL3 and USL. The second sub dummy conduction pattern DWL2$b$ of the second dummy conduction pattern DWL2 is formed undermost. The second sub dummy conduction pattern DWL2$b$ of the second dummy conduction pattern DWL2 may be thinner than the upper conduction patterns WL2, WL3 and USL. The first sub dummy conduction pattern DWL2$a$ and the second sub dummy conduction pattern DWL2$b$ of the second dummy conduction pattern DWL2 are included in the second dummy conduction pattern DWL2. For instance, the second dummy conduction pattern DWL2 may have the same thickness as the first dummy conduction pattern DWL1. The second dummy conduction pattern DWL2 may have the same thickness as the conduction patterns WL0 to WL3 except for the conduction patterns corresponding to the selection lines LSL and USL.

The upper interlayer dielectrics 151 to 154 may include first to fourth interlayer dielectrics 151 to 154.

Referring to FIG. 64, by etching the second sub dummy conduction pattern DWL2$b$ of the second dummy conduction pattern DWL2, the upper conduction patterns WL2, WL3 and USL and the upper interlayer dielectrics 151 to 154, the upper active hole 162 which exposes the lower active pattern 190 is exposed. Since the lower active pattern 190 is recessed, the inner side of the upper portion of the lower active pillars 136 is exposed. The side of the upper active hole 162 may slope.

The second information storage layer 172, the upper active pillars 164 and the upper filling insulating layer 166 are formed at the upper active hole 162. The bottom surface of the upper active pillars 164 has the same height as or is lower than the upper surface of the second dummy conduction pattern DWL2.

Thereafter, referring to FIG. 60 again, the uppermost conduction pattern USL is patterned so that upper selection lines USL are formed. The drain region 179 which contacts the upper active pillars 164 is formed. The drain region 179 may be doped with N-type impurities. The insulating layer 156 is formed to cover the upper selection lines USL. The bit lines BL0 to BL3 are formed and connected to the drain region 179.

In the embodiment, the thickness of the lower active pattern 190 is adjusted for the lower active pattern 190 not to be removed when the upper active hole 162 is formed. For instance, for the lower active pattern 190 not to be recessed and removed, the thickness of the lower active pattern 190 is adjusted. In the embodiment, at least two dummy conduction patterns DWL1 and DWL2 are provided. Accordingly, the thickness of the lower active pattern 190 may be increased corresponding to the two dummy conduction patterns DWL1 and DWL2. In spite of the increase of the thickness of the lower active pattern 190, the dummy conduction patterns DWL1 and DWL2 may have the same thickness as the conduction patterns WL0 to WL3 except for the conduction patterns corresponding to the election lines, and the thicknesses of the second to fifth lower interlayer dielectrics 112 to 115 and the first to fourth upper interlayer dielectrics 151 to 154 may be the same.

Embodiment 16

Figure 65:
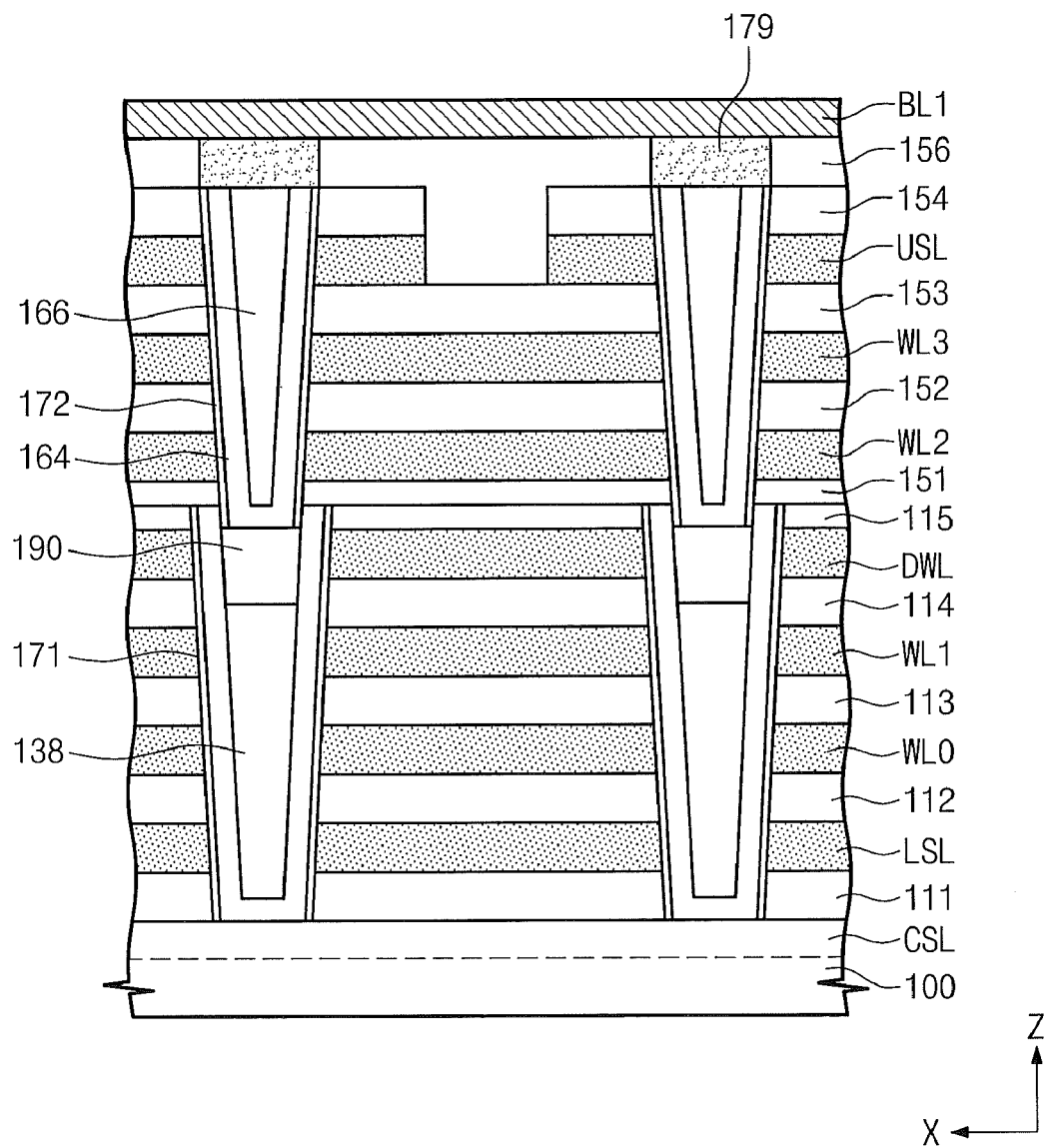
FIG. 65 is a cross-sectional view of a three-dimensional nonvolatile memory device according to a sixteenth embodiment of the inventive concept corresponding to the line I-I' of FIG. 53.

FIG. 65 is a cross-sectional view of a three-dimensional nonvolatile memory device according to a sixteenth embodiment of the inventive concept. The cross section corresponds to the line I-I' of FIG. 53. Explanations overlapped by the description above-mentioned referring to FIG. 60 are omitted; instead, differences will be explained in detail. The operating method may be similar to that of the fourteenth embodiment.

Referring to FIGS. 53 and 65, the three-dimensional nonvolatile memory device according to the sixteenth embodiment of the inventive concept includes the lower active pattern 190 stacked between the lower filling insulating layer 138 and the upper active pillars 164. The dummy conduction pattern DWL is provided adjacently to the contact region of the lower active pillars 136 and the upper active pillars 164.

The interlayer dielectric right on the dummy conduction pattern DWL includes a first sub interlayer dielectric 115 and a second sub interlayer dielectric 151 on the first sub interlayer dielectric 115. The interface between the first sub interlayer dielectric 115 and the second sub interlayer dielectric 151 may be discontinuous. The upper surface of the dummy conduction pattern DWL, the upper surface of the first sub interlayer dielectric 115 and the lower surface of the second sub interlayer dielectric 151 may be coplanar. The interlayer dielectric (the combination of the first and second sub interlayer dielectrics) just on the dummy conduction pattern DWL may cover both of the upper part of the lower active pillars 136 and the lower part of the upper active pillars 164.

Preferably, the lower surface of the lower active pattern 190 may have the same height as or be higher than that of the lower interlayer dielectric 114 immediately under the dummy conduction pattern DWL. The upper surface of the lower active pillars 136 may have the same height as or be lower than that of the interlayer dielectric (the combination of the first and second sub interlayer dielectrics) immediately on the dummy conduction pattern DWL. More preferably, the lower surface of the lower active pattern 190 may have the same height as or be higher than that of the dummy conduction pattern DWL. The upper surface of the lower active pattern 136 may have the same height as or be lower than the lower surface of the interlayer dielectric (the combination of the first and second sub interlayer dielectrics) immediately on the dummy conduction pattern DWL.

Figure 66:
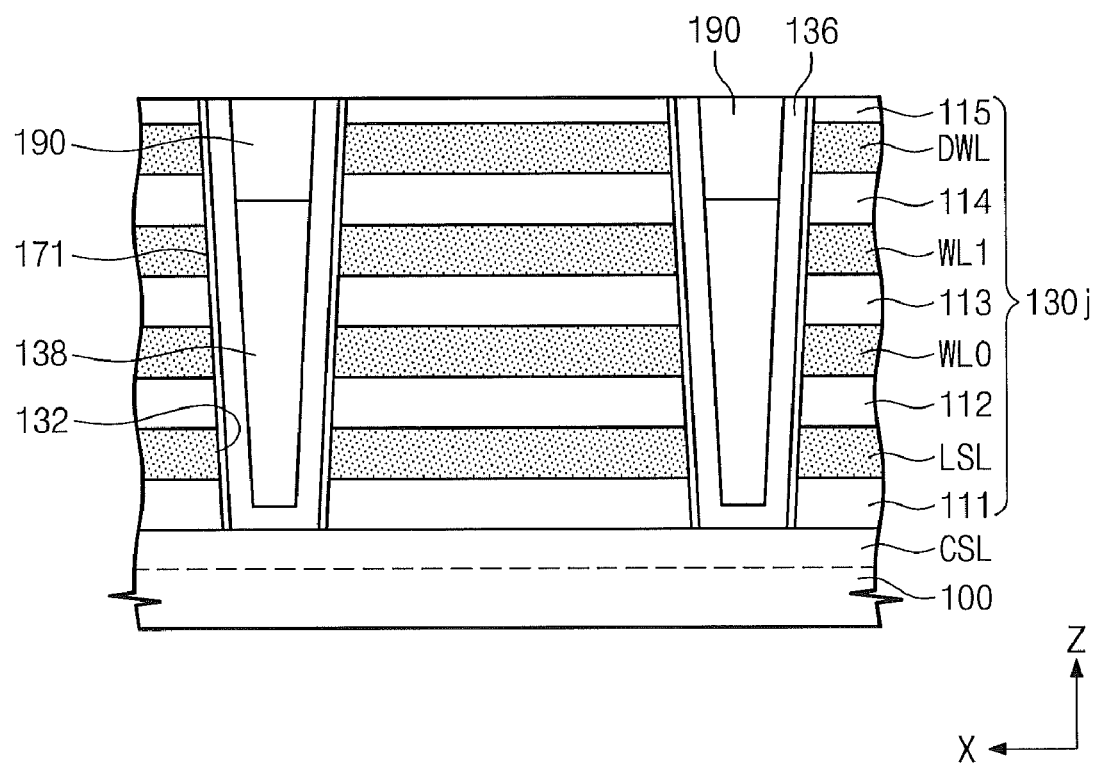
FIGS. 66 to 68 are cross-sectional views corresponding to the line I-I' of FIG. 53 for explaining a method for forming the three-dimensional nonvolatile memory device according to the sixteenth embodiment of the inventive concept.
Figure 67:
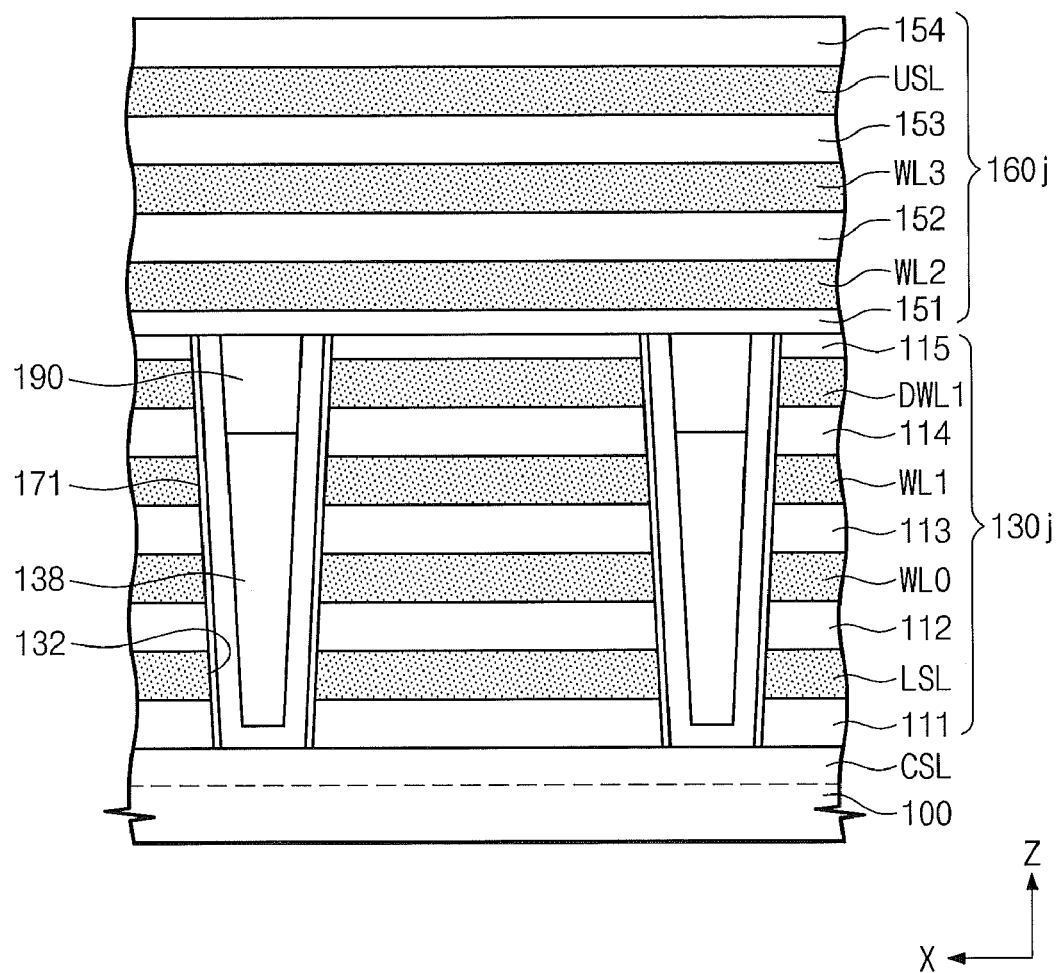
Figure 68:
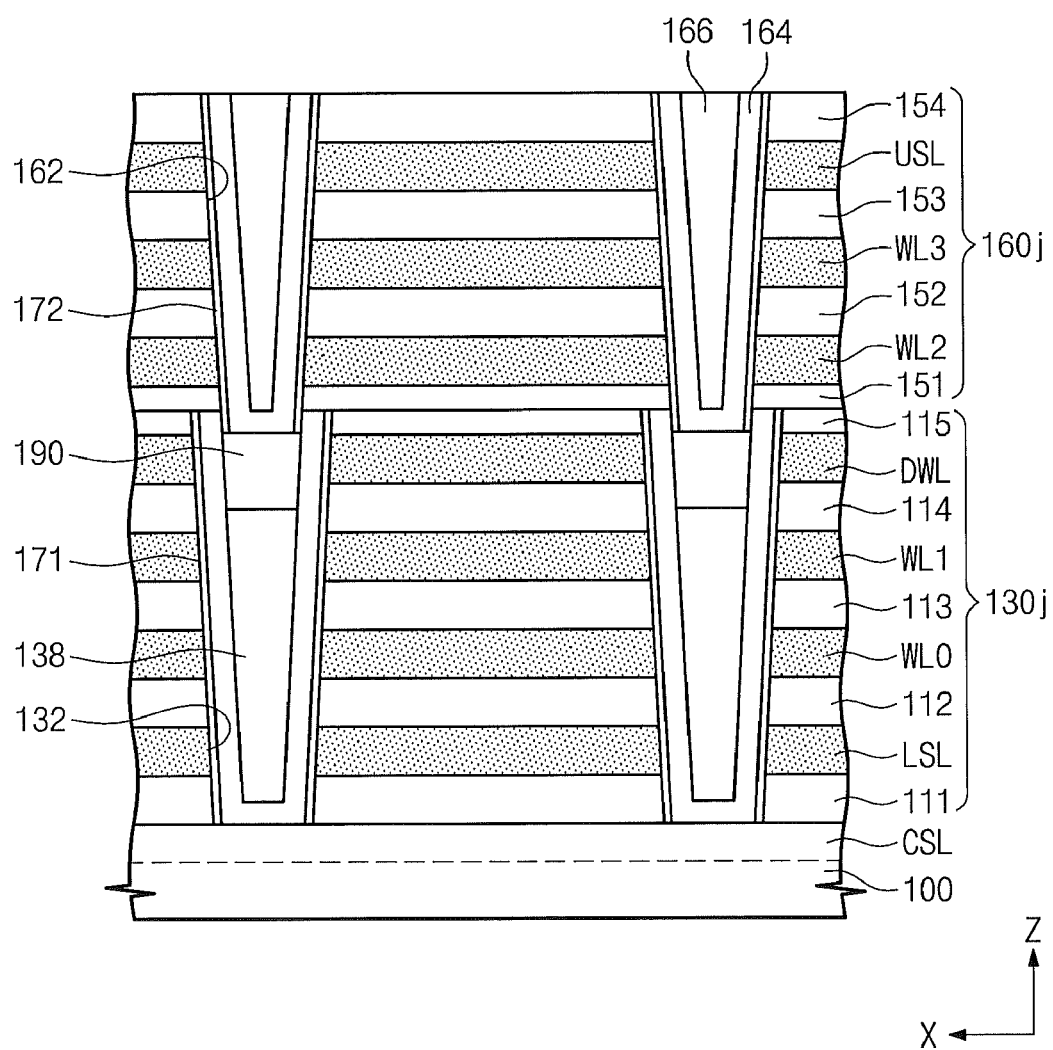

A method for forming the three-dimensional nonvolatile memory device according to the embodiment of the inventive concept will be described. FIGS. 66 to 68 are cross-sectional views along the line I-I' of FIG. 53. Explanations overlapped by the description above-mentioned referring to FIGS. 56 to 58 are omitted; instead, differences will be explained in detail.

Referring to FIG. 66, a lower layer 130j is formed on the common source line CSL of the substrate 100. The lower layer 130j is formed by alternately stacking the lower interlayer dielectrics 111 to 115, the lower conduction patterns LSL, WL0 and WL1 and the first dummy conduction pattern DWL1. The lower interlayer dielectrics may include first to fifth lower interlayer dielectrics 111 to 115 from the bottom. The first lower interlayer dielectric 111 may be formed undermost. The fifth lower interlayer dielectric 115 may be formed uppermost and thinner than the second to fourth lower interlayer dielectrics 112 to 114.

By etching the lower interlayer dielectrics 111 to 115, the lower conduction patterns LSL, WL0 and WL1 and the dummy conduction pattern DWL, a lower active hole 132 which exposes the common source line CSL is formed. The side of the lower active hole 132 may have a slope.

The first information storage layer 171, the lower active pillars 136, the lower filling insulating layer 138 and the lower active pattern 190 are formed at the lower active hole 132. The upper surface of the lower active pillars 136 has the same height as or is higher than that of the dummy conduction pattern DWL. The lower surface of the lower active pattern 190 has the same height as or is higher than that of the interlayer dielectric 114 immediately under the dummy conduction pattern DWL.

Referring to FIG. 67, an upper layer 160j is formed on the lower layer 130j. The upper layer 160j is formed by alternately stacking the upper conduction patterns WL2, WL3 and USL and the upper interlayer dielectrics 151 to 154. The upper interlayer dielectrics may include first to fourth upper interlayer dielectrics 151 to 154 from the bottom.

The first upper interlayer dielectric 151 may be formed undermost and thinner than the second to fourth upper interlayer dielectrics 152 to 154. For instance, the sum of thicknesses of the fifth lower interlayer dielectric 115 and the first upper interlayer dielectric 151 may be equal to the thicknesses of the second to fourth lower interlayer dielectrics 112 to 114 and the second to fourth upper interlayer dielectrics 152 to 154.

Referring to FIG. 68, by etching the upper conduction patterns WL2, WL3 and USL and the upper interlayer dielectrics 151 to 154, the upper active hole 162 which exposes the lower active pattern 190 is exposed. Since the lower active pattern 190 is recessed, the inner side of the upper part of the lower active pillars 136 is exposed. The side of the upper active hole 162 may have a slope.

The second information storage layer 172, the upper active pillars 164 and the upper filling insulating layer 166 are formed at the upper active hole 162. The bottom surface of the upper active pillars 164 has the same height as or is lower than the upper surface of the first upper interlayer dielectric 151. The lower active pillars 136, the lower active pattern 190 and the upper active pillars 164 have the same conductive type.

Thereafter, referring to FIG. 65 again, the uppermost conduction pattern USL is patterned so that upper selection lines USL are formed. The drain region 179 which contacts the upper active pillars 164 is formed. The drain region 179 may be doped with N-type impurities. The insulating layer 156 is formed to cover the upper selection lines USL. The bit lines BL0 to BL3 are formed and connected to the drain region 179.

In the embodiment, the fifth lower interlayer dielectric 115 and the first upper interlayer dielectric 151 are included in the interlayer dielectric right on the dummy conduction pattern DWL.

In the embodiment, the thickness of the lower active pattern 190 is adjusted for the lower active pattern 190 not to be removed when the upper active hole 162 is formed. For instance, for the lower active pattern 190 not to be recessed and removed, the thickness of the lower active pattern 190 is adjusted. In the embodiment, the thickness of the lower active pattern 190 is adjusted based on the dummy conduction pattern DWL and the interlayer dielectrics (combination of 114, 115 and 151) adjacent to the dummy conduction pattern DWL.

Embodiment 17

Figure 69:
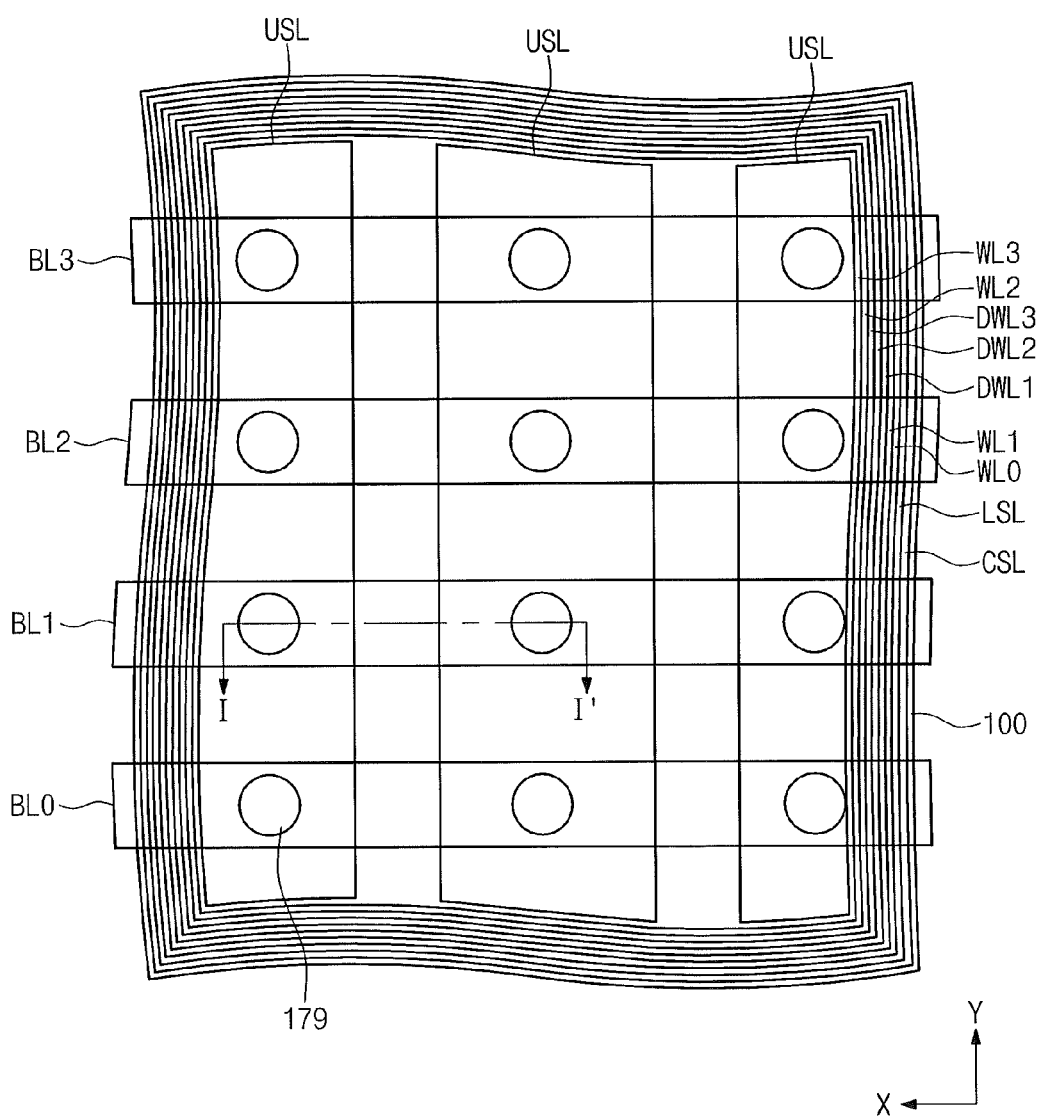
FIG. 69 is a planar diagram illustrating a three-dimensional nonvolatile memory device according to a seventeenth embodiment of the inventive concept.
Figure 70:
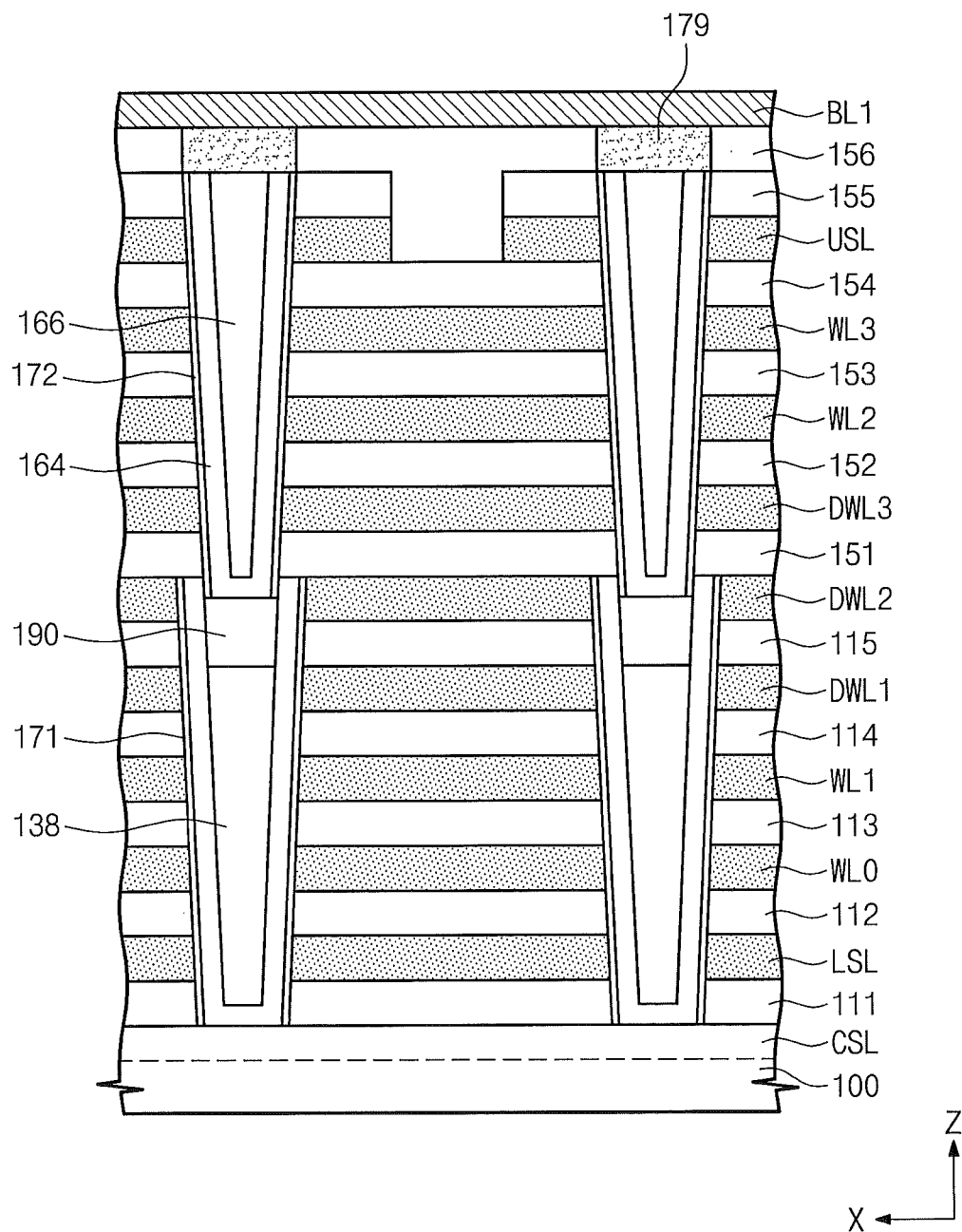
FIG. 70 is a cross-sectional view along the line I-I' of FIG. 69.

FIG. 69 is a planar diagram illustrating a three-dimensional nonvolatile memory device according to a seventeenth embodiment of the inventive concept. FIG. 70 is a cross-sectional view along the line I-I' of FIG. 69. Explanations overlapped by the description above-mentioned referring to FIG. 60 are omitted; instead, differences will be explained in detail. The operating method may be similar to that of the fifteenth embodiment except that the number of dummy conduction patterns is three.

Referring to FIGS. 69 and 70, the three-dimensional nonvolatile memory device according to the seventeenth embodiment of the inventive concept includes the lower active pattern 190 interposed between the lower filling insulating layer 138 and the upper active pillars 164. The lower active pattern 190 contacts the inner side of the upper part of the lower active pillars 136 and contacts the lower surface of the upper active pillars 164. The lower active pattern 190 helps the upper active pillars 164 and the lower active pillars 136 be electrically connected to each other.

Dummy conduction patterns DWL1 to DWL3 are provided to the part where the lower active pillars 136 and the upper active pillars 164 contact each other. The dummy conduction patterns DWL1 to DWL3 may include first to third dummy conduction patterns DWL1 to DWL3.

Preferably, the lower surface of the lower active pattern 190 has the same height as or is higher than the upper surface of the first dummy conduction pattern DWL1. The upper surface of the lower active pillars 136 has the same height as or is lower than the lower surface of the third dummy conduction pattern DWL3.

Except that the number of the dummy conduction patterns is 3, the operating method may be similar to that of the eighth embodiment.

Figure 71:
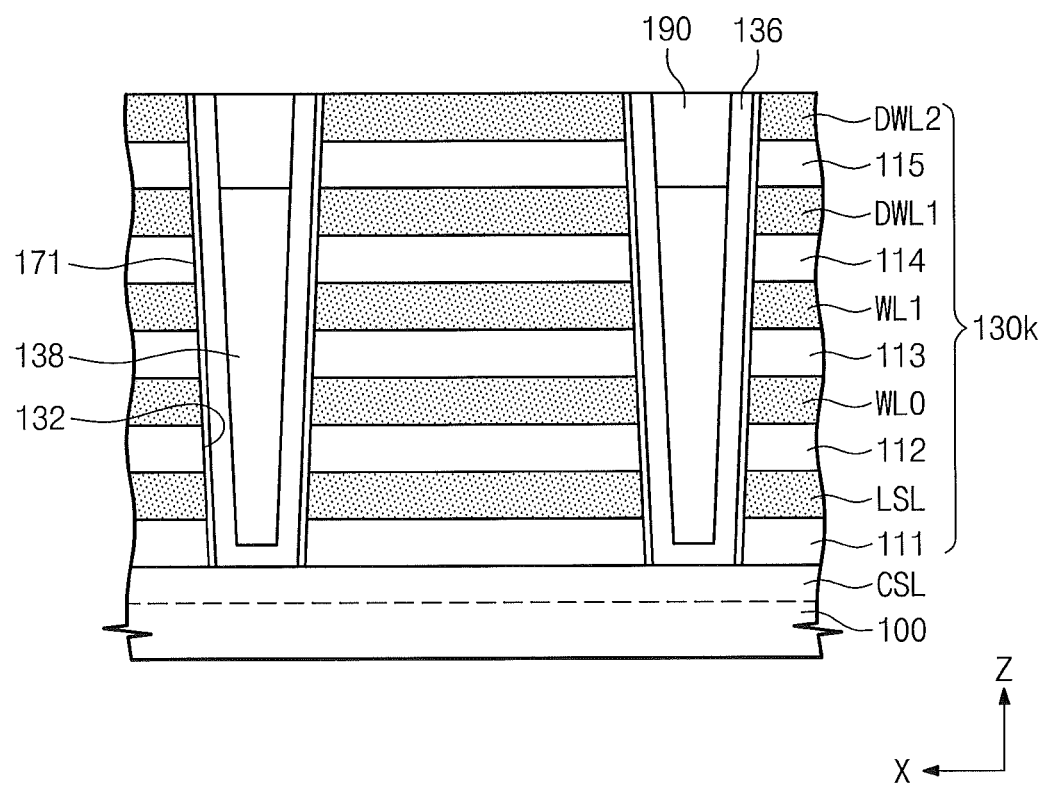
FIGS. 71 to 73 are cross-sectional views corresponding to the line I-I' of FIG. 69 for explaining a method for forming the three-dimensional nonvolatile memory device according to the seventeenth embodiment of the inventive concept.
Figure 72:
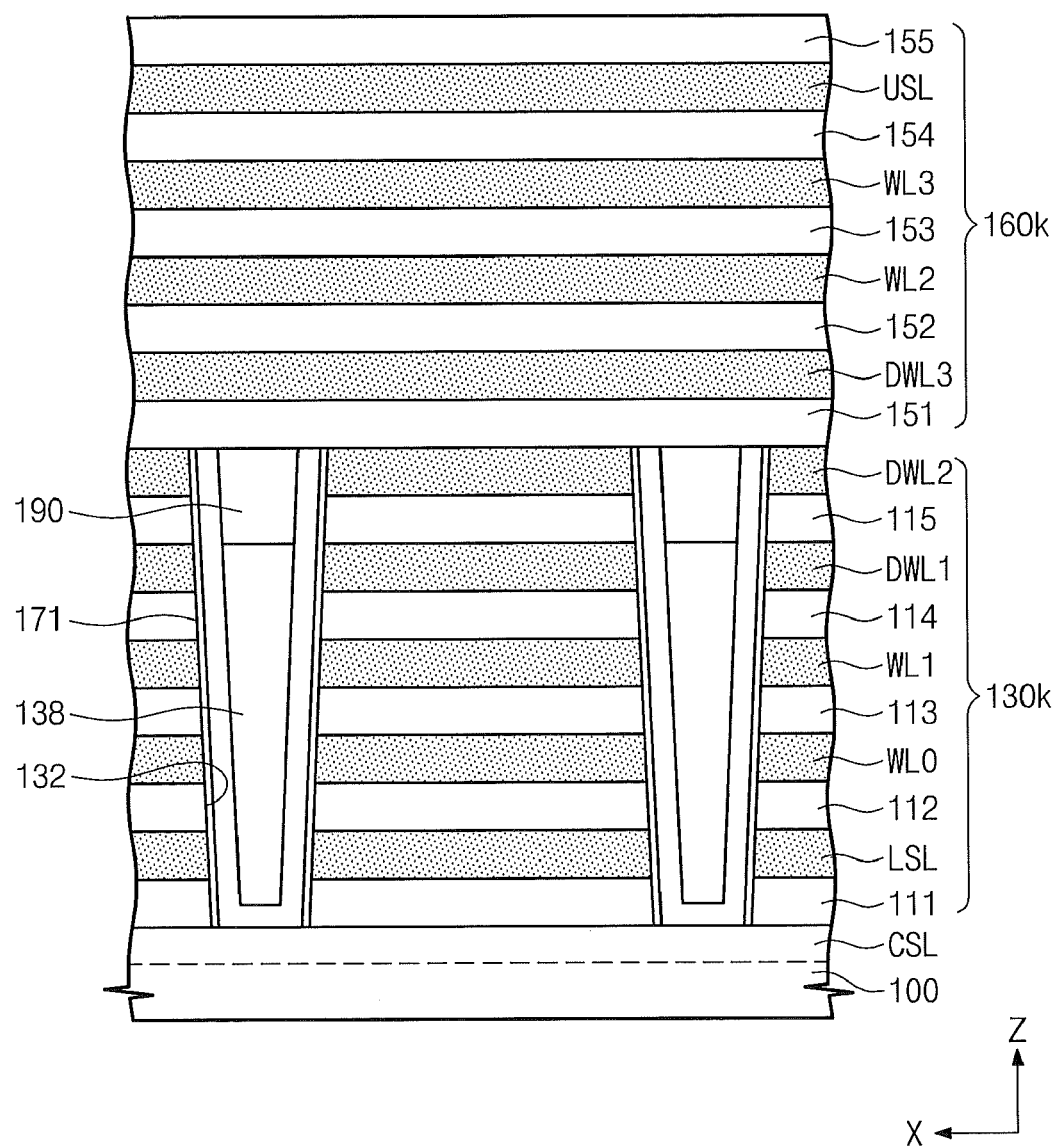
Figure 73:
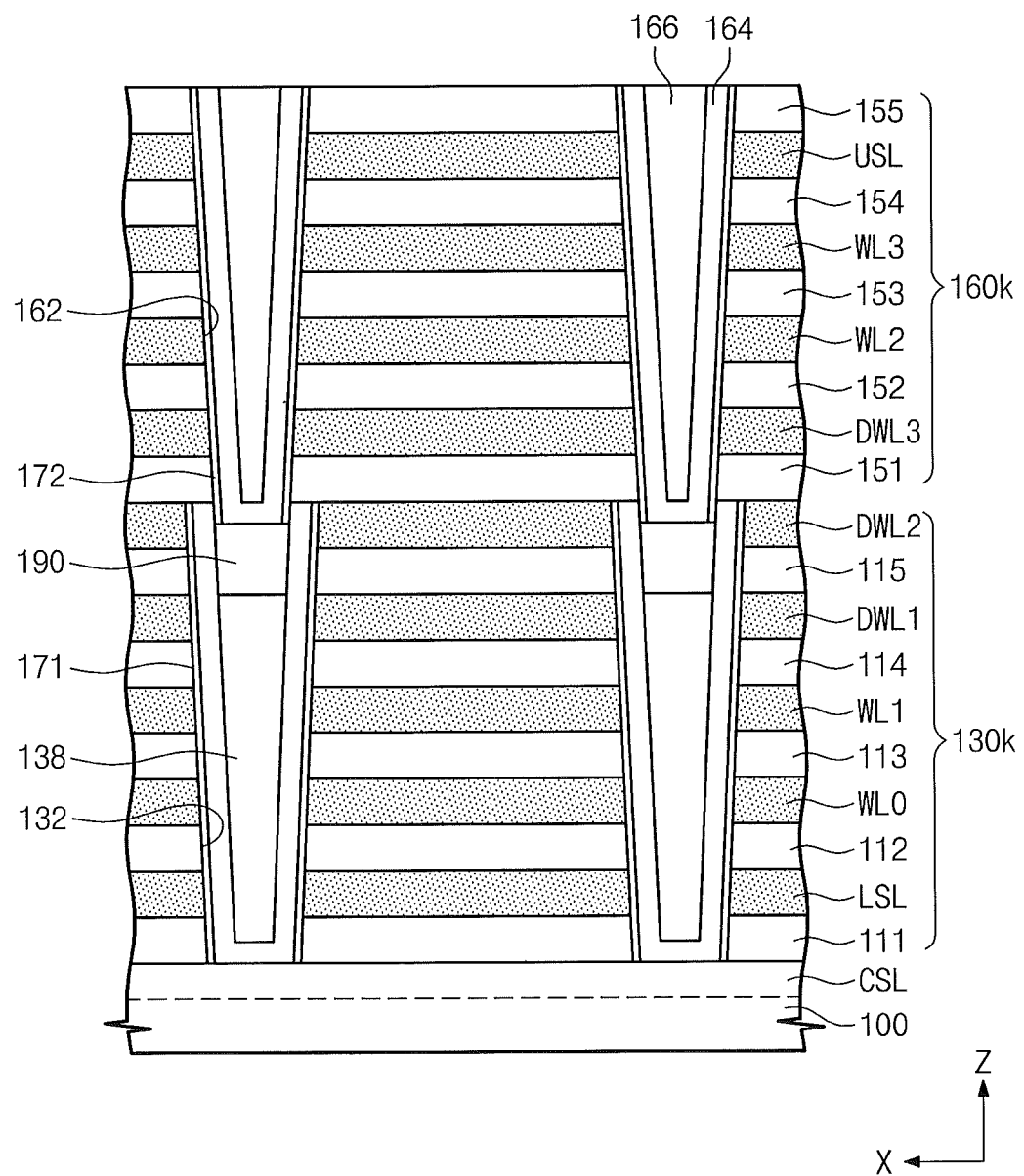

A method for forming the three-dimensional nonvolatile memory device according to the embodiment of the inventive concept will be described. FIGS. 71 to 73 are cross-sectional views along the line I-I' of FIG. 69. Explanations overlapped by the description above-mentioned referring to FIGS. 56 to 58 are omitted; instead, differences will be explained in detail.

Referring to FIG. 71, a lower layer 130k is formed on the common source line CSL of the substrate 100. The lower layer 130k is formed by alternately stacking the lower interlayer dielectrics 111 to 115, the lower conduction patterns LSL, WL0 and WL1 and the first and second dummy conduction patterns DWL1 and DWL2. The lower interlayer dielectrics may include first to fifth interlayer dielectrics 111 to 115 from the bottom. The first lower interlayer dielectric 111 may be formed undermost. The second dummy conduction pattern DWL2 may be formed uppermost.

By etching the lower interlayer dielectrics 111 to 115, the lower conduction patterns LSL, WL0 and WL1 and the dummy conduction patterns DWL1 and DWL2, the lower active hole 132 which exposes the common source line CSL is formed. The side of the lower active hole 132 may have a slope.

The first information storage layer 171, the lower active pillars 136, the lower filling insulating layer 138 and the lower active pattern 190 are formed at the lower active hole 132. The upper surface of the lower active pillars 136 and the upper surface of the second dummy conduction pattern DWL2 may be coplanar. The lower surface of the lower active pattern 190 has the same height as or is higher than that of the first dummy conduction pattern DWL1.

Referring to FIG. 72, an upper layer 160k is formed on the lower layer 130k. The upper layer 160k is formed by alternately stacking the upper interlayer dielectrics 151 to 155, the third dummy conduction pattern DWL3 and the upper conduction patterns WL2, WL3 and USL. The upper interlayer dielectrics may include first to fifth upper interlayer dielectrics 151 to 155 from the bottom.

The first upper interlayer dielectric 151 may be formed undermost and thinner than the second to fourth upper interlayer dielectrics 152 to 154. For instance, the sum of thicknesses of the fifth lower interlayer dielectric 115 and the first upper interlayer dielectric 151 may be equal to the thicknesses of the second to fourth lower interlayer dielectrics 112 to 114 and the second to fifth upper interlayer dielectrics 152 to 155.

Referring to FIG. 73, by etching the upper conduction patterns WL2, WL3 and USL, the third dummy conduction pattern DWL3 and the upper interlayer dielectrics 151 to 155, the upper active hole 162 which exposes the lower active pattern 190 is exposed. Since the lower active pattern 190 is recessed, the inner side of the upper part of the lower active pillars 136 is exposed. The side of the upper active hole 162 may have a slope.

The second information storage layer 172, the upper active pillars 164 and the upper filling insulating layer 166 are formed at the upper active hole 162. The bottom surface of the upper active pillars 164 has the same height as or is lower than the upper surface of the first upper interlayer dielectric 151. The lower active pillars 136, the lower active pattern 190 and the upper active pillars 164 have the same conductive type.

Thereafter, referring to FIG. 70 again, the uppermost conduction pattern USL is patterned so that upper selection lines USL are formed. The drain region 179 which contacts the upper active pillars 164 is formed. The drain region 179 may be formed with N-type impurities. The insulating layer 156 is formed to cover the upper selection lines USL. The bit lines BL0 to BL3 are formed and connected to the drain region 179.

In the embodiment, the thickness of the lower active pattern 190 is adjusted for the lower active pattern 190 not to be removed when the upper active hole 162 is formed. For instance, for the lower active pattern 190 not to be recessed and removed, the thickness of the lower active pattern 190 is adjusted. In the embodiment, the plurality of dummy conduction patterns DWL1 to DWL2 is provided.

Although it has been described that the number of word lines is 4, the number of lower selection lines is 1, and the number of upper selection lines is 3 in the above-described embodiments, they are not limited to this. Also, the lower selection line may be formed as two or more layers. The upper selection line may be formed as two or more layers. Meanwhile, the above-described structures of the three-dimensional memory device are just examples of the inventive concept and may be variously changed.

Also, the above-described inventive concepts may be embodied combining them within the scope of rational point of view.

[Operating Method 1]

Figure 74:
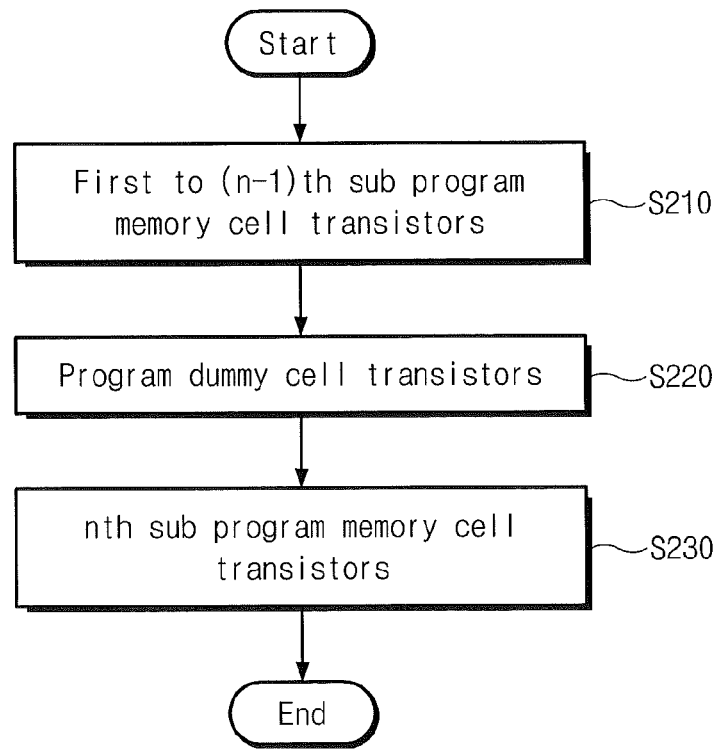
FIG. 74 is a flow chart illustrating a first exemplary method for operating the three-dimensional nonvolatile memory device according to the above-described embodiments of the inventive concept.

FIG. 74 is a flow chart illustrating a first exemplary method for operating the three-dimensional nonvolatile memory device according to the above-described embodiments of the inventive concept. Referring to FIG. 74, in operation S110, dummy cell transistors are programmed. For instance, the dummy cell transistors are programmed to have a threshold voltage higher than about 0 V.

In operation S120, memory cell transistors are programmed. The memory cell transistors are programmed after all the dummy cell transistors are programmed. For instance, after the dummy cell transistors are programmed, a lower memory cell transistor or an upper memory cell transistor which is the most adjacent to the dummy cell transistors may be programmed. When the upper or lower memory cell transistor is programmed, the dummy cell transistors may be turned-off.

[Operating Method 2]

Figure 75:
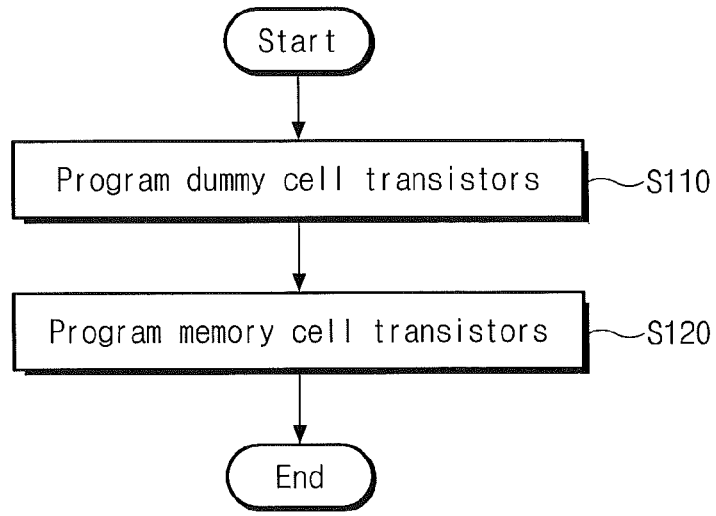
FIG. 75 is a flow chart illustrating a second exemplary method for operating the three-dimensional nonvolatile memory device according to the above-described embodiments of the inventive concept.

FIG. 75 is a flow chart illustrating a second exemplary method for operating the three-dimensional nonvolatile memory device according to the above-described embodiments of the inventive concept. For instance, it is assumed that memory cell transistors are programmed through a plurality of sub program processes.

Referring to FIG. 75, in operation S210, the memory cell transistors are first to (n−1)th sub programmed. In operation S220, dummy cell transistors are programmed. Thereafter, in operation S230, the memory cell transistors are nth sub programmed.

That is, when the memory cell transistors are programmed through the plurality of sub program processes, the dummy cell transistors may be programmed before the final sub program is performed to the memory cell transistors. For instance, the dummy cell transistors may be programmed to have a threshold voltage higher than about 0 V.

[Application]

Figure 76:
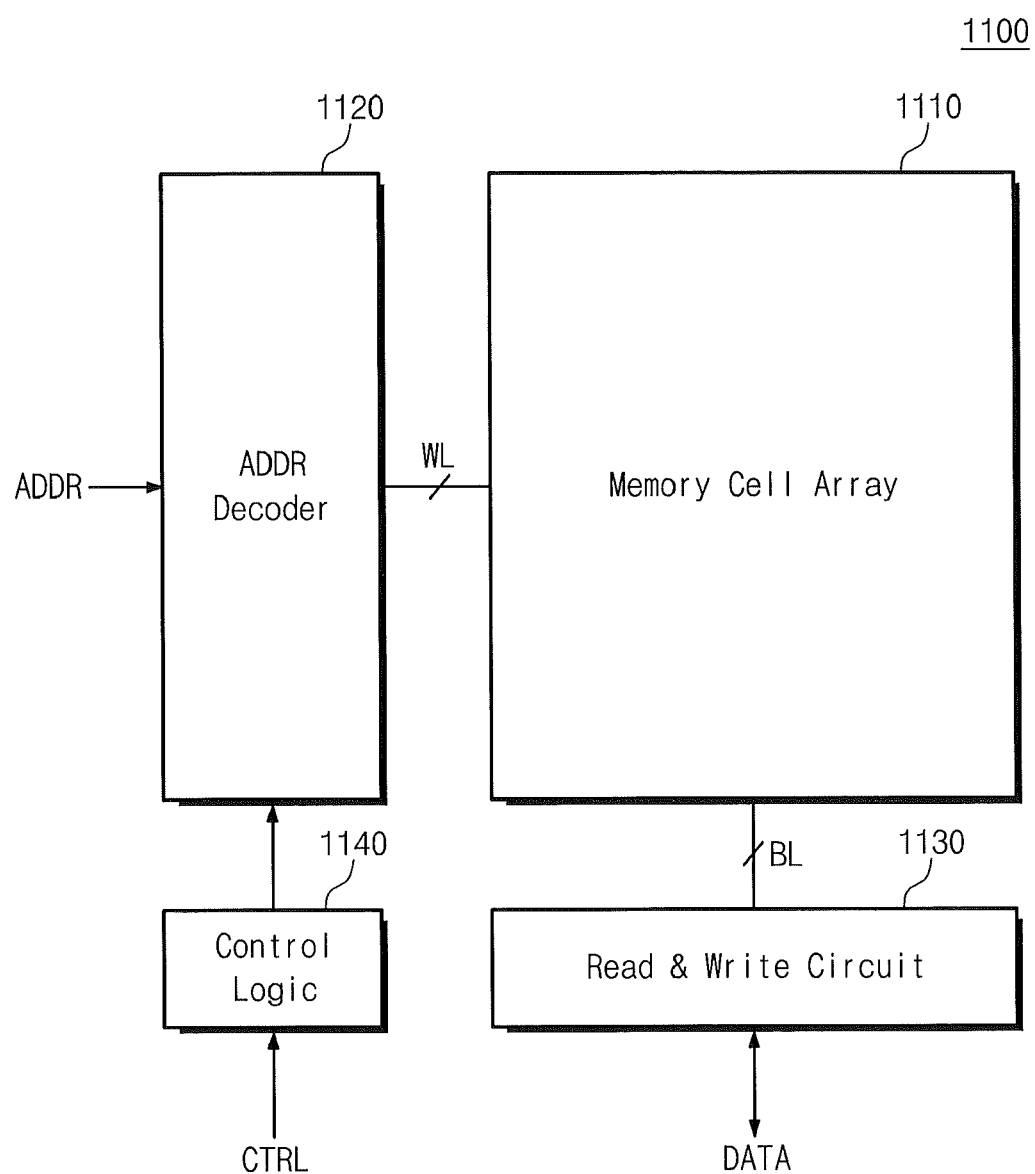
FIG. 76 is a block diagram illustrating a flash memory device according to the inventive concept.

FIG. 76 is a block diagram illustrating a flash memory device 1100 according to the inventive concept. Referring to FIG. 76, the nonvolatile memory device 1100 according to the embodiments of the inventive concept includes a memory cell array 1110, an address decoder 1120, a read and write circuit 1130 and a control logic 1140.

The memory cell array 1110 is connected to the address decoder 1120 through word lines WL and to the read and write circuit 1130 through bit lines BL. The memory cell array 1110 includes a plurality of memory cells. For instance, the memory cell array 1110 corresponds to one of the embodiments of the inventive concept. The word lines WL correspond to the upper and lower conduction patterns and at least one dummy conduction pattern.

The address decoder 1120 is connected to the memory cell array 1110 through the word lines WL. The address decoder 1120 is configured to operate in response to control of the control logic 1140. The address decoder 1120 receives an address ADDR from the outside.

The address decoder 1120 is configured to decode a row address included in the received address ADDR. By using the decoded row address, the address decoder 1120 selects the word lines. The address decoder 1120 is configured to decode a column address included in the received address ADDR. The decoded column address is transferred to the read and write circuit 1130. For instance, the address decoder 1120 includes a row decoder, a column decoder and an address buffer.

The read and write circuit 1130 is connected to the cell array 1110 through the bit lines BL. The read and write circuit 1130 is configured to exchange data DATA with the outside. The read and write circuit 1130 is operated in response to the control of the control logic 1140. The read and write circuit 1130 is configured to receive the decoded column address from the address decoder 1120. By using the decoded column address, the read and write circuit 1130 selects the bit lines BL.

For instance, the read and write circuit 1130 receives the data DATA from the outside and writes the received data to the memory cell array 1110. The read and write circuit 1130 reads data from the memory cell array 1110 and outputs the read data to the outside. The read and write circuit 1130 reads the data from a first storing region of the memory cell array 1110 and writes the read data to a second storing region of the memory cell array 1110. For instance, the read and write circuit 1130 is configured to perform a copy-back operation.

For instance, the read and write circuit 1130 includes a page buffer (or page register), a column selection circuit and a data buffer. For another instance, the read and write circuit 1130 includes a sense amplifier, a write driver, the column selection circuit and the data buffer.

The control logic 1140 is connected to the address decoder 1120 and the read and write circuit 1130. The control logic 1140 is configured to control various operations of the flash memory device 1100. The control logic 1140 is operated in response to a control signal CTRL transferred from the outside.

Figure 77:
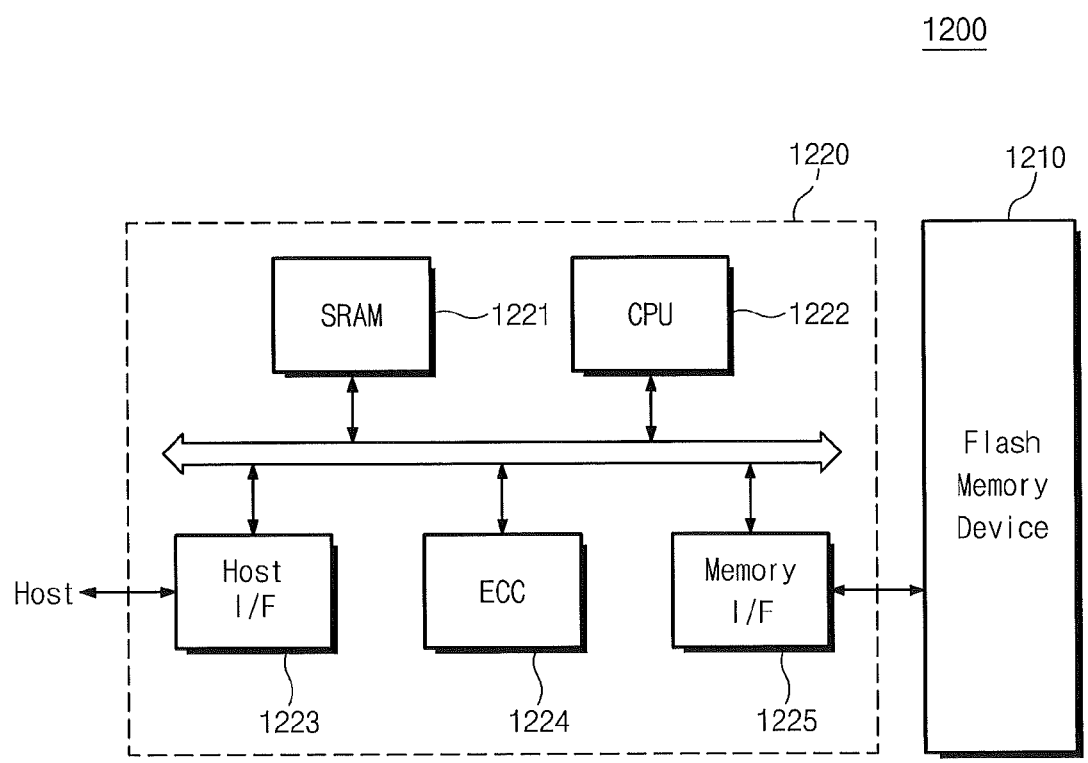
FIG. 77 is a block diagram illustrating a memory system provided with the flash memory device according to the inventive concept.

FIG. 77 is a block diagram illustrating a memory system 1200 provided with the flash memory device according to the inventive concept. Referring to figure 1200, the memory system 1200 for supporting mass storage of data is provided with the flash memory device 1210 according to the inventive concept. The flash memory device 1210 according to the inventive concept is, e.g., the flash memory device 1100 described referring to FIG. 76. The memory system 1200 according to the inventive concept includes a memory controller 1220 which controls various data exchanges between a host and the flash memory device 1210. The memory controller is configured to transfer the control signal CTRL and the address ADDR to the flash memory device 1210. The memory controller 1220 is configured to exchange data DATA with the flash memory device 1210.

An SRAM 1221 is used as at least one of an operating memory of a processing unit 1222, a cache memory between the nonvolatile memory device 1210 and the host and a buffer memory between the nonvolatile memory device 1210 and the host. The processing unit 1222 controls various operations of the controller 1220.

An error correction block 1224 is configured to detect an error of the data read from the nonvolatile memory device 1100 and correct it by using an error correction code ECC.

A memory interface 1225 interfaces with the flash memory device 1210 according to the inventive concept. The processing unit 1222 performs various control operations for data exchange of the memory controller 1220.

The host interface 1223 includes a protocol for data exchange between the host and the controller 1220. For example, the controller 1220 is configured to communicate with an external device (host) through one of various interface protocols such as Universal Serial Bus (USB) protocol, Multimedia Card (MMC) protocol, Peripheral Component Interconnection (PCI) protocol, PCI-Express (PCI-E) protocol, Advanced Technology Attachment (ATA) protocol, Serial-ATA protocol, Parallel-ATA protocol, Small Computer Small Interface (SCSI) protocol, Enhanced Small Disk Interface (ESDI) protocol, Integrated Drive Electronics (IDE) protocol, and Firewire protocol.

Although not illustrated in the drawing, the memory system 1200 according to the inventive concept may be further provided with a ROM (not shown) which stores code data for interfacing with the host.

The controller 1220 and the flash memory device 1210 may be integrated into one semiconductor device. For example, the controller 1220 and the flash memory device 1210 may be integrated into one semiconductor device to constitute a memory card. For example, the controller 1220 and the flash memory device 1210 may be integrated into one semiconductor device to constitute a PC card (e.g., PCMCIA), a compact flash card (CF), a smart media card (e.g., SM and SMC), a memory stick, a multimedia card (e.g., MMC, RS-MMC and MMCmicro), an SD card (e.g., SD, miniSD, microSD, and SDHC), or a universal flash storage (UFS).

The controller 1220 and the flash memory device 1210 may be integrated into one semiconductor device to constitute a Solid State Drive (SSD). The SSD includes a storage device that is configured to store data in a semiconductor memory. When the memory system 1200 is used as the SSD, the operation speed of the host connected to the memory system 1200 may increase remarkably.

As another example, the memory system 1200 may be applicable to computers, mobile computers, Ultra Mobile PCs (UMPCs), work stations, net-books, PDAs, portable computers, web tablets, tablet computers, wireless phones, mobile phones, smart phones, e-books, portable multimedia players (PMPs), portable game players, navigation devices, black boxes, digital cameras, digital multimedia broadcasting (DMB) players, 3-dimensional televisions, digital audio recorders, digital audio players, digital picture recorders, digital picture players, digital video recorders, digital video players, storages constituting a data center, devices capable of transmitting/receiving information in wireless environments, one of various electronic devices constituting a home network, one of various electronic devices constituting a computer network, one of various electronic devices constituting a telematics network, an RFID device, or one of various components constituting a computing system.

For example, the flash memory device 1210 or the memory system 1200 may be mounted in various types of packages. Examples of the packages of the flash memory device 1210 or the memory system 1200 include Package on Package (PoP), Ball Grid Arrays (BGA), Chip Scale Packages (CSP), Plastic Leaded Chip Carrier (PLCC), Plastic Dual In-line Package (PDIP), Die in Waffle Pack, Die in Wafer Form, Chip On Board (COB), Ceramic Dual In-line Package (CERDIP), Plastic Metric Quad Flat Pack (MQFP), Thin Quad Flat Pack (TQFP), Small Outline Integrated Circuit (SOIC), Shrink Small Outline Package (SSOP), Thin Small Outline Package (TSOP), System In Package (SIP), Multi Chip Package (MCP), Wafer-level Fabricated Package (WFP), and Wafer-level Processed Stack Package (WSP).

Figure 78:
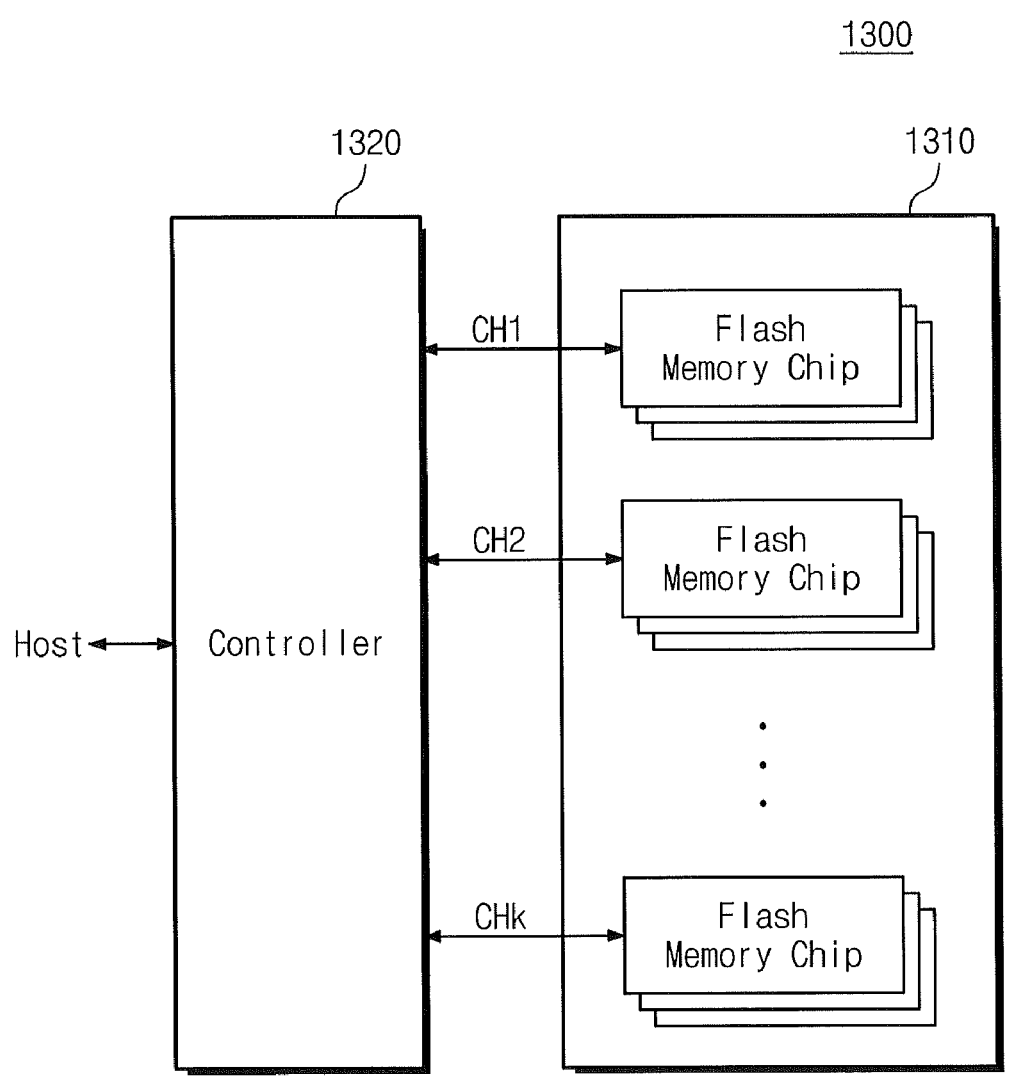
FIG. 78 is a block diagram illustrating an exemplary application of the memory system of FIG. 77.

FIG. 78 is a block diagram illustrating an exemplary application of the memory system 1200 of FIG. 77. Referring to FIG. 78, a memory system 1300 includes a flash memory device 1310 and a controller 1320. The flash memory device 1310 includes a plurality of flash memory chips. The flash memory chips are divided into a plurality of groups. Each group of the flash memory chips is configured to communicate with the controller 1320 through one common channel For instance, it is illustrated that the flash memory chips communicate with the controller 1320 through first to kth channels CH1 to CHk. Each memory chip may have the same structure as the flash memory device 1100 described referring to FIG. 76.

Figure 79:
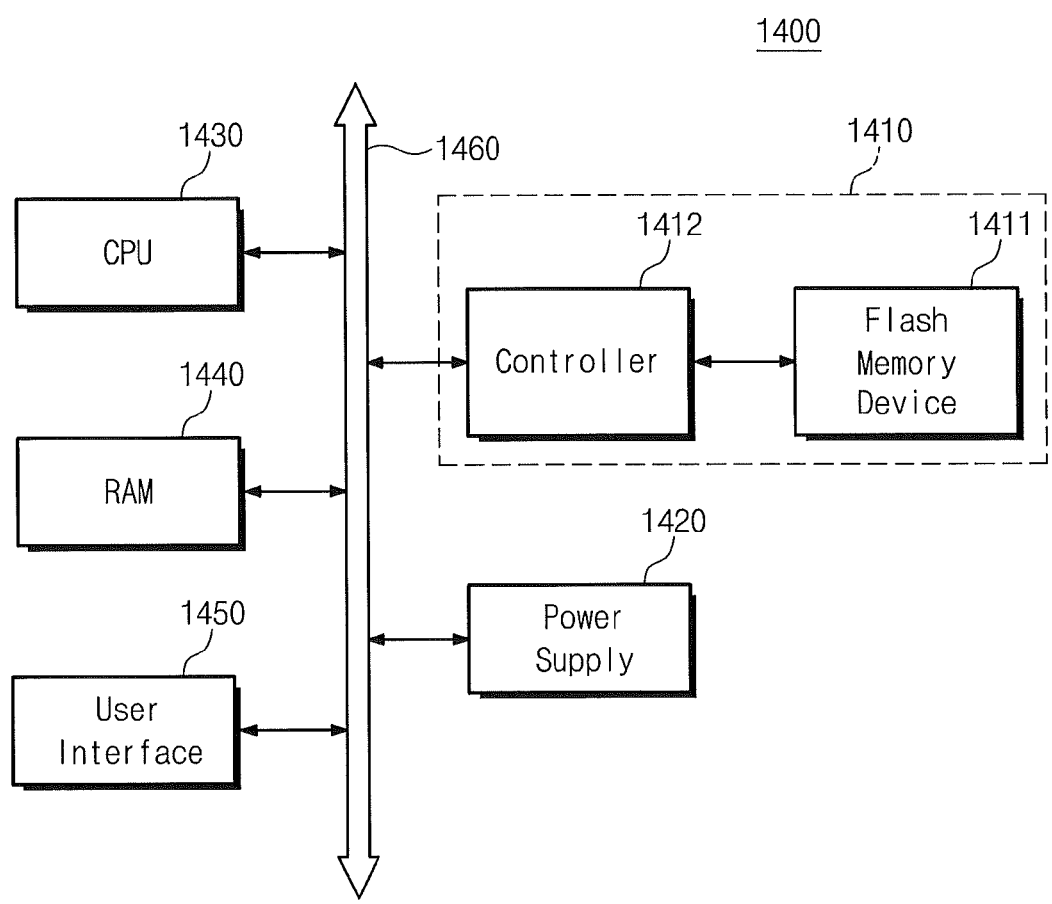
FIG. 79 is a block diagram illustrating an information processing system installed with a flash memory system according to the inventive concept.

FIG. 79 is a block diagram illustrating an information processing system 1400 installed with a flash memory system 1410 according to the inventive concept. Referring to FIG. 79, the flash memory system 1410 according to the inventive concept is installed in the information processing system such as a mobile device or a desktop computer. The information processing system 1400 according to the inventive concept includes a power supply 1420 electrically connected to the flash memory system 1410 and each system bus 1460, a Central Processing Unit (CPU) 1430, a RAM 1440 and a user interface 1450. The flash memory system 1410 may have the substantially same configuration as the above-mentioned memory system or flash memory system. Data processed by the CPU 1430 or inputted from the outside are stored into the flash memory system 1410. Herein, the above-described flash memory system 1410 may be structured with a semiconductor disk device (SSD). In this case, the information processing system 1400 may stably store mass data in the flash memory system 1410. And, as reliability is increased, the flash memory system 1410 may save resources consumed for correcting errors so that it provides a high speed of data exchange function to the information processing system 1400. Although not illustrated, it is clear that the information processing system 1400 according to the inventive concept may be further provided with an application chipset, a Camera Image Processor (CIS) and an input/output device.

Since the upper inner side of the lower active pillars and the lower outer side of the upper active pillars of the three-dimensional nonvolatile memory device according to the embodiments of the inventive concept contact to each other, the electric current flow between the lower active pillars and the upper active pillars can be smooth.

The dummy word line is provided adjacently to the contact region of the upper active pillars and the lower active pillars of the three-dimensional nonvolatile memory device according to the embodiments of the inventive concept. Since there is no memory cell at the part where the stepped profile provided to the outer sides of the upper active pillars and the lower active pillars is formed, all the memory cells can have uniform electric characteristics.

The above-disclosed subject matter is to be considered illustrative and not restrictive, and the appended claims are intended to cover all such modifications, enhancements, and other embodiments, which fall within the true spirit and scope of the inventive concept. Thus, to the maximum extent allowed by law, the scope of the inventive concept is to be determined by the broadest permissible interpretation of the following claims and their equivalents, and shall not be restricted or limited by the foregoing detailed description.

That which is claimed is:

1. A method of forming a nonvolatile memory device, comprising:
    forming a first stack of layers on a substrate, said first stack of layers comprising a first plurality of interlayer dielectric layers and a first plurality of sacrificial or word line layers arranged vertically in an alternating sequence;
    selectively etching through the first stack of layers to define a first opening therein;
    forming a first active region of a first plurality of nonvolatile memory cells and at least one dummy memory cell in the first opening;
    forming a second stack of layers on the first stack of layers, said second stack of layers comprising a second plurality of interlayer dielectric layers and a second plurality of sacrificial or word line layers arranged vertically in an alternating sequence;
    selectively etching through the second stack of layers to define a second opening therein that is aligned with the first opening; and
    forming a second active region of a second plurality of nonvolatile memory cells in the second opening.

2. The method of claim 1, wherein said forming a second active region comprises forming a second active region that is electrically coupled to the first active region.

3. The method of claim 1, wherein said forming a first active region comprises lining a sidewall of the first opening with a first electrically conductive layer having a U-shaped cross-section.

4. The method of claim 1, wherein said forming a second active region is followed by the steps of selectively etching through the second and first stack of layers to define a third opening therein and then removing the first and second pluralities of sacrificial layers through the third opening.

5. The method of claim 3, wherein said forming a second stack of layers is preceded by filling the first opening with a first filling insulating layer that contacts the first electrically conductive layer.

6. The method of claim 5, wherein said forming a second active region is preceded by recessing an upper surface of the first filling insulating layer to expose a portion of the first electrically conductive layer.

7. The method of claim 6, wherein said forming a second active region comprises lining a sidewall of the second opening with a second electrically conductive layer that contacts the exposed portion of the first electrically conductive layer.

8. The method of claim 4, wherein said removing the first and second pluralities of sacrificial layers is followed by filling the third opening with a dummy word line that is separated from the first active region by an information storage layer.

9. The method of claim 4, wherein said removing the first and second pluralities of sacrificial layers is followed by filling the third opening with a first dummy word line extending opposite a portion of the first active region and a second dummy word line extending opposite a portion of the second active region.

10. The method of claim 9, wherein the first and second dummy word lines are contiguous.

11. A method of forming a nonvolatile memory device, comprising:
   forming a first stack of layers on a substrate, said first stack of layers comprising a first plurality of interlayer dielectric layers and a first plurality of sacrificial layers arranged vertically in an alternating sequence;
   selectively etching through the first stack of layers to define a first opening therein;
   forming a first active region of a first plurality of nonvolatile memory cells and at least one dummy memory cell in the first opening;
   forming a second stack of layers on the first stack of layers, said second stack of layers comprising a second plurality of interlayer dielectric layers and a second plurality of sacrificial layers arranged vertically in an alternating sequence;
   selectively etching through the second stack of layers to define a second opening therein that is aligned with the first opening;
   forming a second active region of a second plurality of nonvolatile memory cells in the second opening;
   selectively etching through the second and first stack of layers to define a third opening therein; and
   replacing the first and second pluralities of sacrificial layers with memory cell word lines comprising a dummy word line of a dummy memory cell extending opposite adjacent portions of the first and second active regions.

12. The method of claim 11, wherein said forming a second stack of layers comprises forming a first one of the second plurality of sacrificial layers directly on an underlying a first one of the first plurality of sacrificial layers.

13. The method of claim 12, wherein said replacing comprises replacing the first one of the second plurality of sacrificial layers and the first one of the first plurality of sacrificial layers with the dummy word line of a dummy memory cell.

14. The method of 11, wherein said forming a first active region comprises lining a sidewall of the first opening with a first semiconductor layer having a U-shaped cross-section; and wherein said forming a second stack of layers is preceded by the steps of filling the first opening with a first filling insulating layer that contacts the first semiconductor layer, then recessing an upper surface of the first filling insulating layer to expose a sidewall of the first semiconductor layer and then filling a recess in the upper surface of the first filling insulating layer with a semiconductor active pattern.

15. The method of claim 14, wherein said forming a second active region comprises lining a sidewall of the second opening with a second semiconductor layer that contacts the semiconductor active pattern.

16. A method of forming a nonvolatile memory device, comprising:
   forming a first stack of layers on a substrate, said first stack of layers comprising a first plurality of interlayer dielectric layers and a first plurality of sacrificial or word line layers arranged vertically in an alternating sequence;
   selectively etching through the first stack of layers to define a first opening therein;
   forming a first active region of a first plurality of nonvolatile memory cells and at least one dummy memory cell in the first opening by lining a sidewall of the first opening with a first semiconductor layer having a U-shaped cross-section;
   filling the first opening with a first filling insulating layer that contacts the first semiconductor layer;
   recessing an upper surface of the first filling insulating layer to expose a sidewall of the first semiconductor layer;
   filling a recess in the upper surface of the first filling insulating layer with a semiconductor active pattern;
   forming a second stack of layers on the first stack of layers, said second stack of layers comprising a second plurality of interlayer dielectric layers and a second plurality of sacrificial or word line layers arranged vertically in an alternating sequence;
   selectively etching through the second stack of layers to define a second opening therein that is aligned with the first opening; and
   forming a second active region of a second plurality of nonvolatile memory cells in the second opening by lining a sidewall of the second opening with a second semiconductor layer that contacts the semiconductor active pattern.

17. The method of claim 16, further comprising:
   selectively etching through the second and first stack of layers to define a third opening therein; and
   replacing the first and second pluralities of sacrificial layers with memory cell word lines comprising a dummy word line of a dummy memory cell extending opposite a portion of the first semiconductor layer.

18. The method of claim 1, wherein the first and second active regions contact each other and the dummy memory cell is disposed adjacent a position of contact between the first and second active regions.

19. The method of claim 11, wherein the first and second active regions contact each other and the dummy memory cell is disposed adjacent a position of contact between the first and second active regions.

* * * * *